United States Patent
Tsang et al.

(10) Patent No.: US 6,288,655 B1
(45) Date of Patent: Sep. 11, 2001

(54) ENCODING AND DECODING TECHNIQUES FOR DATA IN 24 BIT SEQUENCE

(75) Inventors: Kinhing P. Tsang, Plymouth; Bernardo Rub, Edina, both of MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/394,789

(22) Filed: Sep. 13, 1999

Related U.S. Application Data

(60) Provisional application No. 60/100,264, filed on Sep. 14, 1998.

(51) Int. Cl.$^7$ .................................................... H03M 7/46
(52) U.S. Cl. ............................. 341/59; 341/59; 341/60; 341/61; 341/67; 341/63; 341/50; 341/58; 341/119; 341/133; 341/135; 340/347; 375/264; 375/340; 375/18; 371/95; 371/43; 371/44; 371/55
(58) Field of Search .................... 341/59, 50, 58, 341/119, 133, 61, 67, 102, 60, 63

(56) References Cited

U.S. PATENT DOCUMENTS

| | | | |
|---|---|---|---|
| 4,501,000 | 2/1985 | Immink et al. | 375/25 |
| 4,675,652 | 6/1987 | Machado | 340/347 |
| 5,196,849 | * 3/1993 | Galbraith | 341/59 |
| 5,537,112 | 7/1996 | Tsang | 341/59 |
| 5,731,768 | 3/1998 | Tsang | 341/59 |
| 5,757,293 | * 5/1998 | Mc Laughlin | 341/59 |
| 5,781,133 | 7/1998 | Tsang | 341/59 |
| 5,784,010 | * 7/1998 | Coker et al. | 341/59 |

FOREIGN PATENT DOCUMENTS

| | | |
|---|---|---|
| 0 557 130 A2 | 8/1993 | (EP) . |
| WO 98/06181 | 2/1998 | (WO) . |

* cited by examiner

*Primary Examiner*—Michael Tokar
*Assistant Examiner*—Lam T. Mai
(74) *Attorney, Agent, or Firm*—Westman, Champlin & Kelly, P.A.

(57) ABSTRACT

Encoding and decoding systems and methods for digital data in 24 bit sequences. An encoder generates state variables as a function of four or fewer bits of the 24 bit sequence, and encodes the sequence into 11 and 14 bit codewords. After transmission, the 11 bit and 14 bit codewords are decoded using recovered state variables. The encoding places a run length limit (RLL) of k=7 on a 25 bit codeword comprised of the 11 and 14 bit codewords to limit runs of zeros. Each of the 11 bit and 14 bit codewords are preferably also encoded with a run length limit of interleaved bits is i=7.

The encoding and decoding systems and methods can be applied to a magnetic disc drive.

15 Claims, 4 Drawing Sheets

ENCODING AND DECODING TECHNIQUES FOR DATA IN 24 BIT SEQUENCE

REFERENCE TO CO-PENDING APPLICATION

This application claims priority benefits from U.S. provisional patent application 60/100,264 entitled RATE 24/25 (0,7/7) RUN LENGTH LIMITED CODE WITH MINIMUM HAMMING WEIGHT CONSTRAINT filed on Sep. 14, 1998.

FIELD OF THE INVENTION

The present invention relates to communicating digital data through a communication channel. More particularly, the present invention relates to encoding and decoding techniques for data in 24 bit sequences.

BACKGROUND OF THE INVENTION

In the field of digital communications, digital information is typically prepared for transmission through a channel by encoding it. The encoded data is then used to modulate a transmission to the channel. A transmission received from the channel is then typically demodulated and decoded to recover the original information.

The encoding of the digital data serves to improve communication performance so that the transmitted signals are less corrupted by noise, fading, or other interference associated with the channel. The term "channel" can include media such as transmission lines, wireless communication and information storage devices such as magnetic disc drives. In the case of information storage devices, the signal is stored in the channel for a period of time before it is accessed or received. Encoding can reduce the probability of noise being introduced into a recovered digital signal when the encoding is adapted to the known characteristics of the data and its interaction with known noise characteristics of a communication channel.

In typical encoding arrangement, data words of m data bits are encoded into larger code words of n code bits, and the ratio m/n is known as the code rate of the encoding arrangement. Decreasing the code rate improves decoding and can also improve error correction, however, decreased code rate also increases energy consumption and slows communication.

Encoding for magnetic media also typically includes non-return-to-zero-invert-on-1s (NRZI) coding and resynchronization of the received signal using a phase locked loop (PLL). In order to ensure adequate synchronization of the PLL, a run length limit (RLL) of the number "k" of consecutive zeros is an integral part of the encoding. In systems where two interleaved subsequences are encoded to produce two smaller code words for detection by a Viterbi detector, the maximum run length or number "i" of zeros in each of the bitwise interleaved sub-sequence is also limited to reduce delay in the Viterbi detector. The number "w" of ones in a code word affects energy consumption and is known as a Hamming weight. These constraints improve performance, but also tend to eliminate a large number of available code words, which can tend to require a lower code rate. Finding an efficient set of constraints "k", "i", and "w" within a suitable code rate is complex for long digital words.

In particular, it is found that transmission of relatively long digital words representing 24 bits of information through a channel that introduces channel noise in the form of irregular timing of received bits and unpredictable short bursts of bit errors is a problem. This problem is present in magnetic disc drives and can be present in other types of channels as well.

SUMMARY OF THE INVENTION

The present invention relates to systems and methods for communicating digital data through a communication channel that improve transmission and solves the above mentioned synchronization and decoding problems.

An encoding system receives 24 bits of information as first and second 12 bit sequences of the data. The encoding system includes a first encoder that generates an 11 bit first codeword and state variables as a function of the first sequence. A second encoder generates a 14 bit second codeword as a function of the second sequence and the state variables. The state variables are represented by four or fewer bits in the second codeword. The first and second codeword together form a 25 bit codeword that coupled to the communication channel.

A decoder system then receives the 25 bit codeword from the communication channel and separates the 25 bit codeword into a 14 bit codeword and an 11 bit codeword. A first decoder receives the 14 bit codeword and generates a first decoded 12 bit sequence. The first decoder also generates decoded state variables as a function of four or fewer bits of the 14 bit codeword. A second decoder receives the 11 bit second portion and the state variables and generates a second 12 bit decoded sequence, the first and second decoded sequence together forming a decoded 24 bit sequence of data.

The first and second codewords together form a 25 bit codeword. The encoder limits runs of zeros by encoding the 25 bit codeword with a run length limit K=7.

In a preferred embodiment, the encoding and decoding systems and methods are used in a magnetic disc drive.

DETAILED DESCRIPTION OF THE PREFERRED EMBODIMENTS

Figure 1:
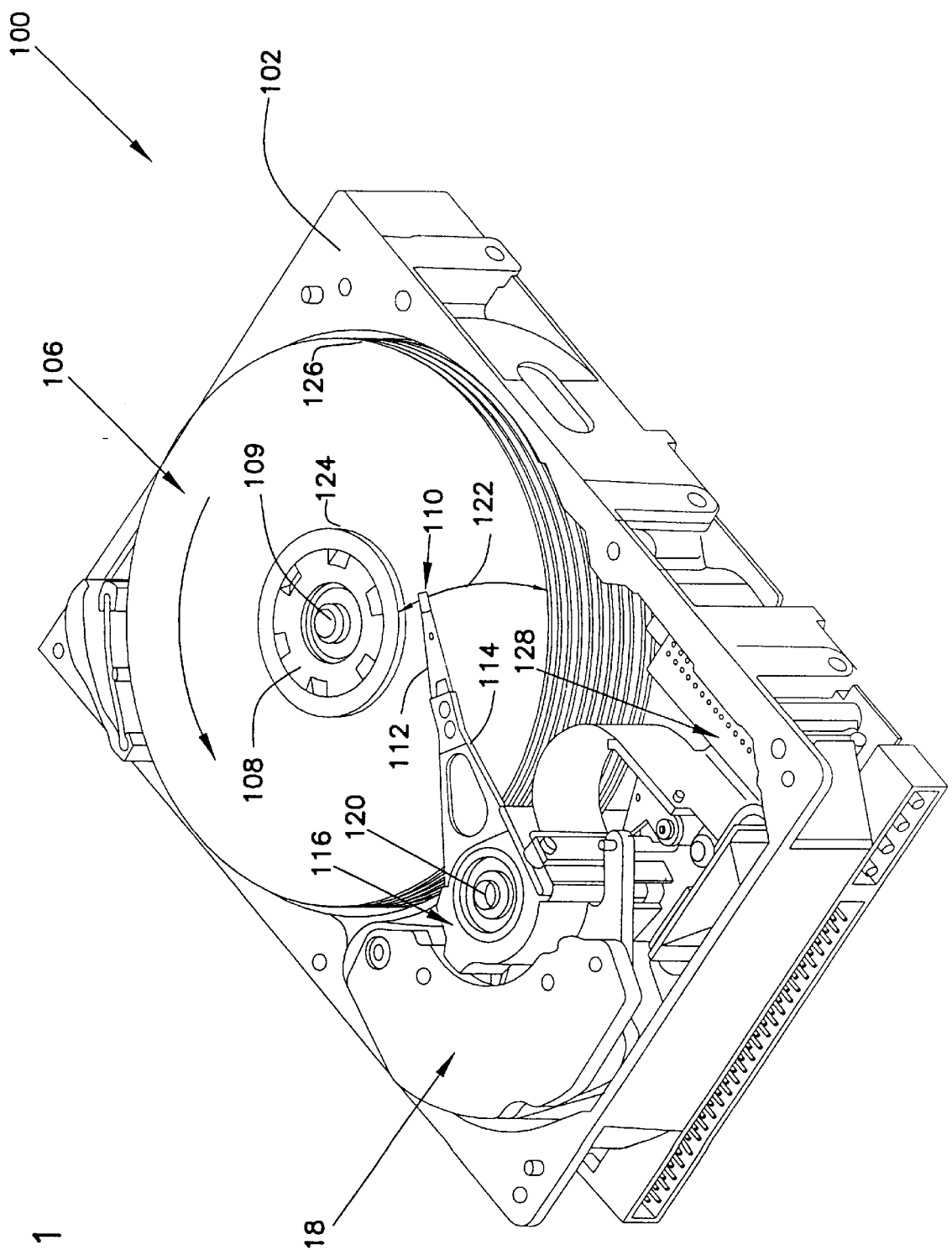
FIG. 1 is a perspective view of an embodiment of a magnetic disc drive in which the present invention can be used.

FIG. 1 is a perspective view of a magnetic disc drive 100 in which the present invention is useful. Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated head 110, which is mounted to disc drive 100 for communication with the disc surface. In the example shown in FIG. 1, heads 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 operates under control of internal circuitry 128.

The heads 110 and rotating disc pack 106 form a communication channel which can receive digital data and reproduce the digital data at a later time. Write circuitry within internal circuitry 128 receives data, typically from a digital computer, and then encodes data in codewords adapted to the communication channel. The encoded data is then used to modulate a write current provided to a write transducer in the head 110. The write transducer in the head 110 causes successive code words to be encoded on a magnetic layer on disc pack 106. At a later time, a read transducer in the head recovers the successive code words from the magnetic layer as a serial modulated read signal. Read circuitry within internal circuitry 128 demodulates the read signal into successive parallel codewords. The demodulated code words are then decoded by decoder circuitry within circuitry 128, which recovers the digital data for use, typically by a digital computer, at a later time.

Figure 2:
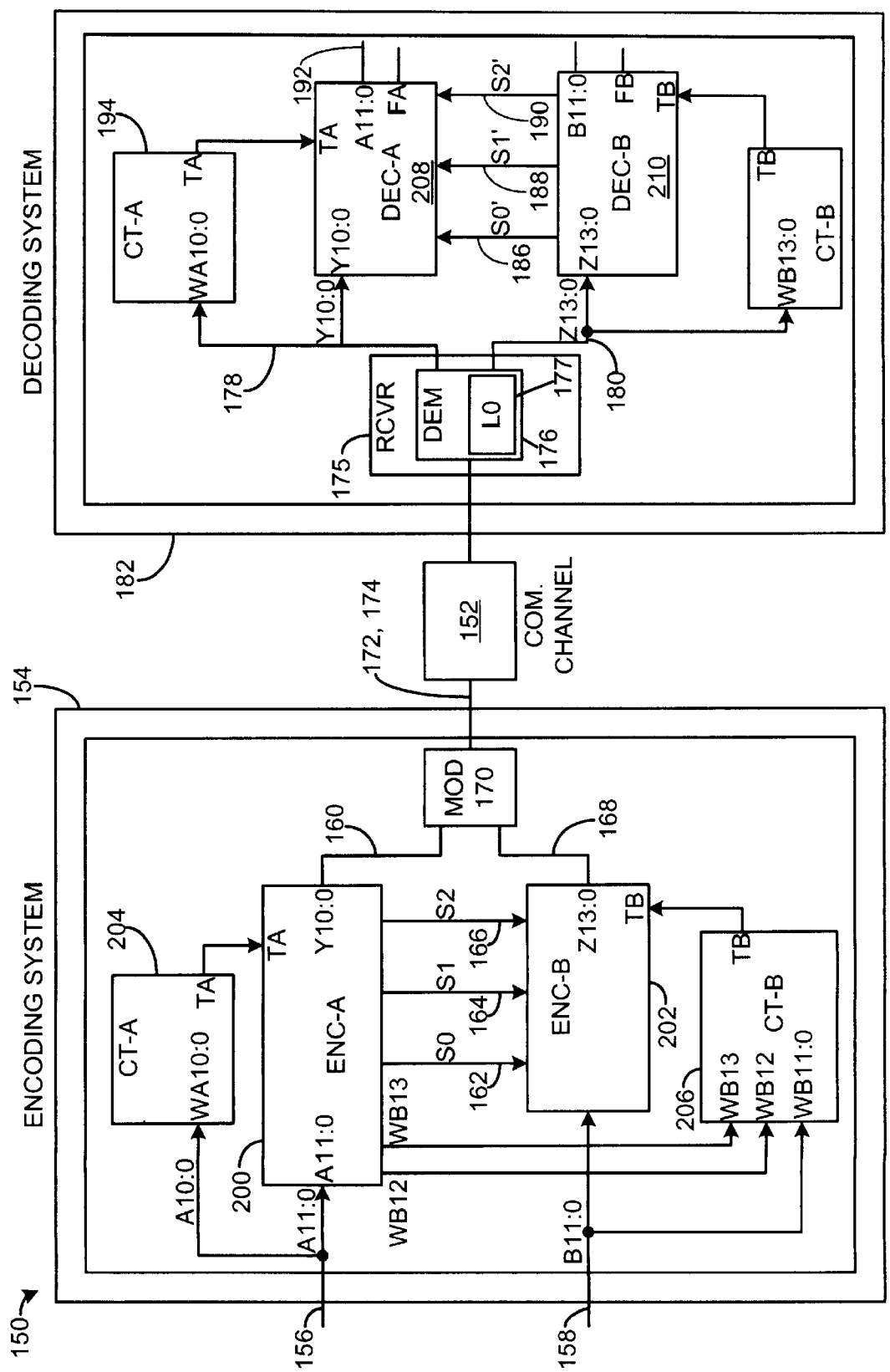
FIG. 2 is a block diagram of embodiments of encoding and decoding systems for communicating data according to the present invention.

FIG. 2 shows a block diagram of an embodiment of a system 150 for communicating digital data. System 150 communicates through a communication channel 152, that can comprise an arrangement of magnetic storage discs and heads as shown in FIG. 1. Channel 152 can also be other types of communication channels such as an optical, wireless or transmission line channel.

An encoding system 154 is adapted to receive first and second 12 bit sequences 156, 158 of the data. The encoding system 154 includes encoder 200 that generates an 11 bit first codeword 160, identified as Y10:0 as a function of the first sequence 156. The encoder 200 also generates state variables 162, 164, 166, identified as S0, S1, S2, as functions of the first sequence 156.

The encoding system 154 includes encoder 202 that generates a 14 bit second codeword 168, identified as Z13:0, as a function of the second sequence 158 and the state variables 162, 164, 166. The state variables are represented in the second codeword 168 by four or fewer bits, preferably the in four initial bits of the second codeword 168.

In FIG. 2, the encoding system 154 comprises encoder circuits 200, 202, identified as ENC-A and ENC-B. The encoding system 154 also comprises code testers 204, 206, identified as CT-A and CT-B. Detailed examples of operations of the code testers, encoder circuits and decoder circuits is shown in Tables 1–12 below.

A modulator 170 receives the first and second codewords 160, 168 and is adapted to couple first and second modulated codewords 172, 174 to the communication channel 152. Codewords 160, 168 together comprise a 25 bit codeword. Modulator 170 can be arranged in a conventional manner to receive codewords 160, 168 in a parallel format and provide modulated codewords 172, 174 with analog or physical properties that are compatible with the communication channel 152. In a case where communication channel 152 comprises a magnetic disc and head, codewords 172, 174 will be in the form of serial write currents delivered to a write transducer in the head. With other types of communication channels, modulation can include other known forms of modulation such as AM, FM, PM, FSK, spread spectrum and the like. The system described here can be used over the internet or an intranet, for example.

A receiver 175 in a decoding system 182 receives the first and second modulated codewords 172, 174 from the communication channel 152. Receiver 175 includes a demodulator 176. Receiver 175 can include a Viterbi detector. The demodulator 176 generates first and second demodulated codewords 178, 180. Demodulated codewords 178, 180 can include errors as a result of passing through the communication channel 152. Decoder system 182 receives the first and second demodulated codewords 178, 180. A decoder 210 receives the codeword 180 and generates a decoded sequence 184 and state variables 186, 188, 190, identified as S0', S1', S2', as functions of the second demodulated code word 180. A decoder 208 receives codeword 178 and generates a first decoded sequence 192 as a function of the first demodulated codeword 178 and the decoded state variables 186, 188 and 190. Outputs FA and FB of decoders 208, 210 indicate when invalid codewords are decoded.

The first and second demodulated codewords 178, 180 together form a 25 bit codeword. The encoding system 154 limits runs of zeros by encoding the 25 bit codeword with a run length limit (RLL) k=7. The encoding system 154 also limits runs of zeros by encoding the first and second codewords 160, 168 each with a run length limit (RLL) i=7. The encoding system 154 guarantees minimum code energy by encoding the 25 bit word with a minimum Hamming weight w=9.

The decoding system 182 comprises code pattern tester CT-A and CT-B shown at 194, 196 that decode most sequences by recognizing patterns that meet with "k", "i" and "w" constraints. The decoding system 182 also comprises decoder circuits 208, 210, identified as DEC-A, DEC-B. The demodulator 176 preferably includes a local oscillator 177 in a phase locked loop (PLL) that generates a local oscillator output synchronized with the modulated first and second codewords 172, 174. the demodulator 176 generates, or demodulates, the first and second demodulated codewords as a function of the local oscillator output. The communication channel 152 can be in a disc drive, and the modulator is adapted to modulate the disc drive write output, while the demodulator is adapted to demodulate the disc drive read signal. The synchronization of the local oscillator compensates for speed variations in the disc drive.

Figure 3:
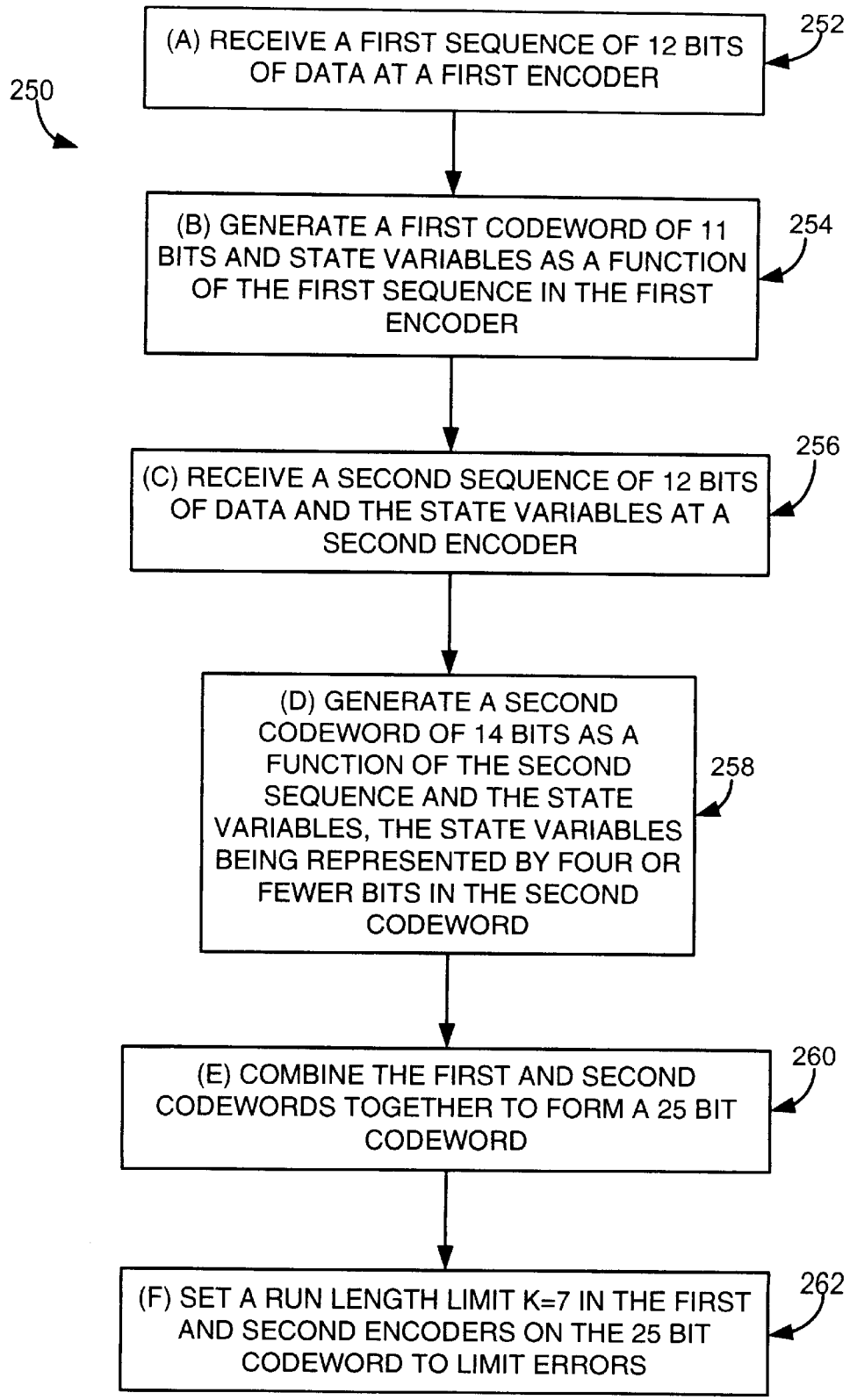
FIG. 3 is a flow chart of a method of encoding data.

In FIG. 3, a method of encoding digital data for transmission through a communication channel is shown at 250. At 252, a first sequence of 12 bits of data is received at a first encoder. At 254, the first encoder generates a first codeword of 11 bits and generates state variables as a function of the first sequence. At 256, a second encoder receives a second sequence of 12 bits of data and the state variables. At 258, the second decoder generates a second codeword of 14 bits as a function of the second sequence and the state variables, the state variables being represented by four or fewer bits in the second codeword. At 260, the first and second codewords are combined together to form a 25 bit codeword. At 262, a run length limit K=7 is set on the 25 bit codeword to limit errors.

Figure 4:
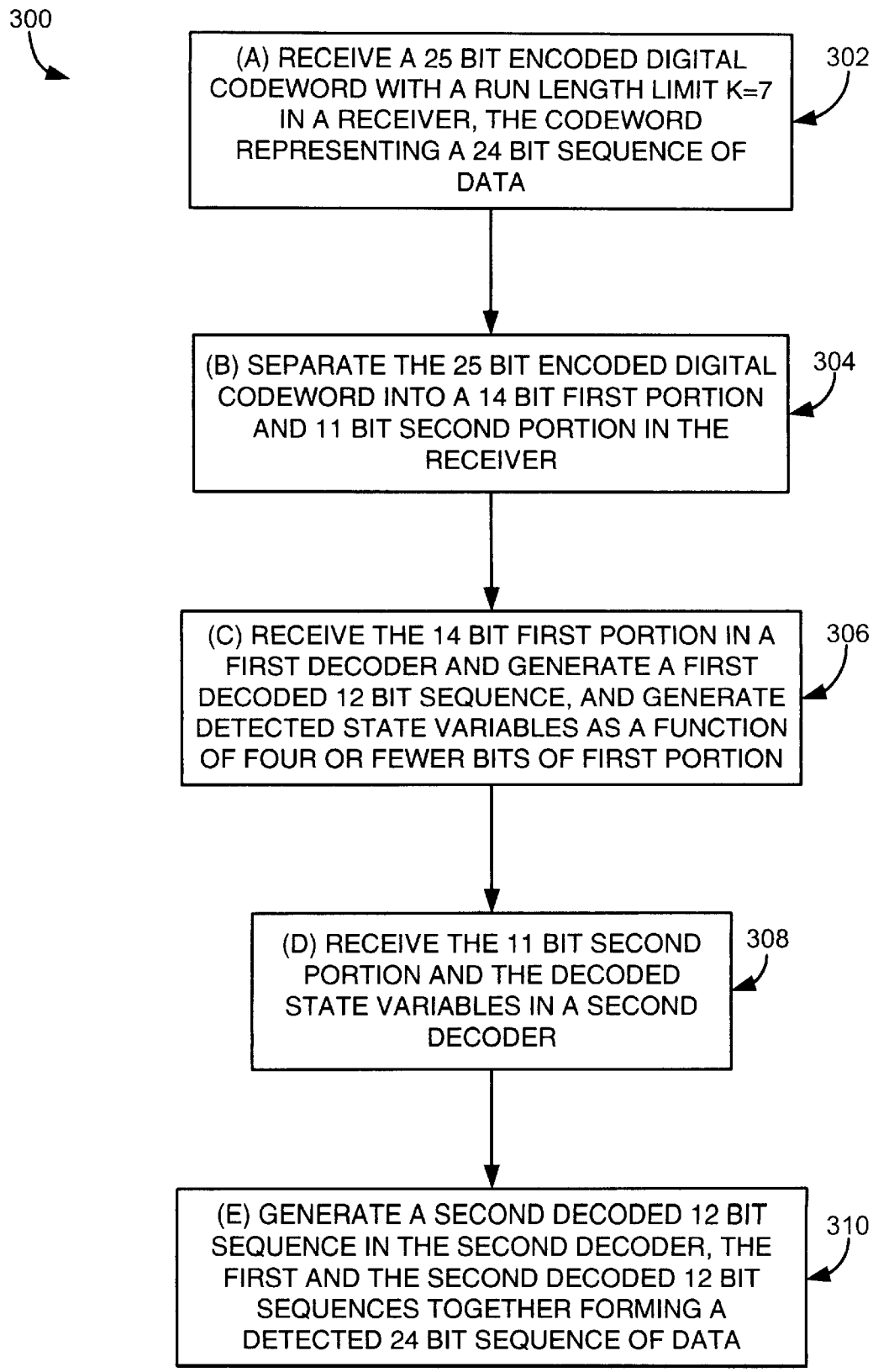
FIG. 4 is a flow chart of a method of decoding data.

In FIG. 4, a method of decoding digital data for transmission received from a communication channel is shown at 300. At 302, a 25 bit encoded digital codeword with a run length limit K=7 is received, the codeword representing a 24 bit sequence of data. At 304, the 25 bit encoded digital codeword is separated into a 14 bit first portion and an 11 bit second portion. At 306, the 14 bit first portion is received in a first decoder and the first decoder generates a first decoded 12 bit sequence, and also generates decoded state variables as a function of four or fewer bits of the first portion. At 308, the 11 bit second portion and the state variables are received in a second decoder. At 310, a second decoded 12 bit sequence is generated in the second decoder, the first and second decoded 12 bits sequences together forming a decoded 24 bit sequence of data.

Further details of encoders, decoders and code decoders are shown in Tables 1–12 below. Tables are used rather than circuit diagrams of flow charts to provide a more compact, understandable description of the logic operations performed. It is understood that the functions described by the tables can be performed in hardware, software, firmware or any combination of hardware, software and firmware.

Table 1, "Equations for Encoder and Decoder," provides definitions for the symbols or logical operators used in the logic statements in Tables 2–7.

TABLE 1

Equations for Encoder and Decoder

Symbol definition:

| | |
|---|---|
| "\|" | Bitwise OR |
| "&" | Bitwise AND |
| "^" | Bitwise XOR |
| "+" | Arithmetic Sum |
| "!X" | Inverse of X |

Table 2 below shows an embodiment of logic operations or calculations in the 11-bit codeword tester (CT-A), shown at 194, 204 of FIG. 2. Table 2 lists the 11 bits of input WA10–WA0 to the code tester 194 or 204 and the output TA. Intermediate results UA0–UA8, HWA are calculated as shown, and then the output TA is calculated as a function of UA0–UA8 as shown in Table 2.

TABLE 2

11-bit codeword tester (CT-A)
Input: WA10, WA9, WA8, WA7, WA6, WA5, WA4, WA3, WA2, WA1, WA0 (11 bits)
Output: TA
UA0 = WA10|WA9|WA8|WA7
UA1 = WA3|WA2|WA1|WA0
UA2 = WA8|WA7|WA6|WA5|WA4|WA3|WA2|WA1
UA3 = WA9|WA8|WA7|WA6|WA5|WA4|WA3|WA2
UA4 = WA6|WA4|WA2|WA0
UA5 = WA7|WA5|WA3|WA1
UA6 = WA10|WA8|WA6|WA4
UA7 = WA9|WA7|WA5|WA3
{     HWA = WA10 + WA9 + WA8 + WA7 + WA6 + WA5 + WA4 + WA3 + WA2 +WA1 + WA0
    if (HWA >= 4)
      UA8 = 1
    Else
      UA8 = 0 }
TA = UA0 & UA1 & UA2 & UA3 & UA4 & UA5 & UA6 & UA7 & UA8

Table 3 below shows an embodiment of logic operations or calculations in the 14-bit codeword tester (CT-B) shown at 206, 196 of FIG. 2. Table 3 lists the 14 bits of inputs WB13–WB0 to the code tester 206 or 196 and the output TB. Intermediate results UB0–UB11, HWB are calculated as shown, and the output TB is calculated as a function of UB0–UB11.

TABLE 3

14-bit codeword tester (CT-B)
Input: WB9, WB8, WB7, WB6, WB5, WB4, WB3, WB2, WB1, WB0 (10 bits)
Output: TB
UB0 = WB13|WB12|WB11|WB10|WB9
UB1 = WB4|WB3|WB2|WB1|WB0
UB2 = WB8|WB7|WB6|WB5|WB4|WB3|WB2|WB1
UB3 = WB9|WB8|WB7|WB6|WB5|WB4|WB3|WB2
UB4 = WB10|WB9|WB8|WB7|WB6|WB5|WB4|WB3
UB5 = WB11|WB10|WB9|WB8|WB7|WB6|WB5|WB4
UB6 = WB12|WB11|WB10|WB9|WB8|WB7|WB6|WB5

TABLE 3-continued

UB7 = WB8|WB6|WB4|WB2|WB0
UB8 = WB12|WB10|WB8|WB6|WB4
UB9 = WB9|WB7|WB5|WB3|WB1
UB10 = WB13|WB11|WB9|WB7|WB5
{     HWB = WB13 + WB12 + WB11 + WB10 + WB9 + WB8 + WB7 + WB6 + WB5 + WB4 + WB3 + WB2 +WB1 + WB0
    if (HWB >= 5)
      UB11 = 1
    Else
      UB11 = 0 }
TB = UB0 & UB1 & UB2 & UB3 & UB4 & UB5 & UB6 & UB7 & UB8 & UB9 & UB10 & UB11

Table 4, shown below and continued on following pages, shows an embodiment of logic operations or calculations in the 11-bit encoder (ENC-A) 200 in FIG. 2. Table 4 lists the inputs to code tester 200 as 11 bits of inputs A10–A0 and one bit TA received from the code tester 204. Various intermediate results NA0–Gn0 are calculated as shown in Table 4, and then the outputs Y10–Y0, S0, S1, S2, WB12, WB13 are calculated using various combinations of the inputs and intermediate results as shown at the conclusion of Table 4.

TABLE 4

11-bit Encoder (ENC-A)
Input:    A11, A10, A9, A8, A7, A6, A5, A4, A3, A2, A1, A0      (12-bit Dataword)
Input:    TA      (From CT-A)
Output: Y10, Y9, Y8, Y7, Y6, Y5, Y4, Y3, Y2, Y1, Y0      (11-bit Codeword)
Output: S2, S1, S0      (To ENC-B)
Output: WB13, WB12      (To CT-B)
   NA0 = !A3 & !A2 & !A1 & !A0
   NB0 = !A7 & !A6 & !A5 & !A4
   NB2 = !A7 & !A6 & A5 & !A4
   NB8 = A7 & !A6 & !A5 & !A4
   NB10 = A7 & !A6 & A5 & !A4
   NC0 = !A10 & !A9 & !A8
   NC2 = !A10 & A9 & !A8
   Ga = NC0 & !A7 & !NA0
   Ga9 = Ga
   Ga8 = Ga & A6
   Ga7 = Ga
   Ga6 = Ga
   Ga5 = Ga & A5
   Ga4 = Ga & A4
   Ga3 = Ga & A3
   Ga2 = Ga & A2
   Ga1 = Ga & A1
   Ga0 = Ga & A0
   Gb = (((NC2|NC0) & (NB10|NB8))|(NC2 & (NB2|NB0))) & (!NA0)
   Gb9 = Gb & A7
   Gb8 = Gb & A9
   Gb7 = Gb & !A7
   Gb6 = Gb & (A5|!A7)
   Gb5 = Gb & (A5|A7)
   Gb4 = Gb & A7
   Gb3 = Gb & A3
   Gb2 = Gb & A2
   Gb1 = Gb & A1
   Gb0 = Gb & A0
   Gc = !NB0 & NA0
   Gc9 = Gc & A10
   Gc8 = Gc & A9
   Gc7 = Gc & (A8|!A10)
   Gc6 = Gc & (!A8|!A10)
   Gc5 = Gc & (A8^A10)
   Gc4 = Gc7
   Gc3 = Gc & A7
   Gc2 = Gc & A6
   Gc1 = Gc & A5
   Gc0 = Gc & A4

TABLE 4-continued

```
Gd = (A10|A8) & (!A6 & !A4) & (A3 & !A2 & !A0)
Gd9 = Gd & A9
Gd8 = Gd & A8
Gd7 = Gd & A10
Gd6 = Gd & !A10
Gd5 = Gd7
Gd4 = Gd
Gd3 = Gd
Gd2 = Gd & A7
Gd1 = Gd & A5
Gd0 = Gd & A1
Ge = (!A9 & A8) & (!A7 & !A5) & !A3 & !NA0
Ge9 = Ge & A6
Ge8 = Ge & ((A10 & !A6)|(!A10 & A4))
Ge7 = Ge & !A10
Ge6 = Ge & (A10 & A4)
Ge5 = Ge7
Ge4 = Ge & (!A10|!A4)
Ge3 = Ge & A10
Ge2 = Ge & A2
Ge1 = Ge & A1
Ge0 = Ge & A0
Gf = (A10 & !A9 & !A8) & (!A7 & !A5) & !A3 & !NA0
Gf8 = Gf
Gf7 = Gf & (A6 & A4)
Gf6 = Gf & (A6^A4)
Gf5 = Gf & (!A6|!A4)
Gf4 = Gf & (A6|!A4)
Gf2 = Gf & A2
Gf1 = Gf & A1
Gf0 = Gf & A0
Gg = (A9 & (A10|A8)) & (!A7 & !A5) & !A3 & A2 & !A1
Gg8 = Gg
Gg6 = Gg & A10
Gg5 = Gg
Gg4 = Gg & A8
Gg3 = Gg
Gg2 = Gg & A6
Gg1 = Gg & A4
Gg0 = Gg & A0
Gh = NB0 & NA0
Gh8 = Gh
Gh7 = Gh
Gh4 = Gh
Gh3 = Gh
Gh2 = Gh & A10
Gh1 = Gh & A9
Gh0 = Gh & A8
XD = !(TA|Ga|Gb|Gc|Gd)
Gj = XD & A3
Gj9 = Gj
Gj8 = Gj & (A10|A8)
Gj6 = Gj
Gj4 = Gj & (A10|A9)
Gj2 = Gj & (A6|A4)
Gj1 = Gj
Gj0 = Gj &(A6|A2)
XJ = XD & !(Ge|Gf|GG|Gh|Gj)
Gk = XJ & A2
Gk9 = Gk & !A9
Gk8 = Gk
Gk7 = Gk & A9
Gk5 = Gk & A0
Gk4 = Gk & ((A7 & A4)|(!A7 & !A9))
Gk2 = Gk & ((A6 & A9)|(!A6 & !A4))
Gk1 = Gk
Gk0 = Gk & ((A9 & A4)|(!A9 & !A8))
Gm = XJ & !A2 & A9
Gm9 = Gm & (A10|A8)
Gm8 = Gm
Gm7 = Gm & A10
Gm5 = Gm & (A8|!A10)
Gm3 = Gm & ((A6 & A1)|(!A6 & !A4))
Gm2 = Gm & (A7|!A1)
Gm1 = Gm & (A5|A4)
Gm0 = Gm & (A6|A1)
Gn = XJ & !A2 & !A9
Gn9 = Gn
Gn8 = Gn & (A10|A8)
```

TABLE 4-continued

```
Gn6 = Gn & (A10^!A8)
Gn4 = Gn & !A8
Gn3 = Gn
Gn2 = Gn & A1
Gn1 = Gn & ((A4 & A1)|(!A4 & A7))
Gn0 = Gn & (A6|A5|!A1)
Y10 = (TA & A10)|(!TA & A11)
Y9 = (TA & A9)|(!TA & (Ga9|Gb9|Gc9|Gd9|Ge9|Gj9|Gk9|Gm9|
   Gn9))
Y8 = (TA & A8)|(!TA & (Ga8|Gb8|Gc8|Gd8|Ge8|Gf8|Gg8|Gh8|
   Gj8|Gk8|Gm8|Gn8))
Y7 = (TA & A7)|(!TA & (Ga7|Gb7|Gc7|Gd7|Ge7|Gf7|Gh7|Gk7|
   Gm7))
Y6 = (TA & A6)|(!TA & (Ga6|Gb6|Gc6|Gd6|Ge6|Gf6|Gg6|Gj6|
   Gn6))
Y5 = (TA & A5)|(!TA & (Ga5|Gb5|Gc5|Gd5|Ge5|Gf5|Gg5|Gk5|
   Gm5))
Y4 = (TA & A4)|(!TA & (Ga4|Gb4|Gc4|Gd4|Ge4|Gf4|Gg4|Gh4|
   Gj4|Gk4|Gn4))
Y3 = (TA & A3)|(!TA & (Ga3|Gb3|Gc3|Gd3|Ge3|Gg3|Gh3|
   Gm3|Gn3))
Y2 = (TA & A2)|(!TA & (Ga2|Gb2|Gc2|Gd2|Ge2|Gf2|Gg2|Gh2|
   Gj2|Gk2|Gm2|Gn2))
Y1 = (TA & A1)|(!TA & (Ga1|Gb1|Gc1|Gd1|Ge1|Gf1|Gg1|Gh1|
   Gj1|Gk1|Gm1|Gn1))
Y0 = (TA & A0)|(!TA & (Ga0|Gb0|Gc0|Gd0|Ge0|Gf0|Gg0|Gh0|
   Gj0|Gk0|Gm0|Gn0))
S2 = A11 & TA
S1 = !A11 & TA
S0 = !TA
WB13 = S2|S1
WB12 = S2|S0
```

Table 5, shown on the following pages, shows an embodiment of logic operations or calculations in the 14-bit Encoder (ENC-B) 202 of FIG. 2. Table 5 lists the inputs to Encoder 202 as 12 bits of inputs B11–B0 and three state variables S2, S1, S0. One bit TB is received from the code tester 206. Various intermediate results NA0–T0 are calculated as shown in Table 5, and then the outputs Z13–Z0 are calculated using various combinations of the inputs and intermediate results as shown in Table 5.

TABLE 5

```
14-bit Encoder (ENC-B)
Input:  B11, B10, B9, B8, B7, B6, B5, B4, B3,    (12-bit Dataword)
        B2, B1, B0
Input:  S2, S1, S0                               (From ENC-A)
Input:  TB                                       (From CT-B)
Output: Z13, Z12, Z11, Z10, Z9, Z8, Z7, Z6, Z5,  (14-bit Codeword)
        Z4, Z3, Z2, Z1, Z0
   NA0 = !B3 & !B2 & !B1 & !B0
   NA1 = !B3 & !B2 & !B1 & B0
   NA2 = !B3 & !B2 & B1 & !B0
   NA3 = !B3 & !B2 & B1 & B0
   NA4 = !B3 & B2 & !B1 & !B0
   NA6 = !B3 & B2 & B1 & !B0
   NA7 = !B3 & B2 & B1 & B0
   NB0 = !B7 & !B6 & !B5 & !B4
   NB1 = !B7 & !B6 & !B5 & B4
   NB5 = !B7 & B6 & !B5 & B4
   NC8 = B11 & !B10 & !B9 & !B8
   Ha = !B4 & NA0
   Ha11 = Ha & (S2|S1)
   Ha10 = Ha & (!S2|S1)
   Ha9 = Ha & B11
   Ha8 = Ha & !B11
   Ha7 = Ha & (B10|B9)
   Ha6 = Ha & (B10|!B9)
   Ha5 = Ha & (B9|!B10)
   Ha4 = Ha
   Ha3 = Ha & B8
   Ha2 = Ha & B7
   Ha1 = Ha & B6
```

TABLE 5-continued

```
Ha0 = Ha & B5
Hb = !B8 & !B6 & !B4 & !B2 & !B0 & (!NA0)
Hb11 = Hb & (S2|S1)
Hb10 = Hb & (!S2|S1)
Hb9 = Hb
Hb8 = Hb
Hb7 = Hb & B11
Hb6 = Hb & B10
Hb5 = Hb
Hb4 = Hb & B3
Hb3 = Hb & B9
Hb2 = Hb & B7
Hb1 = Hb & B5
Hb0 = Hb & B1
Hc = !B9 & !B7 & !B5 & !B3 & !B1 & (!NA0)
Hc11 = Hc & (S2|S1)
Hc10 = Hc & (!S2|S1)
Hc9 = Hc & (B11|B10)
Hc8 = Hc9
Hc7 = Hc & (B11|!B10)
Hc6 = Hc & (B10|!B11)
Hc5 = Hc & (!B11 & !B10)
Hc4 = Hc & B2
Hc3 = Hc & B8
Hc2 = Hc & B6
Hc1 = Hc & B4
Hc0 = Hc & B0
XHac = !Ha & !Hb & !Hc
Hd = S2 & ((!B9 & (NB1|NB5) & NA0)|NA1|NA3|NA6|NA7) & (XHac)
Hd11 = Hd
Hd9 = Hd
Hd8 = Hd
Hd7 = Hd & (!B7 & !B5 & !B2)
Hd6 = Hd & (B7|(B11 & !B2))
Hd5 = Hd & (B10|B5)
Hd4 = Hd & (B11 & B2)
Hd3 = Hd & B4
Hd2 = Hd & (B9|B8|B2)
Hd1 = Hd & (B6|(!B9 & !B4))
Hd0 = Hd & (B2 & B0)
XHad = !Ha & !Hb & !Hc & !Hd
S2X = S2 & XHad
He = S2X & !B3
He11 = He
He9 = He
He6 = He & (!B9 & !B8)
He4 = He & (!B5 & (!B4|!B1))
He3 = He
He2 = He & !B2
He1 = He & !B1
He0 = He
Hf = S2X & B3
Hf11 = Hf
Hf8 = Hf
Hf7 = Hf & B8
Hf6 = Hf & (!B8 & !B4)
Hf5 = Hf & (!B8 & !B6)
Hf3 = Hf
Hf2 = Hf & (B2|!B0)
Hf1 = Hf & (B1|(!B2 & !B0))
Hf0 = Hf & (B0|!B2)
S1X = S1 & XHac
S0X = S0 & XHac
Ja = S1X & !B10 & !B8 & !B6 & !B4
Ja11 = Ja
Ja10 = Ja
Ja9 = Ja & B11
Ja8 = Ja & !B11
Ja7 = Ja & (B9|(B7 & !B5))
Ja6 = Ja & (B7 & (B9|B5))
Ja5 = Ja & B5
Ja4 = Ja & (B7 & !B9 & !B5)
Ja3 = Ja & B3
Ja2 = Ja & B2
Ja1 = Ja & B1
Ja0 = Ja & B0
Jb = (S1X|S0X) & B11 & B10
Jb11 = Jb & S1
Jb10 = Jb
Jb9 = Jb
Jb8 = Jb
Jb7 = Jb
Jb6 = Jb
Jb5 = Jb
Jb3 = Jb & B4
Jb2 = Jb & (B9|B8)
Jb1 = Jb & (B6|B1)
Jc = S1X & (B11^B10) & !B2 & !B0
Jc11 = Jc
Jc10 = Jc
Jc9 = Jc
Jc8 = Jc
Jc7 = Jc & B11
Jc6 = Jc & (B9|B8)
Jc5 = Jc & (B5|(!B8 & !B4))
Jc3 = Jc & (!B3 & !B1)
Jc2 = Jc & (B9|B7|B3)
Jc1 = Jc & (B1|(B6 & B4))
Jd = S1X & (B11^B10) & !Ja & !Jc
Jd11 = Jd
Jd10 = Jd
Jd9 = Jd
Jd8 = Jd
Jd4 = Jd
Jd3 = Jd & (B9|B3)
Jd2 = Jd & (B9|B7)
Jd1 = Jd & B1
Jd0 = Jd & !B2
Je = S1X & (!B11 & !B10) & !B2 & !B1 & !B0
Je11 = Je
Je10 = Je
Je6 = Je & B4
Je5 = Je & (!B4|!B3)
Je4 = Je & !B9
Je3 = Je & !B7
Je2 = Je & !B6
Je1 = Je & !B5
Je0 = Je & (B8|(B9 & !B4))
Jf = S1X & (!B11 & !B10) & (NA1|NA4) & !Ja
Jf11 = Jf
Jf10 = Jf
Jf9 = Jf
Jf6 = Jf
Jf4 = Jf & (B9|B8)
Jf3 = Jf & (B5|(B9 & !B8))
Jf2 = Jf & (B4|(!B9 & !B6))
Jf1 = Jf & (B7|(B9 & !B8))
Jf0 = Jf & B2
Jg = S1X & (!B11 & !B10) & NA2
Jg11 = Jg
Jg10 = Jg
Jg9 = Jg
Jg5 = Jg & (B9|B8)
Jg4 = Jg
Jg3 = Jg & (!B9 & !B7)
Jg2 = Jg & (B9^!B6)
Jg1 = Jg & (!B9 & !B5)
Jg0 = Jg & (B9^!B4)
Jh = S1X & (!B11 & !B10) & (!Ja & !Je & !Jf & !Jg)
Jh11 = Jh
Jh10 = Jh
Jh8 = Jh
Jh6 = Jh & !B4
Jh5 = Jh & B4
Jh4 = Jh & !B6
Jh3 = Jh & B3
Jh2 = Jh & B2
Jh1 = Jh & B1
Jh0 = Jh & B0
Ka = S0 & !B11 & !B9 & !B7 & !B5 & !NA0 & XHac
Ka10 = Ka & B10
Ka9 = Ka & (B8|!B10)
Ka8 = Ka & (B10^B8)
Ka7 = Ka & B6
Ka6 = Ka & (B6|!B10|!B4)
Ka5 = Ka & (B4|!B10|!B6)
Ka4 = Ka & (B4 & (!B10|!B6))
```

TABLE 5-continued

```
Ka3 = Ka & B3
Ka2 = Ka & B2
Ka1 = Ka & B1
Ka0 = Ka & B0
Kb = S0X & NC8 & NB0
Kb10 = Kb
Kb9 = Kb
Kb4 = Kb
Kb3 = Kb & B3
Kb2 = Kb & B2
Kb1 = Kb & !B3
Kb0 = Kb & B0
Kc = S0X & (B11^B10) & !B2 & !B0 & !Ka
Kc10 = Kc
Kc9 = Kc
Kc8 = Kc
Kc7 = Kc & (B11 & !B3 & !B1)
Kc6 = Kc & (B8|B3|B1)
Kc5 = Kc & (!B4|(!B9 & !B8))
Kc3 = Kc & (B9|B8|B7|B6)
Kc2 = Kc & (!B7 & !B6)
Kc1 = Kc & (B7|B5|B3)
Kd = S0X & (B11^B10) & !Ka & !Kb & !Kc
Kd10 = Kd
Kd9 = Kd
Kd8 = Kd
Kd4 = Kd
Kd3 = Kd & B11
Kd2 = Kd & B2
Kd1 = Kd & !B5
Kd0 = Kd & !B7
Ke = S0X & (!B11 & !B10) & !B2 & !B1 & !B0 & !Ka
Ke9 = Ke
Ke8 = Ke
Ke6 = Ke & !B3
Ke5 = Ke & (B4 & B3)
Ke4 = Ke & (!B9|(!B8 & !B4))
Ke3 = Ke & !B7
Ke2 = Ke & !B6
Ke1 = Ke & !B5
Ke0 = Ke & (B8|(!B9 & B4))
Kf = S0X & (!B11 & !B10) & (NA1|NA4)
Kf9 = Kf
Kf8 = Kf
Kf7 = Kf
Kf6 = Kf & (!B9 & !B8)
Kf5 = Kf & B8
Kf4 = Kf & !B2
Kf3 = Kf & !B7
Kf2 = Kf & !B6
Kf1 = Kf & !B5
Kf0 = Kf & B4
Kg = S0X & (!B11 & !B10) & NA2 & !Ka
Kg10 = Kg
Kg9 = Kg
Kg7 = Kg
Kg4 = Kg & (B9|B8)
Kg3 = Kg & !B7
Kg2 = Kg & !B6
Kg1 = Kg & !B5
Kg0 = Kg & !B4
Kh = S0X & (!B11 & !B10) & (!Ka & !Ke & !Kf & !Kg)
```

TABLE 5-continued

```
Kh10 = Kh
Kh7 = Kh
Kh5 = Kh & !B5
Kh4 = Kh & !B7
Kh3 = Kh & B3
Kh2 = Kh & B2
Kh1 = Kh & B1
Kh0 = Kh & B0
T11 = (Ha11|Hb11|Hc11|Hd11|He11|Hf11|Ja11|Jb11|Jc11|Jd11|
       Je11|Jf11|Jg11|Jh11)
T10 = (Ha10|Hb10|Hc10|Ja10|Jb10|Jc10|Jd10|Je10|Jf10|Jg10|Jh10
       |Ka10|Kb10|Kc10|Kd10|Kg10|Kh10)
T9 = (Ha9|Hb9|Hc9|Hd9|He9|Ja9|Jb9|Jc9|Jd9|Jf9|Jg9|Ka9|Kb9|Kc9|
      Kd9|Ke9|Kf9|Kg9)
T8 = (Ha8|Hb8|Hc8|Hd8|Hf8|Ja8|Jb8|Jc8|Jd8|Jh8|Ka8|Kc8|Kd8|
      Ke8|Kf8)
T7 = (Ha7|Hb7|Hc7|Hd7|Hf7|Ja7|Jb7|Jc7|Ka7|Kc7|Kf7|Kg7|Kh7)
T6 = (Ha6|Hb6|Hc6|Hd6|He6|Hf6|Ja6|Jb6|Jc6|Je6|Jf6|Jh6|Ka6|Kc6|
      Ke6|Kf6)
T5 = (Ha5|Hb5|Hc5|Hd5|Hf5|Ja5|Jb5|Jc5|Je5|Jg5|Jh5|Ka5|Kc5|Ke5|
      Kf5|Kh5)
T4 = (Ha4|Hb4|Hc4|Hd4|He4|Ja4|Jd4|Je4|Jf4|Jg4|Jh4|Ka4|Kb4|Kd4|
      Ke4|Kf4|Kg4|Kh4)
T3 = (Ha3|Hb3|Hc3|Hd3|He3|Hf3|Ja3|Jb3|Jc3|Jd3|Je3|Jf3|Jg3|Jh3
      |Ka3|Kb3|Kc3|Kd3|Ke3|Kf3|Kg3|Kh3)
T2 = (Ha2|Hb2|Hc2|Hd2|He2|Hf2|Ja2|Jb2|Jc2|Jd2|Je2|Jf2|Jg2|Jh2
      |Ka2|Kb2|Kc2|Kd2|Ke2|Kf2|Kg2|Kh2)
T1 = (Ha1|Hb1|Hc1|Hd1|He1|Hf1|Ja1|Jb1|Jc1|Jd1|Je1|Jf1|Jg1|Jh1
      |Ka1|Kb1|Kc1|Kd1|Ke1|Kf1|Kg1|Kh1)
T0 = (Ha0|Hb0|Hc0|Hd0|He0|Hf0|Ja0|Jd0|Je0|Jf0|Jg0|Jh0
      |Ka0|Kb0|Kd0|Ke0|Kf0|Kg0|Kh0)
Z13 = (TB & (S1|S2))
Z12 = (TB & (S0|S2))
Z11 = (TB & B11)|(!TB & T11)
Z10 = (TB & B10)|(!TB & T10)
Z9 = (TB & B9)|(!TB & T9)
Z8 = (TB & B8)|(!TB & T8)
Z7 = (TB & B7)|(!TB & T7)
Z6 = (TB & B6)|(!TB & T6)
Z5 = (TB & B5)|(!TB & T5)
Z4 = (TB & B4)|(!TB & T4)
Z3 = (TB & B3)|(!TB & T3)
Z2 = (TB & B2)|(!TB & T2)
Z1 = (TB & B1)|(!TB & T1)
Z0 = (TB & B0)|(!TB & T0)
```

Table 6 below shows an embodiment of logic operations or calculations in the 11-bit Decoder (DEC-A) 208 of FIG. 1. Table 6 lists the inputs to Decoder 208 as 11 bits of inputs Y10–Y0, and three state variables S2, S1, S0, which are recovered state variables. One bit TA is received from the code tester 194 of FIG. 1. Various intermediate results NB1–S12 are calculated as shown in Table 5, and then the outputs A11–A0, FA are calculated using various combinations of the inputs and intermediate results as shown in Table 6.

TABLE 6

11-bit Decoder (DEC-A)

| | |
|---|---|
| Input: Y10,Y9,Y8,Y7,Y6,Y5,Y4,Y3,Y2,Y1,Y0 | (11-bit Codeword) |
| Input: TA | (From CT-A) |
| Input: S2,S1,S0 | (From DEC-B) |
| Output: A11,A10,A9,A8,A7,A6,A5,A4,A3,A2,A1,A0 | (12-bit Dataword) |
| Output: FA | (Invalid codeword indicator) |

```
NB1=!Y7 & !Y6 & !Y5 & Y4
NB2=!Y7 & !Y6 & Y5 & !Y4
NB3=!Y7 & !Y6 & Y5 & Y4
NB4=!Y7 & Y6 & !Y5 & !Y4
```

TABLE 6-continued 11-bit Decoder (DEC-A)

NB5=!Y7 & Y6 & !Y5 & Y4
NB6=!Y7 & Y6 & Y5 & !Y4
NB9=!Y7 & !Y6 & !Y5 & Y4
NB11=Y7 & !Y6 & Y5 & Y4
NC1=!Y9 & Y8
NC2=Y9 & !Y8
NC3=Y9 & Y8
Ga=Y9 & Y7 & Y6
Gb=(Y9 & !Y7 & Y5 & Y4)|(!Y9 & Y8 & Y7 & Y6 & 49 Y4)
Gc=(Y9 & (NB6|NB9))|(!Y9 & Y7 & Y6 & Y4)
Gd=((Y8 & NB5)|NB11) & Y3
Ge=(NB11 & !Y3)|((NC1|NC2) & (NB1|NB4) & Y3)
Gf=NC1 & (NB3|(!Y7 & Y6)|NB9) & !Y3
Gg=NC1 & !Y7 & (Y6|Y4) & Y5 & Y3
Gh=NC1 & NB9 & Y3
Gj=(NC3|NC2) & (!Y7 & Y6 & !Y5 & !Y3)
Gk=((NC3 & !Y7 & !YT & !Y5)|(NC1 & Y7 & !Y6 & !Y4)) & !Y3
Gm=(NC3 & (Y7|Y5) & !Y6 & !Y4)|(NC1 & NB2)
Gn=((NC3 & !Y7 & !Y5 & (!Y6|!Y4))|(NC2 & NB5)) & Y3
Ga6=Ga & Y8
Ga5=Ga & Y5
Ga4=Ga & Y4
Ga3=Ga & Y3
Ga2=Ga & Y2
Ga1=Ga & Y1
Ga0=Ga & Y0
Gb9=Gb & Y8
Gb7=Gb & Y9
Gb5=Gb & Y6 & Y5
Gb3=Gb & Y3
Gb2=Gb & Y2
Gb1=Gb & Y1
Gb0=Gb & Y0
Gc10=Gc & Y9
Gc9=Gc & Y8
Gc8=Gc & (Y9^Y5)
Gc7=Gc & Y3
Gc6=Gc & Y2
Gc5=Gc & Y1
Gc4=Gc & Y0
Gd10=Gd & Y7
Gd9=Gd & Y9
Gd8=Gd & Y8
Gd7=Gd & Y2
Gd5=Gd & Y1
Gd3=Gd
Gd1=Gd & Y0
Ge10=Ge & !7
Ge8=Ge
Ge6=Ge & Y9
Ge4=Ge & (Y6|(Y8 & Y7))
Ge2=Ge & Y2
Ge1=Ge & Y1
Ge0=Ge & Y0
Gf10=Gf
Gf6=Gf & (Y7|(Y6 & Y4))
Gf4=Gf & (Y7|!Y4)
Gf2=Gf & Y2
Gf1=Gf & Y1
Gf0=Gf & Y0
Gg10=Gg & Y6
Gg9=Gg
Gg8=Gg & Y4
Gg6=Gg & Y2
Gg4=Gg & Y1
Gg2=Gg
Gg0=Gg & Y0
Gh10=Gh & Y2
Gh9=Gh & Y1
Gh8=Gh & Y0
Gj10=Gj & (Y8 & Y4)
Gj9=Gj & (Y4 & !Y8)
Gj8=Gj & (Y8 & !Y4)
Gj7=Gj & (!Y8 & !Y4)
Gj6=Gj & (Y2 & Y0)
Gj4=Gj & (Y2 & !Y0)
Gj3=Gj

TABLE 6-continued 11-bit Decoder (DEC-A)

Gj2=Gj & (Y0 & !Y2)
Gj0=Gj & (!Y2 & !Y0)
Gk10=Gk & (Y9 & Y2 & Y0)
Gk9=Gk & !Y9
Gk8=Gk & (Y9 & !Y0)
Gk7=Gk & (Y9 & (!Y4 | !Y2))
Gk6=Gk & ((Y7 & Y2)|(Y9 & !Y4 & !Y2))
Gk5=Gk & (Y4 & Y2)
Gk4=Gk & ((Y7 & Y0)|(Y9 & Y4 & !Y2))
Gk2=Gk
Gk0=Gk & Y5
Gm10=Gm & Y7
Gm9=Gm
Gm8=Gm & (Y9 & Y5)
Gm7=Gm & (Y3 & Y2 & Y0)
Gm6=Gm & (((Y9 & !Y3)|(!Y9 & (Y3|Y2))) & Y0)
Gm5=Gm & (Y3 & Y1)
Gm4=Gm & (Y1 & !Y3)
Gm1=Gm & (!Y2|(Y3 & Y0))
Gm0=Gm & (!Y0|(Y2 & !Y3))
Gn10=Gn & (Y6 ^ Y4)
Gn8=Gn & !Y4
Gn7=Gn & (Y1 | !Y8)
Gn6=Gn & (Y1 & Y0 & !Y8)
Gn5=Gn & (Y8 & Y2|!Y1) & Y0)
Gn4=Gn & (!Y8 & (!Y1 | !Y0))
Gn1=Gn & Y2
Gn0=Gn & !Y2
S12=S2|S1
A11=S2|(S0 & Y10)
A10=(S12 & Y10)|(S0 & (Gc10|Gd10|Ge10|Gf10|Gg10|Gh10|Gj10|Gk10|Gm10|Gn10))
A9=(S12 & Y9)|(S0 & (Gb9|Gc9|Gd9|Gg9|Gh9|Gj9|Gk9|Gm9))
A8=(S12 & Y8)|(S0 & (Gc8|Gd8|Ge8|Gg8|Gh8|Gj8|Gk8|Gm8|Gn8))
A7=(S12 & Y7)|(S0 & (Gb7|Gc7|Gd7|Gj7|Gk7|Gm7|Gn7))
A6=(S12 & Y6)|(S0 & (Ga6|Gc6|Ge6|Gf6|Gg6|Gj6|Gk6|Gm6|Gn6))
A5=(S12 & Y5)|(S0 & (Ga5|Gb5|Gc5|Gd5|Gk5|Gm5|Gn5))
A4=(S12 & Y4)|(S0 & (Ga4|Gc4|Ge4|Gf4|Gg4|Gj4|Gk4|Gm4|Gn4))
A3=(S12 & Y3)|(S0 & (Ga3|Gb3|Gd3|Gj3))
A2=(S12 & Y2)|(S0 & (Ga2|Gb2|Ge2|Gf2|Gg2|Gj2|Gk2))
A1=(S12 & Y1)|(S0 & (Ga1|Gb1|Gd1|Ge1|Gf1|Gm1|Gn1))
A0=(S12 & Y0)|(S0 & (Ga0|Gb0|Ge0|Gf0|Gg0|Gj0|Gk0|Gm0|Gn0))
PA=(Ga|Gb|Gc|Gd|Ge|Gf|Gg|Gh|Gj|Gk|Gm|Gn)
FA=(!TA)|(S0 & !PA)

Table 7, shown on the following pages, shows an embodiment of logic operations or calculations in the 14-bit Decoder (DEC-B) 210 of FIG. 1. Table 7 lists the inputs to Decoder 210 as 14 bits of inputs Z10–Z0. One bit TB is received from the code tester 196 of FIG. 2. Various intermediate results NB1–T0 are calculated as shown in Table 7, and then the outputs B11–B0, FB, S2, S1, S0 are calculated using various combinations of the inputs and intermediate results as shown in Table 7.

TABLE 7

14-bit Decoder (DEC-B)

| | |
|---|---|
| Input: Z13,Z12,Z11,Z10,Z9,Z8,Z7,Z6,Z5,Z4,Z3,Z2,Z1,Z0 | (14-bit Codeword) |
| Input: TB | (From CT-B) |
| Output: B11,B10,B9,B8,B7,B6,B5,B4,B3,B2,B1,B0 | (12-bit Dataword) |
| Output: S2,S1,S0 | (To ENC-B) |
| Output: FB | (Invalid codeword indicator) |

NB1=!Z7 & !Z6 & !Z5 & Z4
    NB14=Z7 & Z6 & Z5 & !Z4
    NC3=(!Z11 & !Z10 & Z9 & Z8)
    NC4=(!Z11 & Z10 & !Z & !Z8)
    NC6=(!Z11 & Z10 & Z9 & !Z8)
    NC7=(!Z11 & Z10 & Z9 & Z8)
    NC9=(Z11 & !Z10 & !Z9 & Z8)
    NC10=(Z11 & !Z10 & Z9 & !Z8)
    NC11=(Z11 & !Z10 & Z9 & Z8)
    NC12=(Z11 & Z10 & !Z9 & !Z8)
    NC13=(Z11 & Z10 & !Z9 & Z8)
    NC14=(Z11 & Z10 & Z9 & !Z8)
    NC15=(Z11 & Z10 & Z9 & Z8)

TABLE 7-continued 14-bit Decoder (DEC-B)

Ha=(Z11|Z10) & (Z9^Z8) & Z4 & ((Z6 & Z5)|Z7 & (Z6|Z5)))
Hb=(Z11|Z10) & Z9 & Z8 & Z5 & (Z4|(!Z4 & Z0))
Hc=(Z11|Z10) &
 ((!Z9 & !Z8 & Z7 & Z6 & Z5)|(Z9 & Z8 & (Z7|Z6) & !Z5)) & (Z4|(!Z4 & Z0))
Hd=NC11 & !Hb & !Hc
He=NC10 & (!Z7 & !Z5)
Hf=NC9 & !Z4
Ja=(NC13|NC14) & !Ha & (Z7|((!Z6|Z5) & !Z4))
Jb=(NC7|NC15) & NB14 & !Z0
Jc=NC15 & !Z4 & !NB14 & !Hb & !Hc
Jd=NC15 & NB1
Je=NC12 & !Z7
Jf=NC14 & !Z7 & Z6 & !Z5
Jg=NC14 & !Z7 & !Z6 & Z4
Jh=NC13 & !Z7 & ((Z6 & !Z5)|(!Z6 & Z4))
Ka=!Z11 &
 ((!Z10 & Z9 & Z6 & Z5)|(Z10 & (Z9^Z8) & ((Z7 & Z6 & !Z4)|(!Z7 & Z5 & (Z6^Z4)))))
Kb=NC6 & NB1
Kc=NC7 & !Z4 & !NB14 & !Hb & !Hc
Kd=NC7 & NB1
Ke=NC3 & !Z7 & ((Z6 & !Z5)|!Z6)
Kf=NC3 & Z7 & ((Z6 & 'Z5)|!Z6)
Kg=NC6 & Z7 & 'Z6 & !Z5)
Kh=NC4 & Z7 & !Z6
Ha11=Ha & Z9
Ha10=Ha & Z7 & Z6
Ha9=Ha & Z7 & Z5
Ha8=Ha & Z3
Ha7=Ha & Z2
Ha6=Ha & Z1
Ha5=Ha & Z0
Hb11=Hb & Z7
Hb10=Hb & Z6
Hb9=Hb & Z3
Hb7=Hb & Z2
Hb5=Hb & Z1
Hb3=Hb & Z4
Hb1=Hb & Z0
Hc11=Hc & Z9 & Z7
Hc10=Hc & Z9 & Z6
Hc8=Hc & Z3
Hc6=Hc & Z2
Hc4=Hc & Z1
Hc2=Hc & Z4
Hc0=Hc & Z0
Hd11=Hd & (Z4|(Z7 & Z6))
Hd10=Hd & Z7 & Z5
Hd9=Hd & !Z3 & !Z1
Hd8=Hd & Z3 & Z2
Hd7=Hd & Z6 & !Z7
Hd6=Hd & Z3 & Z1
Hd5=Hd & Z5 & !Z7
Hd4=Hd & Z3
Hd2=Hd & Z2 & !Z7
Hd1=Hd & ((Z2 & !Z7)|(Z7 & !Z3 & Z1))
Hd0=Hd & ((Z7 & !Z3 & (Z2|Z1))|(!Z7 & (!Z2|Z0)))
He9=He & Z1 & !Z6
He8=He & !Z6 & !Z1
He7=He & Z6 & Z4 & Z1
He6=He & Z6 & Z4 & !Z1
He5=He & Z1 & !Z4
He4=He & (Z2 & (Z1|!Z4))
He2=He & !Z2
He1=He & !Z1
Hf8=Hf & Z7
Hf6=Hf & !Z7 & !Z5
Hf4=Hf & !Z7 & !Z6
Hf3=Hf
Hf2=Hf & Z6 & Z5 & Z2
Hf1=Hf & Z6 & Z5 & Z1
Hf0=Hf & Z6 & Z5 & Z0
Ja11=Ja & Z9
Ja9=Ja & Z7 & !Z4
Ja7=Ja & (Z6|Z4)
Ja5=Ja & Z5
Ja3=Ja & Z3
Ja2=Ja & Z2

TABLE 7-continued 14-bit Decoder (DEC-B)

```
Ja1=Ja & Z1
Ja0=Ja & Z0
Jb11=Jb
Jb10=Jb
Jb9=Jb & !Z3 & !Z1
Jb8=Jb & Z3 & Z2
Jb6=Jb & Z3 & Z1
Jb4=Jb & Z3
Jb1=Jb & !Z3 & !Z2
Jb0=Jb & !Z3
Jc11=Jc & Z/
Jc10=Jc & !Z7
Jc9=Jc & Z6 & Z3 & Z2
Jc8=Jc & Z6 & (!Z3 | !Z2)
Jc7=Jc & Z3 & Z2 & !Z6
Jc6=Jc & ((Z3 & Z1)|(!Z3 & Z5))
Jc5=Jc & Z5 & Z3
Jc4=Jc & (Z3|(!Z6 & !Z5))
Jc3=Jc & !Z3 & !Z1
Jc1=Jc & !Z3 & !Z2
Jd10=Jd
Jd9=Jd & Z3 & Z2
Jd7=Jd & Z2 & !Z3
Jd5=Jd & !Z3 & !Z2 & !Z1
Jd3=Jd & Z3 & !Z2
Jd2=Jd & !Z0
Jd1=Jd & Z1
Jd0=Jd & Z0
Je9=Je & !Z4
Je8=Je & (Z0 & (Z4|Z2))
Je7=Je & !Z3
Je6=Je & !Z2
Je5=Je & !Z1
Je4=Je & Z6
Je3=Je & (!Z6|Z5)
Jf9=Jf & (Z3^!Z1)
Jf8=Jf & Z4 & (!Z3|!Z1)
Jf7=Jf & Z1 & !Z3
Jf6=Jf & !Z2 & (Z3|!Z4)
Jf5=Jf & Z3 & !Z1
Jf4=Jf & (Z2 & (!Z4|(Z3 & Z1)))
Jf2=Jf & Z0
Jf0=Jf & !Z0
Jg9=Jg & !Z3 & !Z1
Jg8=Jg & (Z5 & (Z3|(!Z2^Z0)))
Jg7=Jg & Z1 & !Z3
Jg6=Jg & ((!Z5 & !Z2)|(Z5 & ((Z3 & !Z2)|(!Z3 & (Z2^Z1)))))
Jg5=Jg & Z3 & !Z1
Jg4=Jg & ((!Z5 & !Z0)|(Z5 & ((Z3|Z1)^Z0)))
Jg1=Jg
Jh8=Jh & Z6 & Z4
Jh6=Jh & !Z4
Jh4=Jh & !Z6
Jh3=Jh & Z3
Jh2=Jh & Z2
Jh1=Jh & Z1
Jh0=Jh & Z0
Ka10=Ka & Z10
Ka8=Ka & (Z10^Z8)
Ka6=Ka & Z7
Ka4=Ka & (Z4|(Z10 & Z7 & Z5))
Ka3=Ka & Z3
Ka2=Ka & Z2
Ka1=Ka & Z1
Ka0=Ka & Z0
Kb11=Kb
Kb3=Kb & Z3
Kb2=Kb & Z2
Kb1=Kb & !Z3
Kb0=Kb & Z0
Kc11=Kc & (Z7|(Z6 & Z5))
Kc10=Kc & (!Z7 & (!Z6|!Z5))
Kc9=Kc & (!Z6 & !Z5)
Kc8=Kc & (Z6 & (!Z5|(Z3 & Z2)))
Kc7=Kc & (Z3 & Z1 & !Z6)
Kc6=Kc & (!Z2 & (Z6|!Z1))
Kc5=Kc & (Z2 & Z1 & !Z6)
```

TABLE 7-continued 14-bit Decoder (DEC-B)

```
Kc4=Kc & (!Z6|!Z5|!Z3)
Kc3=Kc & (Z6 & Z1)
Kc1=Kc & (Z6 & Z5 & !Z1)
Kd11=Kd & Z3
Kd10=Kd & !Z3
Kd9=Kd & Z1 & Z0
Kd7=Kd & !Z0
Kd5=Kd & !Z1
Kd2=Kd & Z2
Kd0=Kd & !Z2
Ke9=Ke & (!Z4|(!Z6 & !Z5 & Z4 & !Z0))
Ke8=Ke & (Z0 & (Z6|Z2))
Ke7=Ke & !Z3
Ke6=Ke & !Z2
Ke5=Ke & !Z1
Ke4=Ke & (Z6|Z5)
Ke3=Ke & !Z6
Kf9=Kf & ((!Z6 & !Z5)|(Z3 & Z2 & Z1 & !Z0))
Kf8=Kf & Z5
Kf7=Kf & !Z3
Kf6=Kf & !Z2
Kf5=Kf & !Z1
Kf4=Kf & Z0
Kf2=Kf & !Z4
Kf0=Kf & Z4
Kg9=Kg & Z3 & Z1
Kg8=Kg & Z2 & Z0
Kg7=Kg & !Z3
Kg6=Kg & !Z2
Kg5=Kg & !Z1
Kg4=Kg & !Z0
Kg1=Kg
Kh9=Kh & Z5 & Z4
Kh7=Kh & !Z4
Kh5=Kh & !Z5
Kh3=Kh & Z3
Kh2=Kh & Z2
Kh1=Kh & Z1
Kh0=Kh & Z0
ZZ=!Z13 & !Z12
S2=(Z13 & Z12)|(ZZ & Z11 & !Z10)
S1=(Z13 & !Z12)|(ZZ & Z11 & Z10)
S0=(!Z13 & Z12)|(ZZ & !Z11)
T11=(Ha11|Hb11|Hc11|Hd11|Ja11|Jb11|Jc11|Kb11|Kc11|Kd11)
T10=(Ha10|Hb10|Hc10|Hd10|Jb10|Jc10|Jd10|Ka10|Kc10|Kd10)
T9=(Ha9|Hb9|Hd9|He9|Ja9|Jb9|Jc9|Jd9|Je9|Jf9|Jg9|Kc9|Kd9|Ke9|Kf9|Kg9|Kh9)
T8=(Ha8|Hc8|Hd8|He8|Hf8|Jb8|Jc8|Je8|Jf8|Jg8|Jh8|Ka8|Kc8|Ke8|Kf8|Kg8)
T7=(Ha7|Hb7|Hd7|He7|Ja7|Jc7|Jd7|Je7|Jf7|Kc7|Kd7|Ke7|Kf7|Kg7|Kh7)
T6=(Ha6|Hc7|Hd6|He6|Hf6|Jb6|Jc6|Je6|Jf6|Jg6|Jh6|Ka6|Kc6|Ke6|Kf6|Kg6)
T5=(Ha5|Hb5|Hd5|He5|Ja5|Jc5|Jd5|Jf5|Jg5|Kc5|Kd5|Ke5|Kf5|Kg5|Kh5)
T4=(Hc4|Hd4|He4|Hf4|Jb4|Jc4|Je4|Jf4|Jg4|Jh4|Ka4|Kc4|Ke4|Kf4|Kg4)
T3=(Hb3|Hf3|Ja3|Jc3|Jd3|Je3|Jh3|Ka3|Kb3|Kc3|Ke3|Kh3)
T2=(Hc2|Hd2|He2|Hf2|Ja2|Jd2|Jf2|Jh2|Ka2|Kb2|Kd2|Kf2|Kh2)
T1=(Hb1|Hd1|He1|Hf1|JA1|Jb1|Jc1|Jd1|Jg1|Jh1|Ka1|Kb1|Kc1|Kg1|Kh1)
T0=(Hc0|Hd0|Hf0|Ja0|Jb0|Jd0|Jf0|Jh0|Ka0|Kb0|Kd0|Kf0|Kh0)
B11=(!ZZ & Z11)|ZZ & T11)
B10=(!ZZ & Z10)|(ZZ & T10)
B9=(!ZZ & Z9)|(ZZ & T9)
B8=(!ZZ & Z8)|(ZZ & T8)
B7=(!ZZ & Z7)|(ZZ & T7)
B6=(!ZZ & Z6)|(ZZ & T6)
B5=(!ZZ & Z5)|(ZZ & T5)
B4=(!ZZ & Z4)|(ZZ & T4)
B3=(!ZZ & Z3)|(ZZ & T3)
B2=(!ZZ & Z2)|(ZZ & T2)
B1=(!ZZ & Z1)|(ZZ & T1)
B0=(!ZZ & Z0)|(ZZ & T0)
PB=(Ha|Hb|Hc|Hd|He|Hf|Ja|Jb|Jc|Jd|Je|Jf|Jg|Jh|Ka|Kb|Kc|Kd|Ke|Kf|Kg|Kh)
FB=(!TB)|(ZZ & !PB)
```

TABLE 8 below describes in a simplified format how the states S0, S1, S2 (and also S0', S1', and S2') of FIG. 1 relate to 14 bits code patterns, with "X" indicating no dependency on a bit or, in other words, a so-called "don't care" relationship to a particular bit.

TABLE 8

| STATE | 14-BIT CODE PATTERN | |
|---|---|---|
| S0 | 01XXXXXXXXXXXX | 000XXXXXXXXXXX |
| S1 | 10XXXXXXXXXXXX | 0011XXXXXXXXXX |
| S2 | 11XXXXXXXXXXXX | 0010XXXXXXXXXX |

Table 9 on the following pages is a state diagram which maps each 12-bit data word to a corresponding 11-bit code word and next state value. The bit patterns of the data words are shown in hexadecimal form for simplicity with the least significant digit in the 12 bit data word represented in the top line and the two most significant digits represented in the leftmost column of Table 9 followed by an "x" as placeholder for the least significant digit. For example, the 12 bit data word "000" is the first entry in Table 9 where the first row labeled 00X intersects with the column labeled "0". The 11 bit code word for the data word "000" is the 11 bit code word is "198" and the next state value is "0". These values are shown at that intersection as "198–0". In Table 9, the 12 bit data words cover the range 000 to FFF, and the corresponding 11 bit code words range within the limits 000 to 7FF. In FIG. 9, all words are shown in hexadecimal format.

TABLE 9

State Diagram of 11-bit code word mapping for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 00X | 198-0 | 2C1-0 | 2C2-0 | 2C3-0 | 2C4-0 | 2C5-0 | 2C6-0 | 2C7-0 | 2C8-0 | 2C9-0 | 2CA-0 | 2CB-0 | 2CC-0 | 2CD-0 | 2CE-0 | 2CF-0 |
| 01X | 0D1-0 | 2D1-0 | 2D2-0 | 2D3-0 | 2D4-0 | 2D5-0 | 2D6-0 | 2D7-0 | 2D8-0 | 2D9-0 | 2DA-0 | 2DB-0 | 2DC-0 | 2DD-0 | 2DE-0 | 2DF-0 |
| 02X | 0D2-0 | 2E1-0 | 2E2-0 | 2E3-0 | 2E4-0 | 2E5-0 | 2E6-0 | 2E7-0 | 2E8-0 | 2E9-0 | 2EA-0 | 2EB-0 | 2EC-0 | 2ED-0 | 2EE-0 | 2EF-0 |
| 03X | 0D3-0 | 2F1-0 | 2F2-0 | 2F3-0 | 2F4-0 | 2F5-0 | 2F6-0 | 2F7-0 | 2F8-0 | 2F9-0 | 2FA-0 | 2FB-0 | 2FC-0 | 2FD-0 | 2FE-0 | 2FF-0 |
| 04X | 0D4-0 | 3C1-0 | 3C2-0 | 3C3-0 | 3C4-0 | 3C5-0 | 3C6-0 | 3C7-0 | 3C8-0 | 3C9-0 | 3CA-0 | 3CB-0 | 3CC-0 | 3CD-0 | 3CE-0 | 3CF-0 |
| 05X | 0D5-0 | 3D1-0 | 3D2-0 | 3D3-0 | 3D4-0 | 3D5-0 | 3D6-0 | 3D7-0 | 3D8-0 | 3D9-0 | 3DA-0 | 3DB-0 | 3DC-0 | 3DD-0 | 3DE-0 | 3DF-0 |
| 06X | 0D6-0 | 3E1-0 | 3E2-0 | 3E3-0 | 3E4-0 | 3E5-0 | 3E6-0 | 3E7-0 | 3E8-0 | 3E9-0 | 3EA-0 | 3EB-0 | 3EC-0 | 3ED-0 | 3EE-0 | 3EF-0 |
| 07X | 0D7-0 | 3F1-0 | 3F2-0 | 3F3-0 | 3F4-0 | 3F5-0 | 3F6-0 | 3F7-0 | 3F8-0 | 3F9-0 | 3FA-0 | 3FB-0 | 3FC-0 | 3FD-0 | 3FE-0 | 3FF-0 |
| 08X | 0D8-0 | 231-0 | 232-0 | 233-0 | 234-0 | 235-0 | 236-0 | 237-0 | 238-0 | 239-0 | 23A-0 | 23B-0 | 23C-0 | 23D-0 | 23E-0 | 23F-0 |
| 09X | 0D9-0 | 259-0 | 25E-0 | 093-1 | 313-0 | 095-0 | 096-1 | 097-1 | 246-0 | 099-1 | 09A-1 | 09B-1 | 09C-1 | 09D-1 | 09E-1 | 09F-1 |
| 0AX | 0DA-0 | 271-0 | 272-0 | 273-0 | 274-0 | 275-0 | 276-0 | 277-0 | 278-0 | 279-0 | 27A-0 | 27B-0 | 27C-0 | 27D-0 | 27E-0 | 27F-0 |
| 0BX | 0DB-0 | 0B1-1 | 0B2-1 | 0B3-1 | 0B4-1 | 0B5-1 | 0B6-1 | 0B7-1 | 0B8-1 | 0B9-1 | 0BA-1 | 0BB-1 | 0BC-1 | 0BD-1 | 0BE-1 | 0BF-1 |
| 0CX | 0DC-0 | 25B-0 | 24F-0 | 0C3-1 | 303-0 | 0C5-1 | 0C6-1 | 0C7-1 | 247-0 | 0C9-1 | 0CA-1 | 0CB-1 | 0CC-1 | 0CD-1 | 0CE-1 | 0CF-0 |
| 0DX | 0DD-0 | 0D1-1 | 0D2-1 | 0D3-1 | 0D4-1 | 0D5-1 | 0D6-1 | 0D7-1 | 0D8-1 | 0D9-1 | 0DA-1 | 0DB-1 | 0DC-1 | 0DD-1 | 0DE-1 | 0DF-1 |
| 0EX | 0DE-0 | 0E1-1 | 0E2-1 | 0E3-1 | 0E4-1 | 0E5-1 | 0E6-1 | 0E7-1 | 0E8-1 | 0E9-1 | 0EA-1 | 0EB-1 | 0EC-1 | 0ED-1 | 0EE-1 | 0EF-1 |
| 0FX | 0DF-0 | 0F1-1 | 0F2-1 | 0F3-1 | 0F4-1 | 0F5-1 | 0F6-1 | 0F7-1 | 0F8-1 | 0F9-1 | 0FA-1 | 0FB-1 | 0FC-1 | 0FD-1 | 0FE-1 | 0FF-1 |
| 10X | 199-0 | 0B1-0 | 0B2-0 | 0B3-0 | 0B4-0 | 0B5-0 | 0B6-0 | 0B7-0 | 158-0 | 342-0 | 159-0 | 10B-1 | 343-0 | 10D-1 | 10E-1 | 10F-1 |
| 11X | 0F1-0 | 1B1-0 | 1B2-0 | 1B3-0 | 1B4-0 | 1B5-0 | 1B6-0 | 1B7-0 | 346-0 | 119-1 | 11A-1 | 11B-1 | 11C-1 | 11D-1 | 11E-1 | 11F-1 |
| 12X | 0F2-0 | 309-0 | 30D-0 | 123-1 | 316-0 | 125-1 | 126-1 | 127-1 | 15A-0 | 129-1 | 158-1 | 12B-1 | 12C-1 | 12D-1 | 12E-1 | 12F-1 |
| 13X | 0F3-0 | 131-1 | 132-1 | 133-1 | 134-1 | 135-1 | 136-1 | 137-1 | 138-1 | 139-1 | 13A-1 | 13B-1 | 13C-1 | 13D-1 | 13E-1 | 13F-1 |
| 14X | 0F4-0 | 2B1-0 | 2B2-0 | 2B3-0 | 2B4-0 | 2B5-0 | 2B6-0 | 2B7-0 | 158-0 | 149-1 | 14A-1 | 14B-1 | 14C-1 | 14D-1 | 14E-1 | 14F-1 |
| 15X | 05F-0 | 3B1-0 | 3B2-0 | 3B3-0 | 3B4-0 | 3B5-0 | 3B6-0 | 3B7-0 | 158-1 | 159-1 | 15A-1 | 15B-1 | 15C-1 | 15D-1 | 15E-1 | 15F-1 |
| 16X | 0F6-0 | 161-1 | 162-1 | 163-1 | 164-1 | 165-1 | 166-1 | 167-1 | 168-1 | 169-1 | 16A-1 | 16B-1 | 16C-1 | 16D-1 | 16E-1 | 16F-1 |
| 17X | 0F7-0 | 171-1 | 172-1 | 173-1 | 174-1 | 175-1 | 176-1 | 177-1 | 178-1 | 179-1 | 17A-1 | 17B-1 | 17C-1 | 17D-1 | 17E-1 | 17F-1 |
| 18X | 0F8-0 | 30B-0 | 30E-0 | 183-1 | 306-0 | 185-1 | 186-1 | 187-1 | 15C-0 | 189-1 | 15D-0 | 18B-1 | 18C-1 | 18D-1 | 18E-1 | 18F-1 |
| 19X | 0F9-0 | 191-1 | 192-1 | 193-1 | 194-1 | 195-1 | 196-1 | 197-1 | 198-1 | 199-1 | 19A-1 | 19B-1 | 19C-1 | 19D-1 | 19E-1 | 19F-1 |
| 1AX | 0FA-0 | 1A1-1 | 1A2-1 | 1A3-1 | 1A4-1 | 1A5-1 | 1A6-1 | 1A7-1 | 15E-0 | 1A9-1 | 15F-0 | 1AB-1 | 1AC-1 | 1AD-1 | 1AE-1 | 1AF-1 |
| 1BX | 0FB-0 | 1B1-1 | 1B2-1 | 1B3-1 | 1B4-1 | 1B5-1 | 1B6-1 | 1B7-1 | 1B8-1 | 1B9-1 | 1BA-1 | 1BB-1 | 1BC-1 | 1BD-1 | 1BE-1 | 1BF-1 |
| 1CX | 0FC-0 | 1C1-1 | 1C2-1 | 1C3-1 | 1C4-1 | 1C5-1 | 1C6-1 | 1C7-1 | 1C8-1 | 1C9-1 | 1CA-1 | 1CB-1 | 1CC-1 | 1CD-1 | 1CE-1 | 1CF-1 |
| 1DX | 0FD-0 | 1D1-1 | 1D2-1 | 1D3-1 | 1D4-1 | 1D5-1 | 1D6-1 | 1D7-1 | 1D8-1 | 1D9-1 | 1DA-1 | 1DB-1 | 1DC-1 | 1DD-1 | 1DE-1 | 1DF-1 |
| 1EX | 0FE-0 | 1E1-1 | 1E2-1 | 1E3-1 | 1E4-1 | 1E5-1 | 1E6-1 | 1E7-1 | 1E8-1 | 1E9-1 | 1EA-1 | 1EB-1 | 1EC-1 | 1ED-1 | 1EE-1 | 1EF-1 |
| 1FX | 0FF-0 | 1F1-1 | 1F2-1 | 1F3-1 | 1F4-1 | 1F5-1 | 1F6-1 | 1F7-1 | 1F8-1 | 1F9-1 | 1FA-1 | 1FB-1 | 1FC-1 | 1FD-1 | 1FE-1 | 1FF-1 |
| 20X | 19A-0 | 1C1-0 | 1C2-0 | 1C3-0 | 1C4-0 | 1C5-0 | 1C6-0 | 1C7-0 | 1C8-0 | 1C9-0 | 1CA-0 | 1CB-0 | 1CC-0 | 1CD-0 | 1CE-0 | 1CF-0 |
| 21X | 1D1-0 | 126-0 | 123-0 | 213-1 | 183-0 | 1A3-0 | 216-1 | 217-1 | 256-0 | 219-1 | 21A-1 | 21B-1 | 21C-1 | 21D-1 | 21E-1 | 21F-1 |
| 22X | 1D2-0 | 1E1-0 | 1E2-0 | 1E3-0 | 1E4-0 | 1E5-0 | 1E6-0 | 1E7-0 | 1E8-0 | 1E9-0 | 1EA-0 | 1EB-0 | 1EC-0 | 1ED-0 | 1EE-0 | 1EF-0 |
| 23X | 1D3-0 | 231-1 | 232-1 | 233-1 | 234-1 | 235-1 | 236-1 | 237-1 | 238-1 | 239-1 | 23A-1 | 23B-1 | 23C-1 | 23D-1 | 23E-1 | 23F-1 |
| 24X | 1D4-0 | 125-0 | 129-0 | 243-1 | 186-0 | 1A6-0 | 246-1 | 247-1 | 257-0 | 249-1 | 24A-1 | 24B-1 | 24C-1 | 24D-1 | 24E-1 | 24F-1 |
| 25X | 1D5-0 | 127-0 | 252-1 | 253-1 | 187-0 | 1A7-0 | 256-1 | 257-1 | 258-1 | 259-1 | 25A-1 | 25B-1 | 25C-1 | 25D-1 | 25E-1 | 25F-1 |
| 26X | 1D6-0 | 261-1 | 262-1 | 263-1 | 264-1 | 265-1 | 266-1 | 267-1 | 268-1 | 269-1 | 26A-1 | 26B-1 | 26C-1 | 26D-1 | 26E-1 | 26F-1 |
| 27X | 1D7-0 | 271-1 | 272-1 | 273-1 | 274-1 | 275-1 | 276-1 | 277-1 | 278-1 | 279-1 | 27A-1 | 27B-1 | 27C-1 | 27D-1 | 27E-1 | 27F-1 |
| 28X | 1D8-0 | 331-1 | 332-1 | 333-1 | 334-1 | 335-1 | 336-1 | 337-1 | 338-1 | 339-1 | 33A-1 | 33B-1 | 33C-1 | 33D-1 | 33E-1 | 33F-1 |
| 29X | 1D9-0 | 291-1 | 292-1 | 293-1 | 294-1 | 295-1 | 296-1 | 297-1 | 298-1 | 299-1 | 29A-1 | 29B-1 | 29C-1 | 29D-1 | 29E-1 | 29F-1 |
| 2AX | 1DA-0 | 371-1 | 372-1 | 373-1 | 374-1 | 375-1 | 376-1 | 377-1 | 378-1 | 379-1 | 37A-1 | 37B-1 | 37C-1 | 37D-1 | 37E-1 | 37F-1 |
| 2BX | 1DB-0 | 2B1-1 | 2B2-1 | 2B3-1 | 2B4-1 | 2B5-1 | 2B6-1 | 2B7-1 | 2B8-1 | 2B9-1 | 2BA-1 | 2BB-1 | 2BC-1 | 2BD-1 | 2BE-1 | 2BF-1 |
| 2CX | 1DC-0 | 2C1-1 | 2C2-1 | 2C3-1 | 2C4-1 | 2C5-1 | 2C6-1 | 2C7-1 | 2C8-1 | 2C9-1 | 2CA-1 | 2CB-1 | 2CC-1 | 2CD-1 | 2CE-1 | 2CF-1 |
| 2DX | 1DD-0 | 2D1-1 | 2D2-1 | 2D3-1 | 2D4-1 | 2D5-1 | 2D6-1 | 2D7-1 | 2D8-1 | 2D9-1 | 2DA-1 | 2DB-1 | 2DC-1 | 2DD-1 | 2DE-1 | 2DF-1 |
| 2EX | 1DE-0 | 2E1-1 | 2E2-1 | 2E3-1 | 2E4-1 | 2E5-1 | 2E6-1 | 2E7-1 | 2E8-1 | 2E9-1 | 2EA-1 | 2EB-1 | 2EC-1 | 2ED-1 | 2EE-1 | 2EF-1 |

TABLE 9-continued

State Diagram of 11-bit code word mapping for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 2FX | 1DF-0 | 2F1-1 | 2F2-1 | 2F3-1 | 2F4-1 | 2F5-1 | 2F6-1 | 2F7-1 | 2F8-1 | 2F9-1 | 2FA-1 | 2FB-1 | 2FC-1 | 2FD-1 | 2FE-1 | 2FF-1 |
| 30X | 19B-0 | 32C-0 | 329-0 | 303-1 | 138-0 | 139-0 | 306-1 | 307-1 | 358-0 | 309-1 | 359-0 | 30B-1 | 30C-1 | 30D-1 | 30E-1 | 30F-1 |
| 31X | 1F1-0 | 326-0 | 312-1 | 313-1 | 13A-0 | 13B-0 | 316-1 | 317-1 | 318-1 | 319-1 | 31A-1 | 31B-1 | 31C-1 | 31D-1 | 31E-1 | 31F-1 |
| 32X | 1F2-0 | 321-1 | 32B-0 | 323-1 | 324-1 | 325-1 | 326-1 | 327-1 | 35A-0 | 329-1 | 35B-0 | 32B-1 | 32C-1 | 32D-1 | 32E-1 | 32F-1 |
| 33X | 1F3-0 | 331-1 | 332-1 | 333-1 | 334-1 | 335-1 | 336-1 | 337-1 | 338-1 | 339-1 | 33A-1 | 33B-1 | 33C-1 | 33D-1 | 33E-1 | 33F-1 |
| 34X | 1F4-0 | 325-0 | 342-1 | 343-1 | 13C-0 | 13D-0 | 346-1 | 347-1 | 348-1 | 349-1 | 34A-1 | 34B-1 | 34C-1 | 34D-1 | 34E-1 | 34F-1 |
| 35X | 1F5-0 | 327-0 | 352-1 | 353-1 | 13E-0 | 13F-0 | 356-1 | 357-1 | 358-1 | 359-1 | 35A-1 | 35B-1 | 35C-1 | 35D-1 | 35E-1 | 35F-1 |
| 36X | 1F6-0 | 361-1 | 362-1 | 363-1 | 364-1 | 365-1 | 366-1 | 367-1 | 368-1 | 369-1 | 36A-1 | 36B-1 | 36C-1 | 36D-1 | 36E-1 | 36F-1 |
| 37X | 1F7-0 | 371-1 | 372-1 | 373-1 | 374-1 | 375-1 | 376-1 | 377-1 | 378-1 | 379-1 | 37A-1 | 37B-1 | 37C-1 | 37D-1 | 37E-1 | 37F-1 |
| 38X | 1F8-0 | 381-1 | 32D-0 | 383-1 | 384-1 | 385-1 | 386-1 | 387-1 | 35C-0 | 389-1 | 35D-0 | 38B-1 | 38C-1 | 38D-1 | 38E-1 | 38F-1 |
| 39X | 1F9-0 | 391-1 | 392-1 | 393-1 | 394-1 | 395-1 | 396-1 | 397-1 | 398-1 | 399-1 | 39A-1 | 39B-1 | 39C-1 | 39D-1 | 39E-1 | 39F-1 |
| 3AX | 1FA-0 | 3A1-1 | 32F-0 | 3A3-1 | 3A4-1 | 3A5-1 | 3A6-1 | 3A7-1 | 3A8-1 | 3A9-1 | 3AA-1 | 3AB-1 | 3AC-1 | 3AD-1 | 3AE-1 | 3AF-1 |
| 3BX | 1FB-0 | 3B1-1 | 3B2-1 | 3B3-1 | 3B4-1 | 3B5-1 | 3B6-1 | 3B7-1 | 3B8-1 | 3B9-1 | 3BA-1 | 3BB-1 | 3BC-1 | 3BD-1 | 3BE-1 | 3BF-1 |
| 3CX | 1FC-0 | 3C1-1 | 3C2-1 | 3C3-1 | 3C4-1 | 3C5-1 | 3C6-1 | 3C7-1 | 3C8-1 | 3C9-1 | 3CA-1 | 3CB-1 | 3CC-1 | 3CD-1 | 3CE-1 | 3CF-1 |
| 3DX | 1FD-0 | 3D1-1 | 3D2-1 | 3D3-1 | 3D4-1 | 3D5-1 | 3D6-1 | 3D7-1 | 3D8-1 | 3D9-1 | 3DA-1 | 3DB-1 | 3DC-1 | 3DD-1 | 3DE-1 | 3DF-1 |
| 3EX | 1FE-0 | 3E1-1 | 3E2-1 | 3E3-1 | 3E4-1 | 3E5-1 | 3E6-1 | 3E7-1 | 3E8-1 | 3E9-1 | 3EA-1 | 3EB-1 | 3EC-1 | 3ED-1 | 3EE-1 | 3EF-1 |
| 3FX | 1FF-0 | 3F1-1 | 3F2-1 | 3F3-1 | 3F4-1 | 3F5-1 | 3F6-1 | 3F7-1 | 3F8-1 | 3F9-1 | 3FA-1 | 3FB-1 | 3FC-1 | 3FD-1 | 3FE-1 | 3FF-1 |
| 40X | 19C-0 | 131-0 | 132-0 | 133-0 | 134-0 | 135-0 | 136-0 | 137-0 | 0BA-0 | 352-0 | 0B9-0 | 40B-1 | 353-0 | 40D-1 | 40E-1 | 40F-1 |
| 41X | 261-0 | 161-0 | 162-0 | 163-0 | 164-0 | 165-0 | 166-0 | 167-0 | 356-0 | 419-1 | 41A-1 | 41B-1 | 41C-1 | 41D-1 | 41E-1 | 41F-1 |
| 42X | 262-0 | 319-0 | 31D-0 | 423-1 | 317-0 | 425-1 | 426-1 | 427-1 | 0BA-0 | 429-1 | 0BB-0 | 42B-1 | 42C-1 | 42D-1 | 42E-1 | 42F-1 |
| 43X | 263-0 | 431-1 | 432-1 | 433-1 | 434-1 | 435-1 | 436-1 | 437-1 | 438-1 | 439-1 | 43A-1 | 43B-1 | 43C-1 | 43D-1 | 43E-1 | 43F-1 |
| 44X | 264-0 | 171-0 | 172-0 | 173-0 | 174-0 | 175-0 | 176-0 | 177-0 | 357-0 | 449-1 | 44A-1 | 44B-1 | 44C-1 | 44D-1 | 44E-1 | 44F-1 |
| 45X | 265-0 | 191-0 | 192-0 | 193-0 | 194-0 | 195-0 | 196-0 | 197-0 | 458-1 | 459-1 | 45A-1 | 45B-1 | 45C-1 | 45D-1 | 45E-1 | 45F-1 |
| 46X | 266-0 | 461-1 | 462-1 | 463-1 | 464-1 | 465-1 | 466-1 | 467-1 | 468-1 | 469-1 | 46A-1 | 46B-1 | 46C-1 | 46D-1 | 46E-1 | 46F-1 |
| 47X | 267-0 | 471-1 | 472-1 | 473-1 | 474-1 | 475-1 | 476-1 | 477-1 | 478-1 | 479-1 | 47A-1 | 47B-1 | 47C-1 | 47D-1 | 47E-1 | 47F-1 |
| 48X | 268-0 | 31B-0 | 31E-0 | 483-1 | 307-0 | 485-1 | 486-1 | 487-1 | 0BC-0 | 489-1 | 0BD-0 | 48B-1 | 48C-1 | 48D-1 | 48E-1 | 48F-1 |
| 49X | 269-0 | 491-1 | 492-1 | 493-1 | 494-1 | 495-1 | 496-1 | 497-1 | 498-1 | 499-1 | 49A-1 | 49B-1 | 49C-1 | 49D-1 | 49E-1 | 49F-1 |
| 4AX | 26A-0 | 4A1-1 | 31F-0 | 4A3-1 | 4A4-1 | 4A5-1 | 4A6-1 | 4A7-1 | 0BE-0 | 4A9-1 | 0BF-0 | 4AA-1 | RAC-1 | 4AD-1 | 4AE-1 | 4AF-1 |
| 4BX | 26B-0 | 4B1-1 | 4B2-1 | 4B3-1 | 4B4-1 | 4B5-1 | 4B6-1 | 4B7-1 | 4B8-1 | 4B9-1 | 4BA-1 | 4BB-1 | 4BC-1 | 4BD-1 | 4BE-1 | 4BF-1 |
| 4CX | 26C-0 | 4C1-1 | 4C2-1 | 4C3-1 | 4C4-1 | 4C5-1 | 4C6-1 | 4C7-1 | 4C8-1 | 4C9-1 | 4CA-1 | 4CB-1 | 4CC-1 | 4CD-1 | 4CE-1 | 4CF-1 |
| 4DX | 26D-0 | 4D1-1 | 4D2-1 | 4D3-1 | 4D4-1 | 4D5-1 | 4D6-1 | 4D7-1 | 4D8-1 | 4D9-1 | 4DA-1 | 4DB-1 | 4DC-1 | 4DD-1 | 4DE-1 | 4DF-1 |
| 4EX | 26E-0 | 4E1-1 | 4E2-1 | 4E3-1 | 4E4-1 | 4E5-1 | 4E6-1 | 4E7-1 | 4E8-1 | 4E9-1 | 4EA-1 | 4EB-1 | 4EC-1 | 4ED-1 | 4EE-1 | 4EF-1 |
| 4FX | 26F-0 | 4F1-1 | 4F2-1 | 4F3-1 | 4F4-1 | 4F5-1 | 4F6-1 | 4F7-1 | 4F8-1 | 4F9-1 | 4FA-1 | 4FB-1 | 4FC-1 | 4FD-1 | 4FE-1 | 4FF-1 |
| 50X | 19D-0 | 119-0 | 11A-0 | 11B-0 | 11C-0 | 11D-0 | 11E-0 | 11F-0 | 1B8-0 | 509-1 | 1B9-0 | 50B-1 | 50C-1 | 50D-1 | 50E-1 | 50F-1 |
| 51X | 291-0 | 149-0 | 14A-0 | 14B-0 | 14C-0 | 14D-0 | 14E-0 | 14F-0 | 518-1 | 519-1 | 51A-1 | 51B-1 | 51C-1 | 51D-1 | 51E-1 | 51F-1 |
| 52X | 292-0 | 521-1 | 34D-0 | 523-1 | 524-1 | 525-1 | 526-1 | 527-1 | 1BA-0 | 529-1 | 1BB-0 | 52B-1 | 52C-1 | 52D-1 | 52E-1 | 52F-1 |
| 53X | 293-0 | 531-1 | 532-1 | 533-1 | 534-1 | 535-1 | 536-1 | 537-1 | 538-1 | 539-1 | 53A-1 | 53B-1 | 53C-1 | 53D-1 | 53E-1 | 53F-1 |
| 54X | 294-0 | 219-0 | 21A-0 | 21B-0 | 21C-0 | 21D-0 | 21E-0 | 21F-0 | 548-1 | 549-1 | 54A-1 | 54B-1 | 54C-1 | 54D-1 | 54E-1 | 54F-1 |
| 55X | 295-0 | 249-0 | 24A-0 | 24B-0 | 24C-0 | 24D-0 | 24E-0 | 24F-0 | 558-1 | 559-1 | 55A-1 | 55B-1 | 55C-1 | 55D-1 | 55E-1 | 55F-1 |
| 56X | 296-0 | 561-1 | 562-1 | 563-1 | 564-1 | 565-1 | 566-1 | 567-1 | 568-1 | 569-1 | 56A-1 | 56B-1 | 56C-1 | 56D-1 | 56E-1 | 56F-1 |
| 57X | 297-0 | 571-1 | 572-1 | 573-1 | 574-1 | 575-1 | 576-1 | 577-1 | 578-1 | 579-1 | 57A-1 | 57B-1 | 57C-1 | 57D-1 | 57E-1 | 57F-1 |
| 58X | 298-0 | 581-1 | 34E-0 | 583-1 | 584-1 | 585-1 | 586-1 | 587-1 | 598-1 | 589-1 | 1BD-0 | 58B-1 | 58C-1 | 58D-1 | 58E-1 | 58F-1 |
| 59X | 299-0 | 591-1 | 592-1 | 593-1 | 594-1 | 595-1 | 596-1 | 597-1 | 598-1 | 599-1 | 59A-1 | 59B-1 | 59C-1 | 59D-1 | 59E-1 | 59F-1 |
| 5AX | 29A-0 | 5A1-1 | 34F-0 | 5A3-1 | 5A4-1 | 5A5-1 | 5A6-1 | 5A7-1 | 1BE-0 | 5A9-1 | 1BF-0 | 5AB-1 | 5AC-1 | 5AD-1 | 5AE-1 | 5AF-1 |
| 5BX | 29B-0 | 5B1-1 | 5B2-1 | 5B3-1 | 5B4-1 | 5B5-1 | 5B6-1 | 5B7-1 | 5B8-1 | 5B9-1 | 5BA-1 | 5BB-1 | 5BC-1 | 5BD-1 | 5BE-1 | 5BF-1 |
| 5CX | 29C-0 | 5C1-1 | 5C2-1 | 5C3-1 | 5C4-1 | 5C5-1 | 5C6-1 | 5C7-1 | 5C8-1 | 5C9-1 | 5CA-1 | 5CB-1 | 5CC-1 | 5CD-1 | 5CE-1 | 5CF-1 |
| 5DX | 29D-0 | 5D1-1 | 5D2-1 | 5D3-1 | 5D4-1 | 5D5-1 | 5D6-1 | 5D7-1 | 5D8-1 | 5D9-1 | 5DA-1 | 5DB-1 | 5DC-1 | 5DD-1 | 5DE-1 | 5DF-1 |
| 5EX | 29E-0 | 5E1-1 | 5E2-1 | 5E3-1 | 5E4-1 | 5E5-1 | 5E6-1 | 5E7-1 | 5E8-1 | 5E9-1 | 5EA-1 | 5EB-1 | 5EC-1 | 5ED-1 | 5EE-1 | 5EF-1 |

TABLE 9-continued

State Diagram of 11-bit code word mapping for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 5FX | 29F-0 | 5F1-1 | 5F2-1 | 5F3-1 | 5F4-1 | 5F5-1 | 5F6-1 | 5F7-1 | 5F8-1 | 5F9-1 | 5FA-1 | 5FB-1 | 5FC-1 | 5FD-1 | 5FE-1 | 5FF-1 |
| 60X | 19E-0 | 38C-0 | 389-0 | 603-1 | 168-0 | 169-0 | 606-1 | 607-1 | 2b8-0 | 609-1 | 2B9-0 | 60B-1 | 60C-1 | 60D-1 | 60E-1 | 60F-1 |
| 61X | 361-0 | 386-0 | 612-1 | 613-1 | 16A-0 | 16B-0 | 616-1 | 617-1 | 618-1 | 619-1 | 61A-1 | 61B-1 | 61C-1 | 61D-1 | 61E-1 | 61F-1 |
| 62X | 362-0 | 621-1 | 38B-0 | 623-1 | 624-1 | 625-1 | 626-1 | 627-1 | 2B1-0 | 629-1 | 2BB-0 | 62B-1 | 62C-1 | 62D-1 | 62E-1 | 62F-1 |
| 63X | 363-0 | 631-1 | 632-1 | 633-1 | 634-1 | 635-1 | 636-1 | 637-1 | 638-1 | 639-1 | 63A-1 | 63B-1 | 63C-1 | 63D-1 | 63E-1 | 63F-1 |
| 64X | 364-0 | 385-0 | 642-1 | 643-1 | 16C-0 | 16D-0 | 646-1 | 647-1 | 648-1 | 649-1 | 64A-1 | 64B-1 | 64C-1 | 64D-1 | 64E-1 | 64F-1 |
| 65X | 365-0 | 387-0 | 652-1 | 653-1 | 16E-0 | 16F-0 | 656-1 | 657-1 | 658-1 | 659-1 | 65A-1 | 65B-1 | 65C-1 | 65D-1 | 65E-1 | 65F-1 |
| 66X | 366-0 | 661-1 | 662-1 | 663-1 | 664-1 | 665-1 | 666-1 | 667-1 | 668-1 | 669-1 | 66A-1 | 66B-1 | 66C-1 | 66D-1 | 66E-1 | 66F-1 |
| 67X | 367-0 | 671-1 | 672-1 | 673-1 | 674-1 | 675-1 | 676-1 | 677-1 | 678-1 | 679-1 | 67A-1 | 67B-1 | 67C-1 | 67D-1 | 67E-1 | 67F-1 |
| 68X | 368-0 | 681-1 | 38D-0 | 683-1 | 684-1 | 685-1 | 686-1 | 687-1 | 2BC-0 | 689-1 | 2BD-0 | 68B-1 | 68C-1 | 68D-1 | 68E-1 | 68F-1 |
| 69X | 369-0 | 691-1 | 692-1 | 693-1 | 694-1 | 695-1 | 696-1 | 697-1 | 698-1 | 699-1 | 69A-1 | 69B-1 | 69C-1 | 69D-1 | 69E-1 | 69F-1 |
| 6AX | 36A-0 | 6A1-1 | 38F-0 | 6A3-1 | 6A4-1 | 6A5-1 | 6A6-1 | 6A7-1 | 2BE-0 | 6A9-1 | 2BF-0 | 6AB-1 | 6AC-1 | 6AD-1 | 6AE-1 | 6AF-1 |
| 6BX | 36B-0 | 6B1-1 | 6B2-1 | 6B3-1 | 6B4-1 | 6B5-1 | 6B6-1 | 6B7-1 | 6B8-1 | 6B9-1 | 6BA-1 | 6BB-1 | 6BC-1 | 6BD-1 | 6BE-1 | 6BF-1 |
| 6CX | 36C-0 | 6C1-1 | 6C2-1 | 6C3-1 | 6C4-1 | 6C5-1 | 6C6-1 | 6C7-1 | 6C8-1 | 6C9-1 | 6CA-1 | 6CB-1 | 6CC-1 | 6CD-1 | 6CE-1 | 6CF-1 |
| 6DX | 36D-0 | 6D1-1 | 6D2-1 | 6D3-1 | 6D4-1 | 6D5-1 | 6D6-1 | 6D7-1 | 6D8-1 | 6D9-1 | 6DA-1 | 6DB-1 | 6DC-1 | 6DD-1 | 6DE-1 | 6DF-1 |
| 6EX | 36E-0 | 6E1-1 | 6E2-1 | 6E3-1 | 6E4-1 | 6E5-1 | 6E6-1 | 6E7-1 | 6E8-1 | 6E9-1 | 6EA-1 | 6EB-1 | 6EC-1 | 6ED-1 | 6EE-1 | 6EF-1 |
| 6FX | 36F-0 | 6F1-1 | 6F2-1 | 6F3-1 | 6F4-1 | 6F5-1 | 6F6-1 | 6F7-1 | 6F8-1 | 6F9-1 | 6FA-1 | 6FB-1 | 6FC-1 | 6FD-1 | 6FE-1 | 6FF-1 |
| 70X | 19F-0 | 3AC-0 | 3A9-0 | 703-1 | 178-0 | 179-0 | 706-1 | 707-1 | 3B8-0 | 709-1 | 3B9-0 | 70B-1 | 70C-1 | 70D-1 | 70E-1 | 70F-1 |
| 71X | 391-0 | 3A6-0 | 712-1 | 713-1 | 17A-0 | 17B-0 | 716-1 | 717-1 | 718-1 | 719-1 | 71A-1 | 71B-1 | 71C-1 | 71D-1 | 71E-1 | 71F-1 |
| 72X | 392-0 | 721-1 | 3AB-0 | 723-1 | 724-1 | 725-1 | 726-1 | 727-1 | 3BA-0 | 729-1 | 3BB-0 | 72B-1 | 72C-1 | 72D-1 | 72E-1 | 72F-1 |
| 73X | 393-0 | 731-1 | 732-1 | 733-1 | 734-1 | 735-1 | 736-1 | 737-1 | 738-1 | 739-1 | 73A-1 | 73B-1 | 73C-1 | 73D-1 | 73E-1 | 73F-1 |
| 74X | 394-0 | 3A5-0 | 742-1 | 743-1 | 17C-0 | 17D-0 | 746-1 | 747-1 | 748-1 | 749-1 | 74A-1 | 74B-1 | 74C-1 | 74D-1 | 74E-1 | 74F-1 |
| 75X | 395-0 | 3A7-0 | 752-1 | 753-1 | 17E-0 | 17F-0 | 756-1 | 757-1 | 758-1 | 759-1 | 75A-1 | 75B-1 | 75C-1 | 75D-1 | 75E-1 | 75F-1 |
| 76X | 396-0 | 761-1 | 762-1 | 763-1 | 764-1 | 765-1 | 766-1 | 767-1 | 768-1 | 769-1 | 76A-1 | 76B-1 | 76C-1 | 76D-1 | 76E-1 | 76F-1 |
| 77X | 397-0 | 771-1 | 772-1 | 773-1 | 774-1 | 775-1 | 776-1 | 777-1 | 778-1 | 779-1 | 77A-1 | 77B-1 | 77C-1 | 77D-1 | 77E-1 | 77F-1 |
| 78X | 398-0 | 781-1 | 3AD-0 | 783-1 | 784-1 | 785-1 | 786-1 | 787-1 | 3BC-0 | 789-1 | 3BD-0 | 78B-1 | 78C-1 | 78D-1 | 78E-1 | 78F-1 |
| 79X | 399-0 | 791-1 | 792-1 | 793-1 | 794-1 | 795-1 | 796-1 | 797-1 | 798-1 | 799-1 | 79A-1 | 79B-1 | 79C-1 | 79D-1 | 79E-1 | 79F-1 |
| 7AX | 39A-0 | 7A1-1 | 3AF-0 | 7A3-1 | 7A4-1 | 7A5-1 | 7A6-1 | 7A7-1 | 3BE-0 | 7A9-1 | 3BF-0 | 7AB-1 | 7AC-1 | 7AD-1 | 7AE-1 | 7AF-1 |
| 7BX | 39B-0 | 7B1-1 | 7B2-1 | 7B3-1 | 7B4-1 | 7B5-1 | 7B6-1 | 7B7-1 | 7B8-1 | 7B9-1 | 7BA-1 | 7BB-1 | 7BC-1 | 7BD-1 | 7BE-1 | 7BF-1 |
| 7CX | 39C-0 | 7C1-1 | 7C2-1 | 7C3-1 | 7C4-1 | 7C5-1 | 7C6-1 | 7C7-1 | 7C8-1 | 7C9-1 | 7CA-1 | 7CB-1 | 7CC-1 | 7CD-1 | 7CE-1 | 7CF-1 |
| 7DX | 39D-0 | 7D1-1 | 7D2-1 | 7D3-1 | 7D4-1 | 7D5-1 | 7D6-1 | 7D7-1 | 7D8-1 | 7D9-1 | 7DA-1 | 7DB-1 | 7DC-1 | 7DD-1 | 7DE-1 | 7DF-1 |
| 7EX | 39E-0 | 7E1-1 | 7E2-1 | 7E3-1 | 7E4-1 | 7E5-1 | 7E6-1 | 7E7-1 | 7E8-1 | 7E9-1 | 7EA-1 | 7EB-1 | 7EC-1 | 7ED-1 | 7EE-1 | 7EF-1 |
| 7FX | 39F-0 | 7F1-1 | 7F2-1 | 7F3-1 | 7F4-1 | 7F5-1 | 7F6-1 | 7F7-1 | 7F8-1 | 7F9-1 | 7FA-1 | 7FB-1 | 7FC-1 | 7FD-1 | 7FE-1 | 7FF-1 |
| 80X | 598-0 | 6C1-0 | 6C2-0 | 6C3-0 | 6C4-0 | 6C5-0 | 6C6-0 | 6C7-0 | 6C8-0 | 6C9-0 | 6CA-0 | 6CB-0 | 6CC-0 | 6CD-0 | 6CE-0 | 6CF-0 |
| 81X | 4D1-0 | 6D1-0 | 6D2-0 | 6D3-0 | 6D4-0 | 6D5-0 | 6D6-0 | 6D7-0 | 6D8-0 | 6D9-0 | 6DA-0 | 6DB-0 | 6DC-0 | 6DD-0 | 6DE-0 | 6DF-0 |
| 82X | 4D2-0 | 6E1-0 | 6E2-0 | 6E3-0 | 6E4-0 | 6E5-0 | 6E6-0 | 6E7-0 | 6E8-0 | 6E9-0 | 6EA-0 | 6EB-0 | 6EC-0 | 6ED-0 | 6EE-0 | 6EF-0 |
| 83X | 4D3-0 | 6F1-0 | 6F2-0 | 6F3-0 | 6F4-0 | 6F5-0 | 6F6-0 | 6F7-0 | 6F8-0 | 6F9-0 | 6FA-0 | 6FB-0 | 6FC-0 | 6FD-0 | 6FE-0 | 6FF-0 |
| 84X | 4D4-0 | 7C1-0 | 7C2-0 | 7C3-0 | 7C4-0 | 7C5-0 | 7C6-0 | 7C7-0 | 7C8-0 | 7C9-0 | 7CA-0 | 7CB-0 | 7CC-0 | 7CD-0 | 7CE-0 | 7CF-0 |
| 85X | 4D5-0 | 7D1-0 | 7D2-0 | 7D3-0 | 7D4-0 | 7D5-0 | 7D6-0 | 7D7-0 | 7D8-0 | 7D9-0 | 7DA-0 | 7DB-0 | 7DC-0 | 7DD-0 | 7DE-0 | 7DF-0 |
| 86X | 4D6-0 | 7E1-0 | 7E2-0 | 7E3-0 | 7E4-0 | 7E5-0 | 7E6-0 | 7E7-0 | 7E8-0 | 7E9-0 | 7EA-0 | 7EB-0 | 7EC-0 | 7ED-0 | 7EE-0 | 7EF-0 |
| 87X | 4D7-0 | 7F1-0 | 7F2-0 | 7F3-0 | 7F4-0 | 7F5-0 | 7F6-0 | 7F7-0 | 7F8-0 | 7F9-0 | 7FA-0 | 7FB-0 | 7FC-0 | 7FD-0 | 7FE-0 | 7FF-0 |
| 88X | 4D8-0 | 631-0 | 632-0 | 633-0 | 634-0 | 635-0 | 636-0 | 637-0 | 638-0 | 639-0 | 63A-0 | 63B-0 | 63C-0 | 63D-0 | 63E-0 | 63F-0 |
| 89X | 4D9-0 | 659-0 | 65E-0 | 093-2 | 713-0 | 095-2 | 096-2 | 097-2 | 646-0 | 099-2 | 09A-2 | 09B-2 | 09C-2 | 09D-2 | 09E-2 | 09F-2 |
| 8AX | 4DA-0 | 671-0 | 672-0 | 673-0 | 674-0 | 675-0 | 0B6-0 | 677-0 | 678-0 | 679-0 | 67A-0 | 67B-0 | 67C-0 | 67D-0 | 67E-0 | 67F-0 |
| 8BX | 4DB-0 | 0B1-0 | 0B2-0 | 0B3-0 | 0B4-0 | 0B5-0 | 0B6-0 | 0B7-0 | 0B8-0 | 0B9-0 | 0BA-0 | 0BB-0 | 0BC-0 | 0BD-0 | 0BE-0 | 0BF-0 |
| 8CX | 4DC-0 | 65B-0 | 65F-0 | 0C3-2 | 703-0 | 0C5-2 | 0C6-2 | 0C7-2 | 647-0 | 0C9-2 | 0CA-2 | 0CB-2 | 0CC-2 | 0CD-2 | 0CE-2 | 0CF-2 |
| 8DX | 4DD-0 | 0D1-2 | 0D2-2 | 0D3-2 | 0D4-2 | 0D5-2 | 0D6-2 | 0D7-2 | 0D8-2 | 0D9-2 | 0DA-2 | 0DB-2 | 0DC-2 | 0DD-2 | 0DE-2 | 0DF-2 |
| 8EX | 4DE-0 | 0E1-2 | 0E2-2 | 0E3-2 | 0E4-2 | 0E5-2 | 0E6-2 | 0E7-2 | 0E8-2 | 0E9-2 | 0EA-2 | 0EB-2 | 0EC-2 | 0ED-2 | 0EE-2 | 0EF-2 |

TABLE 9-continued

State Diagram of 11-bit code word mapping for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 8FX | 4DF-0 | 0F1-2 | 0F2-2 | 0F3-2 | 0F4-2 | 0F5-2 | 0F6-2 | 0F7-2 | 0F8-2 | 0F9-2 | 0FA-2 | 0FB-2 | 0FC-2 | 0FD-2 | 0FE-2 | 0FF-2 |
| 90X | 599-0 | 4B1-2 | 4B2-0 | 4B3-0 | 4B4-0 | 4B5-0 | 4B6-0 | 4B7-0 | 558-0 | 742-0 | 559-0 | 10B-2 | 743-0 | 10D-2 | 10E-2 | 10F-2 |
| 91X | 4F1-0 | 5B1-0 | 5B2-0 | 5B3-0 | 5B4-0 | 5B5-0 | 5B6-0 | 5B7-0 | 746-0 | 119-2 | 11A-2 | 11B-2 | 11C-2 | 11D-2 | 11E-2 | 11F-2 |
| 92X | 4F2-0 | 709-0 | 70D-0 | 123-2 | 716-0 | 125-2 | 126-2 | 127-2 | 55A-0 | 129-2 | 55B-0 | 12B-2 | 12C-2 | 12D-2 | 12E-2 | 12F-2 |
| 93X | 4F3-0 | 131-2 | 132-2 | 133-2 | 134-2 | 135-2 | 136-2 | 137-2 | 138-2 | 139-2 | 13A-2 | 13B-2 | 13C-2 | 13D-2 | 13E-2 | 13F-2 |
| 94X | 4F4-0 | 6B1-0 | 6B2-0 | 6B3-0 | 6B4-0 | 6B5-0 | 6B6-0 | 6B7-0 | 747-0 | 149-2 | 14A-2 | 14B-2 | 14C-2 | 14D-2 | 14E-2 | 14F-2 |
| 95X | 4F5-0 | 7B1-0 | 7B2-0 | 7B3-0 | 7B4-0 | 7B5-0 | 7B6-0 | 7B7-0 | 158-2 | 159-2 | 15A-2 | 15B-2 | 15C-2 | 15D-2 | 15E-2 | 15F-2 |
| 96X | 4F6-0 | 161-2 | 162-2 | 163-2 | 164-2 | 165-2 | 166-2 | 167-2 | 168-2 | 169-2 | 16A-2 | 16B-2 | 16C-2 | 16D-2 | 16E-2 | 16F-2 |
| 97X | 4F7-0 | 171-2 | 172-2 | 173-2 | 174-2 | 175-2 | 176-2 | 177-2 | 178-2 | 179-2 | 17A-2 | 17B-2 | 17C-2 | 17D-2 | 17E-2 | 17F-2 |
| 98X | 4F8-0 | 70B-0 | 70E-0 | 183-2 | 70C-0 | 185-2 | 186-2 | 187-2 | 55C-0 | 189-2 | 55D-0 | 18B-2 | 18C-2 | 18D-2 | 18E-1 | 18F-2 |
| 99X | 4F9-0 | 191-2 | 192-2 | 193-2 | 194-2 | 195-2 | 196-2 | 197-2 | 198-2 | 199-2 | 19A-2 | 19B-2 | 19C-2 | 19D-2 | 19E-2 | 19F-2 |
| 9AX | 4FA-0 | 1A1-2 | 70F-0 | 1A3-2 | 1A4-2 | 1A5-2 | 1A6-2 | 1A7-2 | 55E-0 | 1A9-2 | 55F-0 | 1AB-2 | 1AC-2 | 1AD-2 | 1AE-2 | 1AF-2 |
| 9BX | 4FB-0 | 1B1-2 | 1B2-2 | 1B3-2 | 1B4-2 | 1B5-2 | 1B6-2 | 1B7-2 | 1B8-2 | 1B9-2 | 1BA-2 | 1BB-2 | 1BC-2 | 1BD-2 | 1BE-2 | 1BF-2 |
| 9CX | 4FC-0 | 1C1-2 | 1C2-2 | 1C3-2 | 1C4-2 | 1C5-2 | 1C6-2 | 1C7-2 | 1C8-2 | 1C9-2 | 1CA-2 | 1CB-2 | 1CC-2 | 1CD-2 | 1CE-2 | 1CF-2 |
| 9DX | 4FD-0 | 1D1-2 | 1D2-2 | 1D3-2 | 1D4-2 | 1D5-2 | 1D6-2 | 1D7-2 | 1D8-2 | 1D9-2 | 1DA-2 | 1DB-2 | 1DC-2 | 1DD-2 | 1DE-2 | 1DF-2 |
| 9EX | 4FE-0 | 1E1-2 | 1E2-2 | 1E3-2 | 1E4-2 | 1E5-2 | 1E6-2 | 1E7-2 | 1E8-2 | 1E9-2 | 1EA-2 | 1EB-2 | 1EC-2 | 1ED-2 | 1EE-2 | 1EF-2 |
| 9FX | 4FF-0 | 1F1-2 | 1F2-2 | 1F3-2 | 1F4-2 | 1F5-2 | 1F6-2 | 1F7-2 | 1F8-2 | 1F9-2 | 1FA-2 | 1FB-2 | 1FC-2 | 1FD-2 | 1FE-2 | 1FF-2 |
| A0X | 59A-0 | 5C1-2 | 5C2-2 | 5C3-2 | 5C4-2 | 5C5-2 | 5C6-2 | 5C7-2 | 5C8-2 | 5C9-2 | 5CA-2 | 5CB-2 | 5CC-2 | 5CD-2 | 5CE-2 | 5CF-2 |
| A1X | 5D1-0 | 526-0 | 523-0 | 213-2 | 583-2 | 5A3-0 | 216-2 | 217-2 | 656-0 | 219-2 | 21A-2 | 21B-2 | 21C-2 | 21D-2 | 21E-2 | 21F-2 |
| A2X | 5D2-0 | 5E1-2 | 5E2-2 | 5E3-2 | 5E4-2 | 5E5-2 | 5E6-2 | 5E7-2 | 5E8-2 | 5E9-2 | 5EA-2 | 5EB-2 | 5EC-2 | 5ED-2 | 5EE-2 | 5EF-2 |
| A3X | 5D3-0 | 231-2 | 232-2 | 233-2 | 234-2 | 235-2 | 236-2 | 237-2 | 238-2 | 239-2 | 23A-2 | 23B-2 | 23C-2 | 23D-2 | 23E-2 | 23F-2 |
| A4X | 5D4-0 | 525-0 | 529-0 | 243-2 | 586-0 | 5A6-0 | 246-2 | 247-2 | 657-0 | 249-2 | 24A-2 | 24B-2 | 24C-2 | 24D-2 | 24E-2 | 24F-2 |
| A5X | 5D5-0 | 527-0 | 252-2 | 253-2 | 587-0 | 5A7-0 | 256-2 | 257-2 | 258-2 | 259-2 | 25A-2 | 25B-2 | 25C-2 | 25D-2 | 25E-2 | 25F-2 |
| A6X | 5D6-0 | 261-2 | 262-2 | 263-2 | 264-2 | 265-2 | 266-2 | 267-2 | 268-2 | 269-2 | 26A-2 | 26B-2 | 26C-2 | 26D-2 | 26E-2 | 26F-2 |
| A7X | 5D7-0 | 271-2 | 272-2 | 273-2 | 274-2 | 275-2 | 276-2 | 277-2 | 278-2 | 279-2 | 27A-2 | 27B-2 | 27C-2 | 27D-2 | 27E-2 | 27F-2 |
| A8X | 5D8-0 | 731-2 | 732-2 | 733-2 | 734-2 | 735-2 | 736-2 | 737-2 | 738-2 | 739-2 | 73A-2 | 73B-2 | 73C-2 | 2BD-2 | 73E-2 | 2BF-2 |
| A9X | 5D9-0 | 291-2 | 292-2 | 293-2 | 294-2 | 295-2 | 296-2 | 297-2 | 298-2 | 299-2 | 29A-2 | 29B-2 | 29C-2 | 29D-2 | 29E-2 | 29F-2 |
| AAX | 5DA-0 | 771-2 | 772-2 | 773-2 | 774-2 | 775-2 | 776-2 | 777-2 | 778-2 | 779-2 | 77A-2 | 77B-2 | 77C-2 | 77D-2 | 77E-2 | 77F-2 |
| ABX | 5DB-0 | 2B1-2 | 2B2-2 | 2B3-2 | 2B4-2 | 2B5-2 | 2B6-2 | 2B7-2 | 2B8-2 | 2B9-2 | 2BA-2 | 2BB-2 | 2BC-2 | 2BD-2 | 2BE-2 | 2BF-2 |
| ACX | 5DC-0 | 2C1-2 | 2C2-2 | 2C3-2 | 2C4-2 | 2C5-2 | 2C6-2 | 2C7-2 | 2C8-2 | 2C9-2 | 2CA-2 | 2CB-2 | 2CC-2 | 2CD-2 | 2CE-2 | 2CF-2 |
| ADX | 5DD-0 | 2D1-2 | 2D2-2 | 2D3-2 | 2D4-2 | 2D5-2 | 2D6-2 | 2D7-2 | 2D8-2 | 2D9-2 | 2DA-2 | 2DB-2 | 2DC-2 | 2DD-2 | 2DE-2 | 2DF-2 |
| AEX | 5DE-0 | 2E1-2 | 2E2-2 | 2E3-2 | 2E4-2 | 2E5-2 | 2E6-2 | 2E7-2 | 2E8-2 | 2E9-2 | 2EA-2 | 2EB-2 | 2EC-2 | 2ED-2 | 2EE-2 | 2EF-2 |
| AFX | 5DF-0 | 2F1-2 | 2F2-2 | 2F3-2 | 2F4-2 | 2F5-2 | 2F6-2 | 2F7-2 | 2F8-2 | 2F9-2 | 2FA-2 | 2FB-2 | 2FC-2 | 2FD-2 | 2FE-2 | 2FF-2 |
| B0X | 59B-0 | 72C-0 | 729-0 | 303-2 | 538-0 | 539-0 | 306-2 | 307-2 | 758-0 | 309-2 | 30A-2 | 30B-2 | 30C-2 | 30D-2 | 30E-2 | 30F-2 |
| B1X | 5F1-0 | 726-0 | 312-2 | 313-2 | 53A-0 | 53B-0 | 316-2 | 317-2 | 318-2 | 319-2 | 31A-2 | 31B-2 | 31C-2 | 31D-2 | 31E-2 | 31F-2 |
| B2X | 5F2-0 | 321-2 | 72B-0 | 323-2 | 324-2 | 325-2 | 326-2 | 327-2 | 75A-0 | 329-2 | 75B-0 | 32B-2 | 32C-2 | 32D-2 | 32E-2 | 32F-2 |
| B3X | 5F3-0 | 331-2 | 332-2 | 333-2 | 334-2 | 335-2 | 336-2 | 337-2 | 338-2 | 339-2 | 33A-2 | 33B-2 | 33C-2 | 33D-2 | 33E-2 | 33F-2 |
| B4X | 5F4-0 | 725-0 | 342-2 | 343-2 | 53C-0 | 53D-0 | 346-2 | 347-2 | 348-2 | 349-2 | 34A-2 | 34B-2 | 34C-2 | 34D-2 | 34E-2 | 34F-2 |
| B5X | 5F5-0 | 727-0 | 352-2 | 353-2 | 53E-0 | 53F-0 | 356-2 | 357-2 | 358-2 | 359-2 | 35A-2 | 35B-2 | 35C-2 | 35D-2 | 35E-2 | 35F-2 |
| B6X | 5F6-0 | 361-2 | 362-2 | 363-2 | 364-2 | 365-2 | 366-2 | 367-2 | 368-2 | 369-2 | 36A-2 | 36B-2 | 36C-2 | 36D-2 | 36E-2 | 36F-2 |
| B7X | 5F7-0 | 371-2 | 372-2 | 373-2 | 374-2 | 375-2 | 376-2 | 377-2 | 378-2 | 379-2 | 37A-2 | 37B-2 | 37C-2 | 37D-2 | 37E-2 | 37F-2 |
| B8X | 5F8-0 | 381-2 | 72D-0 | 383-2 | 384-2 | 384-2 | 386-2 | 887-2 | 75C-0 | 389-2 | 75D-0 | 38B-2 | 38C-2 | 38D-2 | 38E-2 | 38F-2 |
| B9X | 5F9-0 | 391-2 | 392-2 | 393-2 | 394-2 | 395-2 | 396-2 | 397-2 | 398-2 | 399-2 | 39A-2 | 39B-2 | 39C-2 | 39D-2 | 39E-2 | 39F-2 |
| BAX | 5FA-0 | 3A1-2 | 72F-0 | 3A3-2 | 3A4-2 | 3A5-2 | 3A6-2 | 3A7-2 | 75E-0 | 3A9-2 | 75F-0 | 3AB-2 | 3AC-2 | 3AD-2 | 3AE-2 | 3AF-2 |
| BBX | 5FB-0 | 3B1-2 | 3B2-2 | 3B3-2 | 3B4-2 | 3B5-2 | 3B6-2 | 3B7-2 | 3B8-2 | 3B9-2 | 3BA-2 | 3BB-2 | 3BC-2 | 3BD-2 | 3BE-2 | 3BF-2 |
| BCX | 5FC-0 | 3C1-2 | 3C2-2 | 3C3-2 | 3C4-2 | 3C5-2 | 3C6-2 | 3C7-2 | 3C8-2 | 3C9-2 | 3CA-2 | 3CB-2 | 3CC-2 | 3CD-2 | 3CE-2 | 3CF-2 |
| BDX | 5FD-0 | 3D1-2 | 3D2-2 | 3D3-2 | 3D4-2 | 3D5-2 | 3D6-2 | 3D7-2 | 3D8-2 | 3D9-2 | 3DA-2 | 3DB-2 | 3DC-2 | 3DD-2 | 3DE-2 | 3DF-2 |
| BEX | 5FE-0 | 3E1-2 | 3E2-2 | 3E3-2 | 3E4-2 | 3E5-2 | 3E6-2 | 3E7-2 | 3E8-2 | 3E9-2 | 3EA-2 | 3EB-2 | 3EC-2 | 3ED-2 | 3EE-2 | 3EF-2 |

TABLE 9-continued

State Diagram of 11-bit code word mapping for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| BFX | 5FF-0 | 3F1-2 | 3F2-2 | 3F3-2 | 3F4-2 | 3F5-2 | 3F6-2 | 3F7-2 | 3F8-2 | 3F9-2 | 3FA-2 | 3FB-2 | 3FC-2 | 3FD-2 | 3FE-2 | 3FF-2 |
| C0X | 59C-0 | 531-0 | 532-0 | 533-0 | 534-0 | 535-0 | 536-0 | 537-0 | 4B8-0 | 752-0 | 4B9-0 | 40B-2 | 753-0 | 40D-2 | 40E-2 | 40F-2 |
| C1X | 661-0 | 561-0 | 562-0 | 563-0 | 564-0 | 565-0 | 566-0 | 567-0 | 756-0 | 419-2 | 41A-2 | 41B-2 | 41C-2 | 41D-2 | 41E-2 | 41F-2 |
| C2X | 662-0 | 719-0 | 71D-0 | 423-2 | 717-0 | 425-2 | 426-2 | 427-2 | 4BA-0 | 429-2 | 4BB-0 | 42B-2 | 42C-2 | 42D-2 | 42E-2 | 42F-2 |
| C3X | 663-0 | 431-2 | 432-2 | 433-2 | 434-2 | 435-2 | 436-2 | 437-2 | 438-2 | 439-2 | 43A-2 | 43B-2 | 43C-2 | 43D-2 | 43E-2 | 43F-2 |
| C4X | 664-0 | 571-0 | 572-0 | 573-0 | 574-0 | 575-0 | 576-0 | 577-0 | 757-0 | 449-2 | 44A-2 | 44B-2 | 44C-2 | 44D-2 | 44E-2 | 44F-2 |
| C5X | 665-0 | 591-0 | 592-0 | 593-0 | 594-0 | 595-0 | 596-0 | 597-0 | 458-2 | 459-2 | 45A-2 | 45B-2 | 45C-2 | 45D-2 | 45E-2 | 45F-2 |
| C6X | 666-2 | 461-2 | 462-2 | 463-2 | 464-2 | 465-2 | 466-2 | 467-2 | 468-2 | 469-2 | 46A-2 | 46B-2 | 46C-2 | 46D-2 | 46E-2 | 46F-2 |
| C7X | 667-2 | 471-2 | 472-2 | 473-2 | 474-2 | 475-2 | 476-2 | 477-2 | 478-2 | 479-2 | 47A-2 | 47B-2 | 47C-2 | 47D-2 | 47E-2 | 47F-2 |
| C8X | 668-0 | 71B-0 | 71E-0 | 483-2 | 707-0 | 485-2 | 486-2 | 487-2 | 4BC-0 | 489-2 | 4BD-0 | 48B-2 | 48C-2 | 48D-2 | 48E-2 | 48F-2 |
| C9X | 669-0 | 491-2 | 492-2 | 493-2 | 494-2 | 495-2 | 496-2 | 497-2 | 498-2 | 499-2 | 49A-2 | 49B-2 | 49C-2 | 49D-2 | 49E-2 | 49F-2 |
| CAX | 66A-0 | 4A1-2 | 7AF-0 | 4A3-2 | 4A4-2 | 4A5-2 | 4A6-2 | 4A7-2 | 4BE-0 | 4A9-2 | 4BF-0 | 4AB-2 | 4AC-2 | 4AD-2 | 4AE-2 | 4AF-2 |
| CBX | 66B-0 | 4B1-2 | 4B2-2 | 4B3-2 | 4B4-2 | 4B5-2 | 4B6-2 | 4B7-2 | 4B8-2 | 4B9-2 | 4BA-2 | 4BB-2 | 4BC-2 | 4BD-2 | 4BE-2 | 4BF-2 |
| CCX | 66C-0 | 4C1-2 | 4C2-2 | 4C3-2 | 4C4-2 | 4C5-2 | 4C6-2 | 4C7-2 | 4C8-2 | 4C9-2 | 4CA-2 | 4CB-2 | 4CC-2 | 4CD-2 | 4CE-2 | 4CF-2 |
| CDX | 66D-0 | 4D1-2 | 4D2-2 | 4D3-2 | 4D4-2 | 4D5-2 | 4D6-2 | 4D7-2 | 4D8-2 | 4D9-2 | 4DA-2 | 4DB-2 | 4DC-2 | 4DD-2 | 4DE-2 | 4DF-2 |
| CEX | 66E-0 | 4E1-2 | 4E2-2 | 4E3-2 | 4E4-2 | 4E5-2 | 4E6-2 | 4E7-2 | 4E8-2 | 4E9-2 | 4EA-2 | 4EB-2 | 4EC-2 | 4ED-2 | 4EE-2 | 4EF-2 |
| CFX | 66F-0 | 4F1-2 | 4F2-2 | 4F3-2 | 4F4-2 | 4F5-2 | 4F6-2 | 4F7-2 | 4F8-2 | 4F9-2 | 4FA-2 | 4FB-2 | 4FC-2 | 4FD-2 | 4FE-2 | 4FF-2 |
| D0X | 59D-0 | 519-2 | 51A-2 | 51B-0 | 51C-0 | 51D-0 | 51E-0 | 51F-0 | 5B8-2 | 509-2 | 5B9-0 | 50B-2 | 50C-2 | 50D-2 | 50E-2 | 50F-2 |
| D1X | 691-0 | 549-0 | 54A-2 | 54B-0 | 54C-0 | 54D-0 | 54E-0 | 54F-0 | 518-2 | 519-2 | 51A-2 | 51B-2 | 51C-2 | 51D-2 | 51E-2 | 51F-2 |
| D2X | 692-0 | 521-2 | 74D-0 | 523-2 | 524-2 | 525-2 | 526-2 | 527-2 | 5BA-0 | 529-2 | 5BB-0 | 52B-2 | 52C-2 | 52D-2 | 52E-2 | 52F-2 |
| D3X | 693-0 | 531-2 | 532-2 | 533-2 | 534-2 | 535-2 | 536-2 | 537-2 | 538-2 | 539-2 | 53A-2 | 53B-2 | 53C-2 | 53D-2 | 53E-2 | 53F-2 |
| D4X | 594-0 | 619-0 | 61A-0 | 61B-0 | 61C-0 | 61D-0 | 61E-0 | 61F-0 | 548-2 | 549-2 | 54A-2 | 54B-2 | 54C-2 | 54D-2 | 54E-2 | 54F-2 |
| D5X | 695-0 | 649-0 | 64A-0 | 64B-0 | 64C-0 | 64D-0 | 64E-0 | 64F-0 | 558-2 | 559-2 | 55A-2 | 55B-2 | 55C-2 | 55D-2 | 55E-2 | 55F-2 |
| D6X | 696-2 | 561-2 | 562-2 | 563-2 | 564-2 | 565-2 | 566-2 | 567-2 | 568-2 | 569-2 | 56A-2 | 56B-2 | 56C-2 | 56D-2 | 56E-2 | 56F-2 |
| D7X | 697-2 | 571-2 | 572-2 | 573-2 | 574-2 | 575-2 | 576-2 | 577-2 | 578-2 | 579-2 | 57A-2 | 57B-2 | 57C-2 | 57D-2 | 57E-2 | 57F-2 |
| D8X | 698-0 | 581-2 | 74E-0 | 583-2 | 584-2 | 585-2 | 586-2 | 587-2 | 588-2 | 589-2 | 58A-2 | 58B-2 | 58C-2 | 58D-2 | 58E-2 | 58F-2 |
| D9X | 699-0 | 591-2 | 592-2 | 593-2 | 594-2 | 595-2 | 596-2 | 597-2 | 598-2 | 599-2 | 59A-2 | 59B-2 | 59C-2 | 59D-2 | 59E-2 | 59F-2 |
| DAX | 69A-0 | 5A1-2 | 74F-0 | 5A3-2 | 5A4-2 | 5A5-2 | 5A6-2 | 5A7-2 | 5BA-0 | 5A9-2 | 5BB-0 | 5AB-2 | 5AC-2 | 5AD-2 | 5AE-2 | 5AF-2 |
| DBX | 69B-0 | 5B1-2 | 5B2-2 | 5B3-2 | 5B4-2 | 5B5-2 | 5B6-2 | 5B7-2 | 5B8-2 | 5B9-2 | 5BA-2 | 5BB-2 | 5BC-2 | 5BD-2 | 5BE-2 | 5BF-2 |
| DCX | 69C-0 | 5C1-2 | 5C2-2 | 5C3-2 | 5C4-2 | 5C5-2 | 5C6-2 | 5C7-2 | 5C8-2 | 5C9-2 | 5CA-2 | 5CB-2 | 5CC-2 | 5CD-2 | 5CE-2 | 5CF-2 |
| DDX | 69D-0 | 5D1-2 | 5D2-2 | 5D3-2 | 5D4-2 | 5D5-2 | 5D6-2 | 5D7-2 | 5D8-2 | 5D9-2 | 5DA-2 | 5DB-2 | 5DC-2 | 5DD-2 | 5DE-2 | 5DF-2 |
| DEX | 69E-0 | 5E1-2 | 5E2-2 | 5E3-2 | 5E4-2 | 5E5-2 | 5E6-2 | 5E7-2 | 5E8-2 | 5E9-2 | 5EA-2 | 5EB-2 | 5EC-2 | 5ED-2 | 5EE-2 | 5EF-2 |
| DFX | 69F-0 | 5F1-2 | 5F2-2 | 5F3-2 | 5F4-2 | 5F5-2 | 5F6-2 | 5F7-2 | 5F8-2 | 5F9-2 | 5FA-2 | 5FB-2 | 5FC-2 | 5FD-2 | 5FE-2 | 5FF-2 |
| E0X | 59E-0 | 78C-0 | 789-0 | 603-2 | 568-0 | 569-0 | 606-2 | 607-2 | 6B8-0 | 609-2 | 6B9-0 | 60B-2 | 60C-2 | 60D-2 | 60E-2 | 60F-2 |
| E1X | 761-0 | 786-0 | 612-2 | 613-2 | 56A-0 | 56B-0 | 616-2 | 617-2 | 618-2 | 619-2 | 61A-2 | 61B-2 | 61C-2 | 61D-2 | 61E-2 | 61F-2 |
| E2X | 762-0 | 621-2 | 78B-0 | 623-2 | 624-2 | 625-2 | 626-2 | 627-2 | 6BA-0 | 629-2 | 6BB-0 | 62B-2 | 62C-2 | 62D-2 | 62E-2 | 62F-2 |
| E3X | 763-0 | 631-2 | 632-2 | 633-2 | 634-2 | 635-2 | 636-2 | 637-2 | 638-2 | 639-2 | 63A-2 | 63B-2 | 63C-2 | 63D-2 | 63E-2 | 63F-2 |
| E4X | 764-0 | 785-0 | 642-2 | 643-2 | 644-2 | 645-2 | 646-2 | 647-2 | 648-2 | 649-2 | 64A-2 | 64B-2 | 64C-2 | 64D-2 | 64E-2 | 64F-2 |
| E5X | 765-0 | 787-0 | 652-2 | 653-2 | 56E-0 | 56F-0 | 656-2 | 657-2 | 658-2 | 659-2 | 65A-2 | 65B-2 | 65C-2 | 65D-2 | 65E-2 | 65F-2 |
| E6X | 766-2 | 661-2 | 662-2 | 663-2 | 664-2 | 665-2 | 666-2 | 667-2 | 668-2 | 669-2 | 66A-2 | 66B-2 | 66C-2 | 66D-2 | 66E-2 | 66F-2 |
| E7X | 767-2 | 671-2 | 672-2 | 673-2 | 674-2 | 675-2 | 676-2 | 677-2 | 678-2 | 679-2 | 67A-2 | 67B-2 | 67C-2 | 67D-2 | 67E-2 | 67F-2 |
| E8X | 768-0 | 681-2 | 78D-0 | 683-2 | 684-2 | 685-2 | 686-2 | 687-2 | 688-2 | 689-2 | 68A-2 | 68B-2 | 68C-2 | 68D-2 | 68E-2 | 68F-2 |
| E9X | 769-0 | 691-2 | 692-2 | 693-2 | 694-2 | 695-2 | 696-2 | 697-2 | 698-2 | 699-2 | 69A-2 | 69B-2 | 69C-2 | 69D-2 | 69E-2 | 69F-2 |
| EAX | 76A-0 | 6A1-2 | 78F-0 | 6A3-2 | 5A4-2 | 6A5-2 | 6A6-2 | 6A7-2 | 6BE-0 | 6A9-2 | 6BF-0 | 6AB-2 | 6AC-2 | 6AD-2 | 6AE-2 | 6AF-2 |
| EBX | 76B-0 | 6B1-2 | 6B2-2 | 6B3-2 | 6B4-2 | 6B5-2 | 6B6-2 | 6B7-2 | 6B8-2 | 6B9-2 | 6BA-2 | 6BB-2 | 6BC-2 | 6BD-2 | 6BE-2 | 6BF-2 |
| ECX | 76C-0 | 6C1-2 | 6C2-2 | 6C3-2 | 6C4-2 | 6C5-2 | 6C6-2 | 6C7-2 | 6C8-2 | 6C9-2 | 6CA-2 | 6CB-2 | 6CC-2 | 6CD-2 | 6CE-2 | 6CF-2 |
| EDX | 76D-0 | 6D1-2 | 6D2-2 | 6D3-2 | 6D4-2 | 6D5-2 | 6D6-2 | 6D7-2 | 6D8-2 | 6D9-2 | 6DA-2 | 6DB-2 | 6DC-2 | 6DD-2 | 6DE-2 | 6DF-2 |
| EEX | 76E-0 | 6E1-2 | 6E2-2 | 6E3-2 | 6E4-2 | 6E5-2 | 6E6-2 | 6E7-2 | 6E8-2 | 6E9-2 | 6EA-2 | 6EB-2 | 6EC-2 | 6ED-2 | 6EE-2 | 6EF-2 |

TABLE 9-continued

State Diagram of 11-bit code word mapping for 24/25 (0,7/7) code

|     | 0     | 1     | 2     | 3     | 4     | 5     | 6     | 7     | 8     | 9     | A     | B     | C     | D     | E     | F     |
|-----|-------|-------|-------|-------|-------|-------|-------|-------|-------|-------|-------|-------|-------|-------|-------|-------|
| EFX | 76F-0 | 6F1-2 | 6F2-2 | 6F3-2 | 6F4-2 | 6F5-2 | 6F6-2 | 6F7-2 | 6F8-2 | 6F9-2 | 6FA-2 | 6FB-2 | 6FC-2 | 6FD-2 | 6FE-2 | 6FF-2 |
| F0X | 59F-0 | 7AC-0 | 7A9-0 | 703-2 | 578-0 | 579-0 | 706-2 | 707-2 | 7B8-0 | 709-2 | 7B9-0 | 70B-2 | 70C-2 | 70D-2 | 70E-2 | 70F-2 |
| F1X | 791-0 | 7A6-0 | 712-2 | 713-2 | 57A-0 | 57B-0 | 716-2 | 717-2 | 718-2 | 719-2 | 71A-2 | 71B-2 | 71C-2 | 71D-2 | 71E-2 | 71F-2 |
| F2X | 792-0 | 721-2 | 7AB-0 | 723-2 | 724-2 | 725-2 | 726-2 | 727-2 | 7BA-0 | 729-2 | 7BB-0 | 72B-2 | 72C-2 | 72D-2 | 72E-2 | 72F-2 |
| F3X | 793-0 | 731-2 | 732-2 | 733-2 | 734-2 | 735-2 | 736-2 | 737-2 | 738-2 | 739-2 | 73A-2 | 73B-2 | 73C-2 | 73D-2 | 73E-2 | 73F-2 |
| F4X | 794-0 | 7A5-0 | 742-2 | 743-2 | 57C-0 | 57D-0 | 746-2 | 747-2 | 748-2 | 749-2 | 74A-2 | 74B-2 | 74C-2 | 74D-2 | 74E-2 | 74F-2 |
| F5X | 795-0 | 7A7-0 | 752-2 | 753-2 | 57E-0 | 57F-0 | 756-2 | 757-2 | 758-2 | 759-2 | 75A-2 | 75B-2 | 75C-2 | 75D-2 | 75E-2 | 75F-2 |
| F6X | 796-0 | 761-2 | 762-2 | 763-2 | 764-2 | 765-2 | 766-2 | 767-2 | 768-2 | 769-2 | 76A-2 | 76B-2 | 76C-2 | 76D-2 | 76E-2 | 76F-2 |
| F7X | 797-0 | 771-2 | 772-2 | 773-2 | 774-2 | 775-2 | 776-2 | 777-2 | 778-2 | 779-2 | 77A-2 | 77B-2 | 77C-2 | 77D-2 | 77E-2 | 77F-2 |
| F8X | 798-0 | 781-2 | 7AD-0 | 783-2 | 784-2 | 785-2 | 786-2 | 787-2 | 7BC-0 | 789-2 | 7BD-0 | 78B-2 | 78C-2 | 78D-2 | 78E-2 | 78F-2 |
| F9X | 799-0 | 791-2 | 792-2 | 793-2 | 794-2 | 795-2 | 796-2 | 797-2 | 798-2 | 799-2 | 79A-2 | 79B-2 | 79C-2 | 79D-2 | 79E-2 | 79F-2 |
| FAX | 79A-0 | 7A1-2 | 7AF-0 | 7A3-2 | 7A4-2 | 7A5-2 | 7A6-2 | 7A7-2 | 7BE-0 | 7A9-2 | 7BF-0 | 7AB-2 | 7AC-2 | 7AD-2 | 7AE-2 | 7AF-2 |
| FBX | 79B-0 | 7B1-2 | 7B2-2 | 7B3-2 | 7B4-2 | 7B5-2 | 7B6-2 | 7B7-2 | 7B8-2 | 7B9-2 | 7BA-2 | 7BB-2 | 7BC-2 | 7BD-2 | 7BE-2 | 7BF-2 |
| FCX | 79C-0 | 7C1-2 | 7C2-2 | 7C3-2 | 7C4-2 | 7C5-2 | 7C6-2 | 7C7-2 | 7C8-2 | 7C9-2 | 7CA-2 | 7CB-2 | 7CC-2 | 7CD-2 | 7CE-2 | 7CF-2 |
| FDX | 79D-0 | 7D1-2 | 7D2-2 | 7D3-2 | 7D4-2 | 7D5-2 | 7D6-2 | 7D7-2 | 7D8-2 | 7D9-2 | 7DA-2 | 7DB-2 | 7DC-2 | 7DD-2 | 7DE-2 | 7DF-2 |
| FEX | 79E-0 | 7E1-2 | 7E2-2 | 7E3-2 | 7E4-2 | 7E5-2 | 7E6-2 | 7E7-2 | 7E8-2 | 7E9-2 | 7EA-2 | 7EB-2 | 7EC-2 | 7ED-2 | 7EE-2 | 7EF-2 |
| FFX | 79F-0 | 7F1-2 | 7F2-2 | 7F3-2 | 7F4-2 | 7F5-2 | 7F6-2 | 7F7-2 | 7F8-2 | 7F9-2 | 7EA-2 | 7FB-2 | 7FC-2 | 7FD-2 | 7FE-2 | 7FF-2 |

Table 10 on the following pages is an encoding table for the 14-bit encoder when the state S0 is active. The arrangement of Table 10 is similar to Table 9, however, the state is "0" for all of Table 10 as indicated at the top of Table 10.

TABLE 10

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 00X | 0570 | 04E1 | 0721 | 0263 | 04F0 | 04F1 | 0266 | 0267 | 0730 | 0269 | 0731 | 0269B | 026C | 026D | 026E | 026F |
| 01X | 035E | 04E3 | 0272 | 0274 | 04F2 | 04F3 | 0276 | 0277 | 0278 | 0279 | 027A | 0278 | 027C | 027D | 027E | 027F |
| 02X | 0571 | 03DC | 0723 | 0493 | 03CC | 0495 | 0496 | 1027 | 0732 | 0499 | 0733 | 012B | 049C | 102D | 102E | 102F |
| 03X | 035C | 03DD | 068C | 1033 | 03CD | 1035 | 1036 | 1037 | 033C | 1039 | 103A | 103B | 103C | 103D | 103E | 103F |
| 04X | 0572 | 04E5 | 02E2 | 02E3 | 04F4 | 04F6 | 02E6 | 02E7 | 02E8 | 02E9 | 02EA | 02EB | 02EC | 02ED | 02EE | 02EF |
| 05X | 035A | 04E7 | 02F2 | 02F3 | 04F6 | 04F7 | 02F6 | 02F7 | 02F8 | 02F9 | 02FA | 02FB | 02FC | 02FD | 02FE | 02FF |
| 06X | 0573 | 03D8 | 0689 | 1063 | 03C8 | 1065 | 1066 | 1067 | 0319 | 1069 | 106A | 106B | 106C | 106D | 106E | 106F |
| 07X | 0358 | 1071 | 1072 | 1073 | 1074 | 1075 | 1076 | 1077 | 1078 | 0179 | 107A | 107B | 107C | 107D | 107E | 107F |
| 08X | 0574 | 03D6 | 0725 | 04A3 | 03C6 | 04A5 | 04A6 | 1087 | 0734 | 04A9 | 0735 | 108B | 04AC | 108D | 108E | 108F |
| 09X | 0356 | 03D7 | 0685 | 1093 | 03C7 | 1095 | 1096 | 1097 | 0736 | 1099 | 109A | 109B | 109C | 109D | 109E | 109F |
| 0AX | 0575 | 03D4 | 0727 | 10A3 | 03C4 | 10A5 | 10A6 | 10A7 | 10B8 | 10A9 | 0737 | 10AB | 10AC | 10AD | 10AE | 10AF |
| 0BX | 0354 | 10B1 | 10B2 | 10B3 | 10B4 | 10B5 | 10B6 | 10B7 | 10B8 | 10B9 | 10BA | 10BB | 10BC | 10BD | 10BE | 10BF |
| 0CX | 0576 | 03D2 | 0683 | 10C3 | 03C2 | 10C5 | 10C6 | 10C7 | 0313 | 10C9 | 10CA | 10CB | 10CC | 10CD | 10CE | 10CF |
| 0DX | 0352 | 10D1 | 10D2 | 10D3 | 10D4 | 10D5 | 10D5 | 10D7 | 10D8 | 10D9 | 10DA | 10DB | 10DC | 10DD | 10DE | 10DF |
| 0EX | 0577 | 10E1 | 10E2 | 10E3 | 10E4 | 10E5 | 10E5 | 10E7 | 10E8 | 10E9 | 10EA | 10EB | 10EC | 10ED | 10EE | 10EF |
| 0FX | 10F0 | 10F1 | 10F2 | 10F3 | 10F4 | 10F5 | 10F5 | 10F7 | 10F8 | 10F9 | 10FA | 10FB | 10FC | 10FD | 10FE | 10FF |
| 10X | 0578 | 04E9 | 0362 | 0363 | 04F8 | 04F9 | 0366 | 0367 | 0368 | 0369 | 036A | 036B | 036C | 036D | 036E | 036F |
| 11X | 035F | 04EB | 0372 | 0373 | 04FA | 04FB | 0376 | 0377 | 0378 | 0379 | 037A | 037B | 037C | 037D | 037E | 037F |
| 12X | 0579 | 03BC | 069D | 1123 | 03AC | 1125 | 1126 | 1127 | 031D | 1129 | 112A | 112B | 112C | 112D | 112E | 112F |
| 13X | 035D | 1131 | 1132 | 1133 | 1134 | 1135 | 1136 | 1137 | 1138 | 1139 | 113A | 113B | 113C | 113D | 113E | 113F |
| 14X | 057A | 04ED | 03E2 | 03E3 | 04FC | 04FD | 03E6 | 03E7 | 03E8 | 03E9 | 03EA | 03EB | 03EC | 03ED | 03EE | 03EF |
| 15X | 035B | 04EF | 03F2 | 03F3 | 04FE | 04FF | 03F6 | 03F7 | 03F8 | 03F9 | 03FA | 03FB | 03FC | 03FD | 03FE | 03FF |
| 16X | 057B | 1161 | 1162 | 1163 | 1164 | 1165 | 1166 | 1167 | 1168 | 1169 | 116A | 116B | 116C | 116D | 116E | 116F |
| 17X | 1170 | 1171 | 1172 | 1173 | 1174 | 1175 | 1176 | 1177 | 1178 | 1179 | 117A | 117B | 117C | 117D | 117E | 117F |
| 18X | 057C | 03B6 | 0697 | 1183 | 03A6 | 1185 | 1186 | 1187 | 1198 | 1189 | 118A | 118B | 118C | 118D | 118E | 118F |
| 19X | 0357 | 1191 | 1192 | 1193 | 1194 | 1195 | 1196 | 1197 | 1198 | 1199 | 119A | 119B | 119C | 119D | 119E | 119F |
| 1AX | 057D | 11A1 | 11A2 | 11A3 | 11A4 | 11A5 | 11A6 | 11A7 | 11A8 | 11A9 | 11AA | 11AB | 11AC | 11AD | 11AE | 11AF |
| 1BX | 11B0 | 11B1 | 11B2 | 11B3 | 11B4 | 11B5 | 11B6 | 11B7 | 11B8 | 11B9 | 11BA | 11BB | 11BC | 11BD | 11BE | 11BF |
| 1CX | 057E | 11C1 | 11C2 | 11C3 | 11C4 | 11C5 | 11C6 | 11C7 | 11C8 | 11C9 | 11CA | 11CB | 11CC | 11CD | 11CE | 11CF |
| 1DX | 11D0 | 11D1 | 11D2 | 11D3 | 11D4 | 11D5 | 11D6 | 11D7 | 11D8 | 11D9 | 11DA | 11DB | 11DC | 11DD | 11DE | 11DF |
| 1EX | 057F | 11E1 | 11E2 | 11E3 | 11E4 | 11E5 | 11E6 | 11E7 | 11E8 | 11E9 | 11EA | 11EB | 11EC | 11ED | 11EE | 11EF |
| 1FX | 11F0 | 11F1 | 11F2 | 11F3 | 11F4 | 11F5 | 11F6 | 11F7 | 11F8 | 11F9 | 11FA | 11FB | 11FC | 11FD | 11FE | 11FF |
| 20X | 05B0 | 039E | 0729 | 04B3 | 038E | 04B5 | 04B6 | 1207 | 0738 | 04B9 | 0739 | 120B | 04BC | 120D | 120E | 120F |
| 21X | 034E | 039F | 069E | 1213 | 038F | 1215 | 1216 | 1217 | 032E | 1219 | 121A | 121B | 121C | 121D | 121E | 121F |
| 22X | 05B1 | 039C | 072B | 1223 | 038C | 1225 | 1226 | 1227 | 073A | 1229 | 073B | 122B | 122C | 122D | 122E | 122F |
| 23X | 034C | 1231 | 1232 | 1233 | 1234 | 1235 | 1236 | 1237 | 1238 | 1239 | 123A | 123B | 123C | 123D | 123E | 123F |
| 24X | 05B2 | 039A | 069B | 1243 | 038A | 1245 | 1246 | 1247 | 031A | 1249 | 124A | 124B | 124C | 124D | 124E | 124F |
| 25X | 034A | 1251 | 1252 | 1253 | 1254 | 1255 | 1256 | 1257 | 1258 | 1259 | 125A | 125B | 125C | 125D | 125E | 125F |
| 26X | 05B3 | 1261 | 1262 | 1263 | 1264 | 1265 | 1266 | 1267 | 1268 | 1269 | 126A | 126B | 126C | 126D | 126E | 126F |
| 27X | 1270 | 1271 | 1272 | 1273 | 1274 | 1275 | 1276 | 1277 | 073C | 1279 | 127A | 127B | 127C | 127D | 127E | 127F |
| 28X | 05B4 | 0396 | 072D | 1283 | 0386 | 1285 | 1286 | 1287 | 1298 | 1289 | 128A | 128B | 128C | 128D | 128E | 128F |
| 29X | 0346 | 1291 | 1292 | 1293 | 1294 | 1295 | 1296 | 1297 | 1298 | 1299 | 129A | 129B | 129C | 129D | 129E | 129F |
| 2AX | 05B5 | 12A1 | 072F | 12A3 | 12A4 | 12A5 | 12A6 | 12A7 | 12B8 | 12A9 | 073F | 12AB | 12AC | 12AD | 12AE | 12AF |
| 2BX | 12B0 | 12B1 | 12B2 | 12B3 | 12B4 | 12B5 | 12B6 | 12B7 | 12B8 | 12B9 | 12BA | 12BB | 12BC | 12BD | 12BE | 12BF |
| 2CX | 05B6 | 12C1 | 12C2 | 12C3 | 12C4 | 12C5 | 12C6 | 12C7 | 12C8 | 12C9 | 12CA | 12CB | 12CC | 12CD | 12CE | 12CF |
| 2DX | 12D0 | 12D1 | 12D2 | 12D3 | 12D4 | 12D5 | 12D6 | 12D7 | 12D8 | 12D9 | 12DA | 12DB | 12DC | 12DD | 12DE | 12DF |
| 2EX | 05B7 | 12E1 | 12E2 | 12E3 | 12E4 | 12E5 | 12E6 | 12E7 | 12E8 | 12E9 | 12EA | 12EB | 12EC | 12ED | 12EE | 12EF |

TABLE 10-continued

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 2FX | 12F0 | 12F1 | 12F2 | 12F3 | 12F4 | 12F5 | 12F6 | 12F7 | 12F8 | 12F9 | 12FA | 12FB | 12FC | 12FD | 12FE | 12FF |
| 30X | 05B8 | 03BE | 069F | 1303 | 03AE | 1305 | 1306 | 1307 | 0308 | 1309 | 130A | 130B | 130C | 130D | 130E | 130F |
| 31X | 034F | 1311 | 1312 | 1313 | 1314 | 1315 | 1316 | 1317 | 1318 | 1319 | 131A | 131B | 131C | 131D | 131E | 131F |
| 32X | 05B9 | 1321 | 1322 | 1323 | 1324 | 1325 | 1326 | 1327 | 1328 | 1329 | 132A | 132B | 132C | 132D | 132E | 132F |
| 33X | 1330 | 1331 | 1332 | 1333 | 1334 | 1335 | 1336 | 1337 | 1338 | 1339 | 133A | 133B | 133C | 133D | 133E | 133F |
| 34X | 1341 | 1341 | 1342 | 1343 | 1344 | 1345 | 1346 | 1347 | 1348 | 1349 | 134A | 134B | 134C | 134D | 134E | 134F |
| 35X | 05BA | 1351 | 1352 | 1353 | 1354 | 1355 | 1356 | 1357 | 1358 | 1359 | 135A | 135B | 135C | 135D | 135E | 135F |
| 36X | 05BB | 1361 | 1362 | 1363 | 1364 | 1365 | 1366 | 1367 | 1368 | 1369 | 136A | 136B | 136C | 136D | 136E | 136F |
| 37X | 1370 | 1371 | 1372 | 1373 | 1374 | 1375 | 1376 | 1377 | 1378 | 1379 | 137A | 137B | 137C | 137D | 137E | 137F |
| 38X | 05BC | 1381 | 1382 | 1383 | 1384 | 1385 | 1386 | 1387 | 1388 | 1389 | 138A | 138B | 138C | 138D | 138E | 138F |
| 39X | 1390 | 1391 | 1392 | 1393 | 1394 | 1395 | 1396 | 1397 | 1398 | 1399 | 139A | 139B | 139C | 139D | 139E | 139F |
| 3AX | 05BD | 13A1 | 13A2 | 13A3 | 13A4 | 13A5 | 13A6 | 13A7 | 13A8 | 13A9 | 13AA | 13AB | 13AC | 13AD | 13AE | 13AF |
| 3BX | 13B0 | 13B1 | 13B2 | 13B3 | 13B4 | 13B5 | 13B6 | 13B7 | 13B8 | 13B9 | 13BA | 13BB | 13BC | 13BD | 13BE | 13BF |
| 3CX | 05BE | 13C1 | 13C2 | 13C3 | 13C4 | 13C5 | 13C6 | 13C7 | 13C8 | 13C9 | 13CA | 13CB | 13CC | 13CD | 13CE | 13CF |
| 3DX | 13D0 | 13D1 | 13D2 | 13D3 | 13D4 | 13D5 | 13D6 | 13D7 | 13D8 | 13D9 | 13DA | 13DB | 13DC | 13DD | 13DE | 13DF |
| 3EX | 05BF | 13E1 | 13E2 | 13E3 | 13E4 | 13E5 | 13E6 | 13E7 | 13E8 | 13E9 | 13EA | 13EB | 13EC | 13ED | 13EE | 13EF |
| 3FX | 13F0 | 13F1 | 13F2 | 13F3 | 13F4 | 13F5 | 13F6 | 13F7 | 13F8 | 13F9 | 13FA | 13FB | 13FC | 13FD | 13FE | 13FF |
| 40X | 05D0 | 0741 | 0761 | 0563 | 0750 | 0751 | 0566 | 0567 | 0770 | 0569 | 0771 | 056B | 056C | 056D | 056E | 056F |
| 41X | 0724 | 0743 | 0532 | 0533 | 0752 | 0753 | 0536 | 0537 | 0538 | 0539 | 053A | 053B | 053C | 053D | 053E | 053F |
| 42X | 05D1 | 0711 | 0763 | 1423 | 0715 | 1425 | 1426 | 1427 | 0772 | 1429 | 0773 | 142B | 142C | 142D | 142E | 142F |
| 43X | 0726 | 1431 | 1432 | 1433 | 1434 | 1435 | 1436 | 1437 | 1438 | 1439 | 143A | 143B | 143C | 143D | 143E | 143F |
| 44X | 05D2 | 0745 | 05C2 | 05C3 | 0754 | 0755 | 05C6 | 05C7 | 05C8 | 05C9 | 05CA | 05CB | 05CC | 05CD | 05CE | 05CF |
| 45X | 0728 | 0747 | 05E2 | 05E3 | 0756 | 0757 | 05E6 | 05E7 | 05E8 | 05E9 | 05EA | 05EB | 05EC | 05ED | 05EE | 05EF |
| 46X | 05D3 | 1461 | 1462 | 1463 | 1464 | 1465 | 1466 | 1467 | 1468 | 1469 | 146A | 146B | 146C | 146D | 146E | 146F |
| 47X | 1470 | 1471 | 1472 | 1473 | 1474 | 1475 | 1476 | 1477 | 1478 | 1479 | 147A | 147B | 147C | 147D | 147E | 147F |
| 48X | 05D4 | 0712 | 0765 | 1483 | 0716 | 1485 | 1486 | 1487 | 0774 | 1489 | 0775 | 148B | 148C | 148D | 148E | 148F |
| 49X | 072A | 1491 | 1492 | 1493 | 1494 | 1495 | 1496 | 1497 | 1498 | 1499 | 149A | 149B | 149C | 149D | 149E | 149F |
| 4AX | 05D5 | 14A1 | 0767 | 14A3 | 14A4 | 14A5 | 14A6 | 14A7 | 0776 | 14A9 | 0777 | 14AB | 14AC | 14AD | 14AE | 14AF |
| 4BX | 05D6 | 14B1 | 14B2 | 14B3 | 14B4 | 14B5 | 14B6 | 14B7 | 14B8 | 14B9 | 14BA | 14BB | 14BC | 14BD | 14BE | 14BF |
| 4CX | 14C0 | 14C1 | 14C2 | 14C3 | 14C4 | 14C5 | 14C6 | 14C7 | 14C8 | 14C9 | 14CA | 14CB | 14CC | 14CD | 14CE | 14CF |
| 4DX | 14D0 | 14D1 | 14D2 | 14D3 | 14D4 | 14D5 | 14D6 | 14D7 | 14D8 | 14D9 | 14DA | 14DB | 14DC | 14DD | 14DE | 14DF |
| 4EX | 05D7 | 14E1 | 14E2 | 14E3 | 14E4 | 14E5 | 14E6 | 14E7 | 14E8 | 14E9 | 14EA | 14EB | 14EC | 14ED | 14EE | 14EF |
| 4FX | 14F0 | 14F1 | 14F2 | 14F3 | 14F4 | 14F5 | 14F6 | 14F7 | 14F8 | 14F9 | 14FA | 14FB | 14FC | 14FD | 14FE | 14FF |
| 50X | 05D8 | 0749 | 0662 | 0663 | 0758 | 0759 | 0666 | 0667 | 0668 | 0669 | 068A | 068B | 068C | 068D | 068E | 068F |
| 51X | 074C | 074B | 0632 | 0633 | 075A | 075B | 0636 | 0637 | 0638 | 0639 | 063A | 063B | 063C | 063D | 063E | 063F |
| 52X | 05D9 | 1521 | 1522 | 1523 | 1524 | 1525 | 1526 | 1527 | 1528 | 1529 | 152A | 152B | 152C | 152D | 152E | 152F |
| 53X | 1530 | 1531 | 1532 | 1533 | 1534 | 1535 | 1536 | 1537 | 1538 | 1539 | 153A | 153B | 153C | 153D | 153E | 153F |
| 54X | 05DA | 074D | 06C2 | 06C3 | 075C | 075D | 06C6 | 06C7 | 06C8 | 06C9 | 06CA | 06CB | 06CC | 06CD | 06CE | 06CF |
| 55X | 0748 | 074F | 06E2 | 06E3 | 075E | 075F | 06E6 | 06E7 | 06E8 | 06E9 | 06EA | 06EB | 06EC | 06ED | 06EE | 06EF |
| 56X | 05DB | 1561 | 1562 | 1563 | 1564 | 1565 | 1566 | 1567 | 1568 | 1569 | 156A | 156B | 156C | 156D | 156E | 156F |
| 57X | 1570 | 1571 | 1572 | 1573 | 1574 | 1575 | 1576 | 1577 | 1578 | 1579 | 157A | 157B | 157C | 157D | 157E | 157F |
| 58X | 05DC | 1581 | 1582 | 1583 | 1584 | 1585 | 1586 | 1587 | 1588 | 1589 | 158A | 158B | 158C | 158D | 158E | 158F |
| 59X | 1590 | 1591 | 1592 | 1593 | 1594 | 1595 | 1596 | 1597 | 1598 | 1599 | 159A | 159B | 159C | 159D | 159E | 159F |
| 5AX | 05DD | 15A1 | 15A2 | 15A3 | 15A4 | 15A5 | 15A6 | 15A7 | 15A8 | 15A9 | 15AA | 15AB | 15AC | 15AD | 15AE | 15AF |
| 5BX | 15B0 | 15B1 | 15B2 | 15B3 | 15B4 | 15B5 | 15B6 | 15B7 | 15B8 | 15B9 | 15BA | 15BB | 15BC | 15BD | 15BE | 15BF |
| 5CX | 05DE | 15C1 | 15C2 | 15C3 | 15C4 | 15C5 | 15C6 | 15C7 | 15C8 | 15C9 | 15CA | 15CB | 15CC | 15CD | 15CE | 15CF |
| 5DX | 15D0 | 15D1 | 15D2 | 15D3 | 15D4 | 15D5 | 15D6 | 15D7 | 15D8 | 15D9 | 15DA | 15DB | 15DC | 15DD | 15DE | 15DF |
| 5EX | 05DF | 15E1 | 15E2 | 15E3 | 15E4 | 15E5 | 15E6 | 15E7 | 15E8 | 15E9 | 15EA | 15EB | 15EC | 15ED | 15EE | 15EF |

TABLE 10-continued

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 5FX | 15F0 | 15F1 | 15F2 | 15F3 | 15F4 | 15F5 | 15F6 | 15F7 | 15F8 | 15F9 | 15FA | 15FB | 15FC | 15FD | 15FE | 15FF |
| 60X | 05F0 | 0713 | 0769 | 1603 | 0717 | 1605 | 1606 | 1607 | 0778 | 1609 | 0779 | 160B | 160C | 160D | 160E | 160F |
| 61X | 070C | 1611 | 1612 | 1613 | 1614 | 1615 | 1616 | 1617 | 1618 | 1619 | 161A | 161B | 161C | 161D | 161E | 161F |
| 62X | 05F1 | 1621 | 076B | 1623 | 1624 | 1625 | 1626 | 1627 | 077A | 1629 | 077B | 162B | 162C | 162D | 162E | 162F |
| 63X | 1630 | 1631 | 1632 | 1633 | 1634 | 1635 | 1636 | 1637 | 1638 | 1639 | 163A | 163B | 163C | 163D | 163E | 163F |
| 64X | 05F2 | 1641 | 1642 | 1643 | 1644 | 1645 | 1646 | 1647 | 1648 | 1649 | 164A | 164B | 164C | 164D | 164E | 164F |
| 65X | 1650 | 1651 | 1652 | 1653 | 1654 | 1655 | 1656 | 1657 | 1658 | 1659 | 165A | 165B | 165C | 165D | 165E | 165F |
| 66X | 05F3 | 1661 | 1662 | 1663 | 1664 | 1665 | 1666 | 1667 | 1668 | 1669 | 166A | 166B | 166C | 166D | 166E | 166F |
| 67X | 1670 | 1671 | 1672 | 1673 | 1674 | 1675 | 1676 | 1677 | 1678 | 1679 | 167A | 167B | 167C | 167D | 167E | 167F |
| 68X | 05F4 | 1681 | 076D | 1683 | 1684 | 1685 | 1686 | 1687 | 077C | 1689 | 077D | 168B | 168C | 168D | 168E | 168F |
| 69X | 1690 | 1691 | 1692 | 1693 | 1694 | 1695 | 1696 | 1697 | 1698 | 1699 | 169A | 169B | 169C | 169D | 169E | 169F |
| 6AX | 05F5 | 16A1 | 076F | 16A3 | 16A4 | 16A5 | 16A6 | 16A7 | 077E | 16A9 | 077F | 16AB | 16AC | 16AD | 16AE | 16AF |
| 6BX | 16B0 | 16B1 | 16B2 | 16B3 | 16B4 | 16B5 | 16B6 | 16B7 | 16B8 | 16B9 | 16BA | 16BB | 16BC | 16BD | 16BE | 16BF |
| 6CX | 05F6 | 16C1 | 16C2 | 16C3 | 16C4 | 16C5 | 16C6 | 16C7 | 16C8 | 16C9 | 16CA | 16CB | 16CC | 16CD | 16CE | 16CF |
| 6DX | 16D0 | 16D1 | 16D2 | 16D3 | 16D4 | 16D5 | 16D6 | 16D7 | 16D8 | 16D9 | 16DA | 16DB | 16DC | 16DD | 16DE | 16DF |
| 6EX | 05F7 | 16E1 | 16E2 | 16E3 | 16E4 | 16E5 | 16E6 | 16E7 | 16E8 | 16E9 | 16EA | 16EB | 16EC | 16ED | 16EE | 16EF |
| 6FX | 16F0 | 16F1 | 16F2 | 16F3 | 16F4 | 16F5 | 16F6 | 16F7 | 16F8 | 16F9 | 16FA | 16FB | 16FC | 16FD | 16FE | 16FF |
| 70X | 05F8 | 1701 | 1702 | 1703 | 1704 | 1705 | 1706 | 1707 | 1708 | 1709 | 170A | 170B | 170C | 170D | 170E | 170F |
| 71X | 1710 | 1711 | 1712 | 1713 | 1714 | 1715 | 1716 | 1717 | 1718 | 1719 | 171A | 171B | 171C | 171D | 171E | 171F |
| 72X | 05F9 | 1721 | 1722 | 1723 | 1724 | 1725 | 1726 | 1727 | 1728 | 1729 | 172A | 172B | 172C | 172D | 172E | 172F |
| 73X | 1730 | 1731 | 1732 | 1733 | 1734 | 1735 | 1736 | 1737 | 1738 | 1739 | 173A | 173B | 173C | 173D | 173E | 173F |
| 74X | 05FA | 1741 | 1742 | 1743 | 1744 | 1745 | 1746 | 1747 | 1748 | 1749 | 174A | 174B | 174C | 174D | 174E | 174F |
| 75X | 1750 | 1751 | 1752 | 1753 | 1754 | 1755 | 1756 | 1757 | 1758 | 1759 | 175A | 175B | 175C | 175D | 175E | 175F |
| 76X | 05FB | 1761 | 1762 | 1763 | 1764 | 1765 | 1766 | 1767 | 1768 | 1769 | 176A | 176B | 176C | 176D | 176E | 176F |
| 77X | 1770 | 1771 | 1772 | 1773 | 1774 | 1775 | 1776 | 1777 | 1778 | 1779 | 177A | 177B | 177C | 177D | 177E | 177F |
| 78X | 05FC | 1781 | 1782 | 1783 | 1784 | 1785 | 1786 | 1787 | 1788 | 1789 | 178A | 178B | 178C | 178D | 178E | 178F |
| 79X | 1790 | 1791 | 1792 | 1793 | 1794 | 1795 | 1796 | 1797 | 1798 | 1799 | 179A | 179B | 179C | 179D | 179E | 179F |
| 7AX | 05FD | 17A1 | 17A2 | 17A3 | 17A4 | 17A5 | 17A6 | 17A7 | 17A8 | 17A9 | 17AA | 17AB | 17AC | 17AD | 17AE | 17AF |
| 7BX | 17B0 | 17B1 | 17B2 | 17B3 | 17B4 | 17B5 | 17B6 | 17B7 | 17B8 | 17B9 | 17BA | 17BB | 17BC | 17BD | 17BE | 17BF |
| 7CX | 05FE | 17C1 | 17C2 | 17C3 | 17C4 | 17C5 | 17C6 | 17C7 | 17C8 | 17C9 | 17CA | 17CB | 17CC | 17CD | 17CE | 17CF |
| 7DX | 17D0 | 17D1 | 17D2 | 17D3 | 17D4 | 17D5 | 17D6 | 17D7 | 17D8 | 17D9 | 17DA | 17DB | 17DC | 17DD | 17DE | 17DF |
| 7EX | 05FF | 17E1 | 17E2 | 17E3 | 17E4 | 17E5 | 17E6 | 17E7 | 17E8 | 17E9 | 17EA | 17EB | 17EC | 17ED | 17EE | 17EF |
| 7FX | 17F0 | 17F1 | 17F2 | 17F3 | 17F4 | 17F5 | 17F6 | 17F7 | 17F8 | 17F9 | 17FA | 17FB | 17FC | 17FD | 17FE | 17FF |
| 80X | 0670 | 0781 | 07A1 | 0613 | 0790 | 0791 | 0616 | 0617 | 07B0 | 0619 | 07B1 | 180B | 061C | 180D | 180E | 180F |
| 81X | 07A4 | 0783 | 0764 | 1813 | 0792 | 0793 | 1816 | 1817 | 0766 | 1819 | 181A | 181B | 181C | 181D | 181E | 181F |
| 82X | 0671 | 0719 | 07A3 | 1823 | 071D | 1825 | 1826 | 1827 | 07B2 | 1829 | 07B3 | 182B | 182C | 182D | 182E | 182F |
| 83X | 07A6 | 1831 | 1832 | 1833 | 1834 | 1835 | 1836 | 1837 | 1838 | 1839 | 183A | 183B | 183C | 183D | 183E | 183F |
| 84X | 0672 | 1841 | 1842 | 1843 | 1844 | 1845 | 1846 | 1847 | 076A | 1849 | 184A | 184B | 184C | 184D | 184E | 184F |
| 85X | 07A8 | 1851 | 1852 | 1853 | 1854 | 1855 | 1856 | 1857 | 1858 | 1859 | 185A | 185B | 185C | 185D | 185E | 185F |
| 86X | 0673 | 1861 | 1862 | 1863 | 1864 | 1865 | 1866 | 1867 | 1868 | 1869 | 186A | 186B | 186C | 186D | 186E | 186F |
| 87X | 1870 | 1871 | 1872 | 1873 | 071E | 1875 | 1876 | 1877 | 1878 | 1879 | 187A | 187B | 187C | 187D | 187E | 187F |
| 88X | 0674 | 1881 | 1882 | 1883 | 1884 | 1885 | 1886 | 1887 | 07B4 | 1889 | 07B5 | 188B | 188C | 188D | 188E | 188F |
| 89X | 07AA | 1891 | 1892 | 1893 | 1894 | 1895 | 1896 | 1897 | 1898 | 1899 | 189A | 189B | 189C | 189D | 189E | 189F |
| 8AX | 0675 | 18A1 | 07A7 | 18A3 | 18A4 | 18A5 | 18A6 | 18A7 | 07B6 | 18A9 | 07B7 | 18AB | 18AC | 18AD | 18AE | 18AF |
| 8BX | 18B0 | 18B1 | 18B2 | 18B3 | 18B4 | 18B5 | 18B6 | 18B7 | 18B8 | 18B9 | 18BA | 18BB | 18BC | 18BD | 18BE | 18BF |
| 8CX | 0676 | 18C1 | 18C2 | 18C3 | 18C4 | 18C5 | 18C6 | 18C7 | 18C8 | 18C9 | 18CA | 18CB | 18CC | 18CD | 18CE | 18CF |
| 8DX | 18D0 | 18D1 | 18D2 | 18D3 | 18D4 | 18D5 | 18D6 | 18D7 | 18D8 | 18D9 | 18DA | 18DB | 18DC | 18DD | 18DE | 18DF |
| 8EX | 0677 | 18E1 | 18E2 | 18E3 | 18E4 | 18E5 | 18E6 | 18E7 | 18E8 | 18E9 | 18EA | 18EB | 18EC | 18ED | 18EE | 18EF |

TABLE 10-continued

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 8FX | 18F0 | 18F1 | 18F2 | 18F3 | 18F4 | 18F5 | 18F6 | 18F7 | 18F8 | 18F9 | 18FA | 18FB | 18FC | 18FD | 18FE | 18FF |
| 90X | 0678 | 0789 | 076C | 1903 | 0798 | 0799 | 1906 | 1907 | 076C | 1909 | 190A | 190B | 190C | 190D | 190E | 190F |
| 91X | 07CC | 078B | 1912 | 1913 | 079A | 079B | 1916 | 1917 | 1918 | 1919 | 191A | 191B | 191C | 191D | 191E | 191F |
| 92X | 0679 | 1921 | 1922 | 1923 | 1924 | 1925 | 1926 | 1927 | 1928 | 1929 | 192A | 192B | 192C | 192D | 192E | 192F |
| 93X | 1930 | 1931 | 1932 | 1933 | 1934 | 1935 | 1936 | 1937 | 1938 | 1939 | 193A | 193B | 193C | 193D | 193E | 193F |
| 94X | 067A | 078D | 1942 | 1943 | 079C | 079D | 1946 | 1947 | 1948 | 1949 | 194A | 194B | 194C | 194D | 194E | 194F |
| 95X | 07C8 | 078F | 1952 | 1953 | 079E | 079F | 1956 | 1957 | 1958 | 1959 | 195A | 195B | 195C | 195D | 195E | 195F |
| 96X | 067B | 1961 | 1962 | 1963 | 1964 | 1965 | 1966 | 1967 | 1968 | 1969 | 196A | 196B | 196C | 196D | 196E | 196F |
| 97X | 1970 | 1971 | 1972 | 1973 | 1974 | 1975 | 1976 | 1977 | 1978 | 1979 | 197A | 197B | 197C | 197D | 197E | 197F |
| 98X | 067C | 1981 | 1982 | 1983 | 1984 | 1985 | 1986 | 1987 | 1988 | 1989 | 198A | 198B | 198C | 198D | 198E | 198F |
| 99X | 1990 | 1991 | 1992 | 1993 | 1994 | 1995 | 1996 | 1997 | 1998 | 1999 | 199A | 199B | 199C | 199D | 199E | 199F |
| 9AX | 067D | 19A1 | 19A2 | 19A3 | 19A4 | 19A5 | 19A6 | 19A7 | 19A8 | 19A9 | 19AA | 19AB | 19AC | 19AD | 19AE | 19AF |
| 9BX | 19B0 | 19B1 | 19B2 | 19B3 | 19B4 | 19B5 | 19B6 | 19B7 | 19B8 | 19B9 | 19BA | 19BB | 19BC | 19BD | 19BE | 19BF |
| 9CX | 067E | 19C1 | 19C2 | 19C3 | 19C4 | 19C5 | 19C6 | 19C7 | 19C8 | 19C9 | 19CA | 19CB | 19CC | 19CD | 19CE | 19CF |
| 9DX | 19D0 | 19D1 | 19D2 | 19D3 | 19D4 | 19D5 | 19D6 | 19D7 | 19D8 | 19D9 | 19DA | 19DB | 19DC | 19DD | 19DE | 19DF |
| 9EX | 067F | 19E1 | 19E2 | 19E3 | 19E4 | 19E5 | 19E6 | 19E7 | 19E8 | 19E9 | 19EA | 19EB | 19EC | 19ED | 19EE | 19EF |
| 9FX | 19F0 | 19F1 | 19F2 | 19F3 | 19F4 | 19F5 | 19F6 | 19F7 | 19F8 | 19F9 | 19FA | 19FB | 19FC | 19FD | 19FE | 19FF |
| A0X | 06B0 | 071B | 07A9 | 1A03 | 071F | 1A05 | 1A06 | 1A07 | 07B8 | 1A09 | 1A0A | 1A0B | 1A0C | 1A0D | 1A0E | 1A0F |
| A1X | 078C | 1A11 | 1A12 | 1A13 | 1A14 | 1A15 | 1A16 | 1A17 | 1A18 | 1A19 | 1A1A | 1A1B | 1A1C | 1A1D | 1A1E | 1A1F |
| A2X | 06B1 | 1A21 | 07AB | 1A23 | 1A24 | 1A25 | 1A26 | 1A27 | 07BA | 1A29 | 1A2A | 1A2B | 1A2C | 1A2D | 1A2E | 1A2F |
| A3X | 1A30 | 1A31 | 1A32 | 1A33 | 1A34 | 1A35 | 1A36 | 1A37 | 1A38 | 1A39 | 1A3A | 1A3B | 1A3C | 1A3D | 1A3E | 1A3F |
| A4X | 06B2 | 1A41 | 1A42 | 1A43 | 1A44 | 1A45 | 1A46 | 1A47 | 1A48 | 1A49 | 1A4A | 1A4B | 1A4C | 1A4D | 1A4E | 1A4F |
| A5X | 1A50 | 1A51 | 1A52 | 1A53 | 1A54 | 1A55 | 1A56 | 1A57 | 1A58 | 1A59 | 1A5A | 1A5B | 1A5C | 1A5D | 1A5E | 1A5F |
| A6X | 06B3 | 1A61 | 1A62 | 1A63 | 1A64 | 1A65 | 1A66 | 1A67 | 1A68 | 1A69 | 1A6A | 1A6B | 1A6C | 1A6D | 1A6E | 1A6F |
| A7X | 1A70 | 1A71 | 1A72 | 1A73 | 1A74 | 1A75 | 1A76 | 1A77 | 1A78 | 1A79 | 1A7A | 1A7B | 1A7C | 1A7D | 1A7E | 1A7F |
| A8X | 06B4 | 1A81 | 1A82 | 1A83 | 1A84 | 1A85 | 1A86 | 1A87 | 07BC | 1A89 | 07BD | 1A8B | 1A8C | 1A8D | 1A8E | 1A8F |
| A9X | 1A90 | 1A91 | 1A92 | 1A93 | 1A94 | 1A95 | 1A96 | 1A97 | 1A98 | 1A99 | 1A9A | 1A9B | 1A9C | 1A9D | 1A9E | 1A9F |
| AAX | 06B5 | 1AA1 | 07AF | 1AA3 | 1AA4 | 1AA5 | 1AA6 | 1AA7 | 07BE | 1AA9 | 07BF | 1AAB | 1AAC | 1AAD | 1AAE | 1AAF |
| ABX | 1AB0 | 1AB1 | 1AB2 | 1AB3 | 1AB4 | 1AB5 | 1AB6 | 1AB7 | 1AB8 | 1AB9 | 1ABA | 1ABB | 1ABC | 1ABD | 1ABE | 1ABF |
| ACX | 06B6 | 1AC1 | 1AC2 | 1AC3 | 1AC4 | 1AC5 | 1AC6 | 1AC7 | 1AC8 | 1AC9 | 1ACA | 1ACB | 1ACC | 1ACD | 1ACE | 1ACF |
| ADX | 1AD0 | 1AD1 | 1AD2 | 1AD3 | 1AD4 | 1AD5 | 1AD6 | 1AD7 | 1AD8 | 1AD9 | 1ADA | 1ADB | 1ADC | 1ADD | 1ADE | 1ADF |
| AEX | 06B7 | 1AE1 | 1AE2 | 1AE3 | 1AE4 | 1AE5 | 1AE6 | 1AE7 | 1AE8 | 1AE9 | 1AEA | 1AEB | 1AEC | 1AED | 1AEE | 1AEF |
| AFX | 1AF0 | 1AF1 | 1AF2 | 1AF3 | 1AF4 | 1AF5 | 1AF6 | 1AF7 | 1AF8 | 1AF9 | 1AFA | 1AFB | 1AFC | 1AFD | 1AFE | 1AFF |
| B0X | 06B8 | 1B01 | 1B02 | 1B03 | 1B04 | 1B05 | 1B06 | 1B07 | 1B08 | 1B09 | 1B0A | 1B0B | 1B0C | 1B0D | 1B0E | 1B0F |
| B1X | 1B10 | 1B11 | 1B12 | 1B13 | 1B14 | 1B15 | 1B16 | 1B17 | 1B18 | 1B19 | 1B1A | 1B1B | 1B1C | 1B1D | 1B1E | 1B1F |
| B2X | 06B9 | 1B21 | 1B22 | 1B23 | 1B24 | 1B25 | 1B26 | 1B27 | 1B28 | 1B29 | 1B2A | 1B2B | 1B2C | 1B2D | 1B2E | 1B2F |
| B3X | 1B30 | 1B31 | 1B32 | 1B33 | 1B34 | 1B35 | 1B36 | 1B37 | 1B38 | 1B39 | 1B3A | 1B3B | 1B3C | 1B3D | 1B3E | 1B3F |
| B4X | 06BA | 1B41 | 1B42 | 1B43 | 1B44 | 1B45 | 1B46 | 1B47 | 1B48 | 1B49 | 1B4A | 1B4B | 1B4C | 1B4D | 1B4E | 1B4F |
| B5X | 1B50 | 1B51 | 1B52 | 1B53 | 1B54 | 1B55 | 1B56 | 1B57 | 1B58 | 1B59 | 1B5A | 1B5B | 1B5C | 1B5D | 1B5E | 1B5F |
| B6X | 06BB | 1B61 | 1B62 | 1B63 | 1B64 | 1B65 | 1B66 | 1B67 | 1B68 | 1B69 | 1B6A | 1B6B | 1B6C | 1B6D | 1B6E | 1B6F |
| B7X | 1B70 | 1B71 | 1B72 | 1B73 | 1B74 | 1B75 | 1B76 | 1B77 | 1B78 | 1B79 | 1B7A | 1B7B | 1B7C | 1B7D | 1B7E | 1B7F |
| B8X | 06BC | 1B81 | 1B82 | 1B83 | 1B84 | 1B85 | 1B86 | 1B87 | 1B88 | 1B89 | 1B8A | 1B8B | 1B8C | 1B8D | 1B8E | 1B8F |
| B9X | 1B90 | 1B91 | 1B92 | 1B93 | 1B94 | 1B95 | 1B96 | 1B97 | 1B98 | 1B99 | 1B9A | 1B9B | 1B9C | 1B9D | 1B9E | 1B9F |
| BAX | 06BD | 1BA1 | 1BA2 | 1BA3 | 1BA4 | 1BA5 | 1BA6 | 1BA7 | 1BA8 | 1BA9 | 1BAA | 1BAB | 1BAC | 1BAD | 1BAE | 1BAF |
| BBX | 1BB0 | 1BB1 | 1BB2 | 1BB3 | 1BB4 | 1BB5 | 1BB6 | 1BB7 | 1BB8 | 1BB9 | 1BBA | 1BBB | 1BBC | 1BBD | 1BBE | 1BBF |
| BCX | 06BE | 1BC1 | 1BC2 | 1BC3 | 1BC4 | 1BC5 | 1BC6 | 1BC7 | 1BC8 | 1BC9 | 1BCA | 1BCB | 1BCC | 1BCD | 1BCE | 1BCF |
| BDX | 1BD0 | 1BD1 | 1BD2 | 1BD3 | 1BD4 | 1BD5 | 1BD6 | 1BD7 | 1BD8 | 1BD9 | 1BDA | 1BDB | 1BDC | 1BDD | 1BDE | 1BDF |
| BEX | 06BF | 1BE1 | 1BE2 | 1BE3 | 1BE4 | 1BE5 | 1BE6 | 1BE7 | 1BE8 | 1BE9 | 1BEA | 1BEB | 1BEC | 1BED | 1BEE | 1BEF |

TABLE 10-continued

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| BFX | 1BF0 | 1BF1 | 1BF2 | 1BF3 | 1BF4 | 1BF5 | 1BF6 | 1BF7 | 1BF8 | 1BF9 | 1BFA | 1BFB | 1BFC | 1BFD | 1BFE | 1BFF |
| C0X | 06D0 | 07C1 | 07E1 | 07E2 | 07D0 | 07D1 | 1C06 | 1C07 | 07F0 | 1C09 | 07F1 | 1C0B | 1C0C | 1C0D | 1C0E | 1C0F |
| C1X | 07E8 | 1C21 | 1C12 | 1C13 | 07D2 | 07D3 | 1C16 | 1C17 | 1C18 | 1C19 | 1C1A | 1C1B | 1C1C | 1C1D | 1C1E | 1C1F |
| C2X | 06D1 | 1C31 | 07E3 | 1C23 | 1C24 | 1C25 | 1C26 | 1C27 | 07F2 | 1C29 | 07F3 | 1C2B | 1C2C | 1C2D | 1C2E | 1C2F |
| C3X | 1C30 | 1C31 | 1C32 | 1C33 | 1C34 | 1C35 | 1C36 | 1C37 | 1C38 | 1C39 | 1C3A | 1C3B | 1C3C | 1C3D | 1C3E | 1C3F |
| C4X | 06D2 | 07C5 | 1C42 | 1C43 | 07D4 | 1C45 | 1C46 | 1C47 | 1C48 | 1C49 | 1C4A | 1C4B | 1C4C | 1C4D | 1C4E | 1C4F |
| C5X | 07EA | 07C7 | 1C52 | 1C53 | 07D6 | 07D7 | 1C56 | 1C57 | 1C58 | 1C59 | 1C5A | 1C5B | 1C5C | 1C5D | 1C5E | 1C5F |
| C6X | 06D3 | 1C61 | 1C62 | 1C63 | 1C64 | 1C65 | 1C66 | 1C67 | 1C68 | 1C69 | 1C6A | 1C6B | 1C6C | 1C6D | 1C6E | 1C6F |
| C7X | 1C70 | 1C71 | 1C72 | 1C73 | 1C74 | 1C75 | 1C76 | 1C77 | 1C78 | 1C79 | 1C7A | 1C7B | 1C7C | 1C7D | 1C7E | 1C7F |
| C8X | 06D4 | 1C81 | 07E5 | 1C83 | 1C84 | 1C85 | 1C86 | 1C87 | 07F4 | 1C89 | 07F5 | 1C8B | 1C8C | 1C8D | 1C8E | 1C8F |
| C9X | 1C90 | 1C91 | 1C92 | 1C93 | 1C94 | 1C95 | 1C96 | 1C97 | 1C98 | 1C99 | 1C9A | 1C9B | 1C9C | 1C9D | 1C9E | 1C9F |
| CAX | 06D5 | 1CA1 | 07E7 | 1CA3 | 1CA4 | 1CA5 | 1CA6 | 1CA7 | 07F6 | 1CA9 | 07F7 | 1CAB | 1CAC | 1CAD | 1CAE | 1CAF |
| CBX | 1CB0 | 1CB1 | 1CB2 | 1CB3 | 1CB4 | 1CB5 | 1CB6 | 1CB7 | 1CB8 | 1CB9 | 1CBA | 1CBB | 1CBC | 1CBD | 1CBE | 1CBF |
| CCX | 06D6 | 1CC1 | 1CC2 | 1CC3 | 1CC4 | 1CC5 | 1CC6 | 1CC7 | 1CC8 | 1CC9 | 1CCA | 1CCB | 1CCC | 1CCD | 1CCE | 1CCF |
| CDX | 1CD0 | 1CD1 | 1CD2 | 1CD3 | 1CD4 | 1CD5 | 1CD6 | 1CD7 | 1CD8 | 1CD9 | 1CDA | 1CDB | 1CDC | 1CDD | 1CDE | 1CDF |
| CEX | 06D7 | 1CE1 | 1CE2 | 1CE3 | 1CE4 | 1CE5 | 1CE6 | 1CE7 | 1CE8 | 1CE9 | 1CEA | 1CEB | 1CEC | 1CED | 1CEE | 1CEF |
| CFX | 1CF0 | 1CF1 | 1CF2 | 1CF3 | 1CF4 | 1CF5 | 1CF6 | 1CF7 | 1CF8 | 1CF9 | 1CFA | 1CFB | 1CFC | 1CFD | 1CFE | 1CFF |
| D0X | 06D8 | 1D01 | 1D02 | 1D03 | 07D8 | 07D9 | 1D06 | 1D07 | 1D08 | 1D09 | 1D0A | 1D0B | 1D0C | 1D0D | 1D0E | 1D0F |
| D1X | 07EC | 07C9 | 1D12 | 1D13 | 07DA | 07DB | 1D16 | 1D17 | 1D18 | 1D19 | 1D1A | 1D1B | 1D1C | 1D1D | 1D1E | 1D1F |
| D2X | 06D9 | 1D21 | 1D22 | 1D23 | 1D24 | 1D25 | 1D26 | 1D27 | 1D28 | 1D29 | 1D2A | 1D2B | 1D2C | 1D2D | 1D2E | 1D2F |
| D3X | 1D30 | 1D31 | 1D32 | 1D33 | 1D34 | 1D35 | 1D36 | 1D37 | 1D38 | 1D39 | 1D3A | 1D3B | 1D3C | 1D3D | 1D3E | 1D3F |
| D4X | 06DA | 07CD | 1D42 | 1D43 | 07DC | 07DD | 1D46 | 1D47 | 1D48 | 1D49 | 1D4A | 1D4B | 1D4C | 1D4D | 1D4E | 1D4F |
| D5X | 07EE | 07CF | 1D52 | 1D53 | 07DE | 07DF | 1D56 | 1D57 | 1D58 | 1D59 | 1D5A | 1D5B | 1D5C | 1D5D | 1D5E | 1D5F |
| D6X | 06DB | 1D61 | 1D62 | 1D63 | 1D64 | 1D65 | 1D66 | 1D67 | 1D68 | 1D69 | 1D6A | 1D6B | 1D6C | 1D6D | 1D6E | 1D6F |
| D7X | 1D70 | 1D71 | 1D72 | 1D73 | 1D74 | 1D75 | 1D76 | 1D77 | 1D78 | 1D79 | 1D7A | 1D7B | 1D7C | 1D7D | 1D7E | 1D7F |
| D8X | 06DC | 1D81 | 1D82 | 1D83 | 1D84 | 1D85 | 1D86 | 1D87 | 1D88 | 1D89 | 1D8A | 1D8B | 1D8C | 1D8D | 1D8E | 1D8F |
| D9X | 1D90 | 1D91 | 1D92 | 1D93 | 1D94 | 1D95 | 1D96 | 1D97 | 1D98 | 1D99 | 1D9A | 1D9B | 1D9C | 1D9D | 1D9E | 1D9F |
| DAX | 06DD | 1DA1 | 1DA2 | 1DA3 | 1DA4 | 1DA5 | 1DA6 | 1DA7 | 1DA8 | 1DA9 | 1DAA | 1DAB | 1DAC | 1DAD | 1DAE | 1DAF |
| DBX | 1DB0 | 1DB1 | 1DB2 | 1DB3 | 1DB4 | 1DB5 | 1DB6 | 1DB7 | 1DB8 | 1DB9 | 1DBA | 1DBB | 1DBC | 1DBD | 1DBE | 1DBF |
| DCX | 06DE | 1DC1 | 1DC2 | 1DC3 | 1DC4 | 1DC5 | 1DC6 | 1DC7 | 1DC8 | 1DC9 | 1DCA | 1DCB | 1DCC | 1DCD | 1DCE | 1DCF |
| DDX | 1DD0 | 1DD1 | 1DD2 | 1DD3 | 1DD4 | 1DD5 | 1DD6 | 1DD7 | 1DD8 | 1DD9 | 1DDA | 1DDB | 1DDC | 1DDD | 1DDE | 1DDF |
| DEX | 06DF | 1DE1 | 1DE2 | 1DE3 | 1DE4 | 1DE5 | 1DE6 | 1DE7 | 1DE8 | 1DE9 | 1DEA | 1DEB | 1DEC | 1DED | 1DEE | 1DEF |
| DFX | 1DF0 | 1DF1 | 1DF2 | 1DF3 | 1DF4 | 1DF5 | 1DF6 | 1DF7 | 1DF8 | 1DF9 | 1DFA | 1DFB | 1DFC | 1DFD | 1DFE | 1DFF |
| E0X | 06F0 | 07E4 | 07E9 | 1E03 | 1E04 | 1E05 | 1E06 | 1E07 | 07F8 | 1E09 | 07F9 | 1E0B | 1E0C | 1E0D | 1E0E | 1E0F |
| E1X | 1E10 | 1E11 | 1E12 | 1E13 | 1E14 | 1E15 | 1E16 | 1E17 | 1E18 | 1E19 | 1E1A | 1E1B | 1E1C | 1E1D | 1E1E | 1E1F |
| E2X | 06F1 | 1E21 | 1E22 | 1E23 | 1E24 | 1E25 | 1E26 | 1E27 | 1E28 | 1E29 | 1E2A | 1E2B | 1E2C | 1E2D | 1E2E | 1E2F |
| E3X | 1E30 | 1E31 | 1E32 | 1E33 | 1E34 | 1E35 | 1E36 | 1E37 | 1E38 | 1E39 | 1E3A | 1E3B | 1E3C | 1E3D | 1E3E | 1E3F |
| E4X | 06F2 | 1E41 | 1E42 | 1E43 | 1E44 | 1E45 | 1E46 | 1E47 | 1E48 | 1E49 | 1E4A | 1E4B | 1E4C | 1E4D | 1E4E | 1E4F |
| E5X | 1E50 | 1E51 | 1E52 | 1E53 | 1E54 | 1E55 | 1E56 | 1E57 | 1E58 | 1E59 | 1E5A | 1E5B | 1E5C | 1E5D | 1E5E | 1E5F |
| E6X | 06F3 | 1E61 | 1E62 | 1E63 | 1E64 | 1E65 | 1E66 | 1E67 | 1E68 | 1E69 | 1E6A | 1E6B | 1E6C | 1E6D | 1E6E | 1E6F |
| E7X | 1E70 | 1E71 | 1E72 | 1E73 | 1E74 | 1E75 | 1E76 | 1E77 | 1E78 | 1E79 | 1E7A | 1E7B | 1E7C | 1E7D | 1E7E | 1E7F |
| E8X | 06F4 | 1E81 | 1E82 | 1E83 | 1E84 | 1E85 | 1E86 | 1E87 | 1E88 | 1E89 | 1E8A | 1E8B | 1E8C | 1E8D | 1E8E | 1E8F |
| E9X | 1E90 | 1E91 | 1E92 | 1E93 | 1E94 | 1E95 | 1E96 | 1E97 | 1E98 | 1E99 | 1E9A | 1E9B | 1E9C | 1E9D | 1E9E | 1E9F |
| EAX | 06F5 | 1EA1 | 1E92 | 1EA3 | 1EA4 | 1EA5 | 1EA6 | 1EA7 | 1E98 | 1EA9 | 07FF | 1EAB | 1EAC | 1EAD | 1EAE | 1EAF |
| EBX | 1EB0 | 1EB1 | 1EB2 | 1EB3 | 1EB4 | 1EB5 | 1EB6 | 1EB7 | 1EB8 | 1EB9 | 1EBA | 1EBB | 1EBC | 1EBD | 1EBE | 1EBF |
| ECX | 06F6 | 1EC1 | 1EC2 | 1EC3 | 1EC4 | 1EC5 | 1EC6 | 1EC7 | 1EC8 | 1EC9 | 1ECA | 1ECB | 1ECC | 1ECD | 1ECE | 1ECF |
| EDX | 1ED0 | 1ED1 | 1ED2 | 1ED3 | 1ED4 | 1ED5 | 1ED6 | 1ED7 | 1ED8 | 1ED9 | 1EDA | 1EDB | 1EDC | 1EDD | 1EDE | 1EDF |
| EEX | 06F7 | 1EE1 | 1EE2 | 1EE3 | 1EE4 | 1EE5 | 1EE6 | 1EE7 | 1EE8 | 1EE9 | 1EEA | 1EEB | 1EEC | 1EED | 1EEE | 1EEF |

TABLE 10-continued

State 0 of 14-bit code word for 24/25 (0,7/7) code

|     | 0    | 1    | 2    | 3    | 4    | 5    | 6    | 7    | 8    | 9    | A    | B    | C    | D    | E    | F    |
|-----|------|------|------|------|------|------|------|------|------|------|------|------|------|------|------|------|
| EFX | 1EF0 | 1EF1 | 1EF2 | 1EF3 | 1EF4 | 1EF5 | 1EF6 | 1EF7 | 1EF8 | 1EF9 | 1EFA | 1EFB | 1EFC | 1EFD | 1EFE | 1EFF |
| F0X | 06F8 | 1F01 | 1F02 | 1F03 | 1F04 | 1F05 | 1F06 | 1F07 | 1F08 | 1F09 | 1F0A | 1F0B | 1F0C | 1F0D | 1F0E | 1F0F |
| F1X | 1F10 | 1F11 | 1F12 | 1F13 | 1F14 | 1F15 | 1F16 | 1F17 | 1F18 | 1F19 | 1F1A | 1F1B | 1F1C | 1F1D | 1F1E | 1F1F |
| F2X | 06F9 | 1F21 | 1F22 | 1F23 | 1F24 | 1F25 | 1F26 | 1F27 | 1F28 | 1F29 | 1F2A | 1F2B | 1F2C | 1F2D | 1F2E | 1F2F |
| F3X | 1F30 | 1F31 | 1F32 | 1F33 | 1F34 | 1F35 | 1F36 | 1F37 | 1F38 | 1F39 | 1F3A | 1F3B | 1F3C | 1F3D | 1F3E | 1F3F |
| F4X | 06FA | 1F41 | 1F42 | 1F43 | 1F44 | 1F45 | 1F46 | 1F47 | 1F48 | 1F49 | 1F4A | 1F4B | 1F4C | 1F4D | 1F4E | 1F4F |
| F5X | 1F50 | 1F51 | 1F52 | 1F53 | 1F54 | 1F55 | 1F56 | 1F57 | 1F58 | 1F59 | 1F5A | 1F5B | 1F5C | 1F5D | 1F5E | 1F5F |
| F6X | 06FB | 1F61 | 1F62 | 1F63 | 1F64 | 1F65 | 1F66 | 1F67 | 1F68 | 1F69 | 1F6A | 1F6B | 1F6C | 1F6D | 1F6E | 1F6F |
| F7X | 1F70 | 1F71 | 1F72 | 1F73 | 1F74 | 1F75 | 1F76 | 1F77 | 1F78 | 1F79 | 1F7A | 1F7B | 1F7C | 1F7D | 1F7E | 1F7F |
| F8X | 06FC | 1F81 | 1F82 | 1F83 | 1F84 | 1F85 | 1F86 | 1F87 | 1F88 | 1F89 | 1F8A | 1F8B | 1F8C | 1F8D | 1F8E | 1F8F |
| F9X | 1F90 | 1F91 | 1F92 | 1F93 | 1F94 | 1F95 | 1F96 | 1F97 | 1F98 | 1F99 | 1F9A | 1F9B | 1F9C | 1F9D | 1F9E | 1F9F |
| FAX | 06FD | 1FA1 | 1FA2 | 1FA3 | 1FA4 | 1FA5 | 1FA6 | 1FA7 | 1FA8 | 1FA9 | 1FAA | 1FAB | 1FAC | 1FAD | 1FAE | 1FAF |
| FBX | 1FB0 | 1FB1 | 1FB2 | 1FB3 | 1FB4 | 1FB5 | 1FB6 | 1FB7 | 1FB8 | 1FB9 | 1FBA | 1FBB | 1FBC | 1FBD | 1FBE | 1FBF |
| FCX | 06FE | 1FC1 | 1FC2 | 1FC3 | 1FC4 | 1FC5 | 1FC6 | 1FC7 | 1FC8 | 1FC9 | 1FCA | 1FCB | 1FCC | 1FCD | 1FCE | 1FCF |
| FDX | 1FD0 | 1FD1 | 1FD2 | 1FD3 | 1FD4 | 1FD5 | 1FD6 | 1FD7 | 1FD8 | 1FD9 | 1FDA | 1FDB | 1FDC | 1FDD | 1FDE | 1FDF |
| FEX | 06FF | 1FE1 | 1FE2 | 1FE3 | 1FE4 | 1FE5 | 1FE6 | 1FE7 | 1FE8 | 1FE9 | 1FEA | 1FEB | 1FEC | 1FED | 1FEE | 1FEF |
| FFX | 1FF0 | 1FF1 | 1FF2 | 1FF3 | 1FF4 | 1FF5 | 1FF6 | 1FF7 | 1FF8 | 1FF9 | 1FFA | 1FFB | 1FFC | 1FFD | 1FFE | 1FFF |

Table 11 below is an encoding table for the 14-bit encoder when the state S1 is active. The arrangement of Table 11 is similar to Table 10. In Table 11, the state S1 is indicated at the top of the table to be active.

TABLE 11

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 00X | 0D70 | 0CE1 | 0F21 | 0D03 | 0CF0 | 0CF1 | 0D06 | 0D07 | 0F30 | 0D09 | 0F31 | 0D0B | 0D0C | 0D0D | 0D0E | 0D0F |
| 01X | 0C73 | 0CE3 | 0E1E | 0D33 | 0CF2 | 0CF3 | 0D36 | 0D37 | 0C5E | 0D39 | 0D3A | 0D3B | 0D3C | 0D3D | 0D3E | 0D3F |
| 02X | 0D71 | 0D21 | 0F23 | 0D23 | 0D24 | 0D25 | 0D26 | 0D27 | 0F32 | 0D29 | 0F33 | 0D2B | 0D2C | 0D2D | 0D2E | 0D2F |
| 03X | 0C7C | 0E4C | 0E1C | 2033 | 0E4D | 2035 | 2036 | 2037 | 0C5C | 2039 | 203A | 203B | 203C | 203D | 203E | 203F |
| 04X | 0D72 | 0C35 | 0E1B | 0D43 | 0CF4 | 0CF5 | 0D46 | 0D47 | 0C3A | 0D49 | 0D4A | 0D4B | 0D4C | 0D4D | 0D4E | 0D4F |
| 05X | 0C7A | 0CE7 | 0E1A | 2053 | 0CF6 | 0CF7 | 2056 | 2057 | 0C5A | 2059 | 205A | 204B | 204C | 204D | 204E | 204F |
| 06X | 0C7A | 0E48 | 0E19 | 2063 | 0E49 | 2065 | 2066 | 2067 | 2078 | 2069 | 206A | 205B | 205C | 205D | 205E | 205F |
| 07X | 0D73 | 2071 | 2072 | 2073 | 2074 | 2075 | 2076 | 2077 | 0C38 | 2079 | 207A | 206B | 206C | 206D | 206E | 206F |
| 08X | 0D74 | 0D91 | 0F25 | 0D93 | 0D94 | 0D95 | 0D96 | 0D97 | 0F34 | 0D99 | 0F35 | 0D9B | 0D9C | 0D9D | 0D9E | 0D9F |
| 09X | 0C78 | 0E46 | 0E16 | 2093 | 0D94 | 2095 | 2096 | 2097 | 2078 | 2099 | 209A | 209B | 209C | 209D | 209E | 209F |
| 0AX | 0C76 | 0D61 | 0F27 | 0D63 | 0E47 | 0D65 | 0D66 | 0D67 | 2078 | 0D69 | 0F37 | 0D6B | 0D6C | 0D6D | 0D6E | 0D6F |
| 0BX | 0C74 | 20B1 | 20B2 | 20B3 | 20B4 | 20B5 | 20B6 | 20B7 | 20B8 | 20B9 | 20BA | 20BB | 20BC | 20BD | 20BE | 20BF |
| 0CX | 0D76 | 0E42 | 0E13 | 20C3 | 0E43 | 20C5 | 20C6 | 20C7 | 0C32 | 20C9 | 20CA | 20CB | 20CC | 20CD | 20CE | 20CF |
| 0DX | 0C72 | 20D1 | 20D2 | 20D3 | 20D4 | 20D5 | 20D6 | 20D7 | 20D8 | 20D9 | 20DA | 20DB | 20DC | 20DD | 20DE | 20DF |
| 0EX | 0D77 | 20E1 | 20E2 | 20E3 | 20E4 | 20E5 | 20E6 | 20E7 | 20E8 | 20E9 | 20EA | 20EB | 20EC | 20ED | 20EE | 20EF |
| 0FX | 20F0 | 20F1 | 20F2 | 20F3 | 20F4 | 20F5 | 20F6 | 20F7 | 20F8 | 20F9 | 20FA | 20FB | 20FC | 20FD | 20FE | 20FF |
| 10X | 0D78 | 0CE9 | 0E3F | 0D53 | 0CF8 | 0CF9 | 0D56 | 0D57 | 0C3F | 0D59 | 0D5A | 0D5B | 0D5C | 0D5D | 0D5E | 0D5F |
| 11X | 0C7F | 0CEB | 0E3E | 2113 | 0CFA | 0CFB | 2116 | 2117 | 0C5F | 2119 | 211A | 211B | 211C | 211D | 211E | 211F |
| 12X | 0D79 | 0E5C | 0E3D | 2123 | 035D | 2125 | 2126 | 2127 | 0C3D | 2129 | 212A | 212B | 212C | 212D | 212E | 212F |
| 13X | 0C7D | 2131 | 2132 | 2133 | 2134 | 2135 | 2136 | 2137 | 2138 | 2139 | 213A | 213B | 213C | 213D | 213E | 213F |
| 14X | 0D7A | 0CED | 0E3B | 2143 | 0CFC | 0CFD | 2146 | 2147 | 0C3B | 2149 | 214A | 214B | 214C | 214D | 214E | 214F |
| 15X | 0C7B | 0CEF | 2152 | 2153 | 0CFE | 0CFF | 2156 | 2157 | 2158 | 2159 | 215A | 215B | 215C | 215D | 215E | 215F |
| 16X | 2170 | 2161 | 2162 | 2163 | 2164 | 2165 | 2166 | 2167 | 2168 | 2169 | 216A | 216B | 216C | 216D | 216E | 216F |
| 17X | 0D7B | 2171 | 2172 | 2173 | 2174 | 2175 | 2176 | 2177 | 2178 | 2179 | 217A | 217B | 217C | 217D | 217E | 217F |
| 18X | 0D7C | 0E56 | 0E37 | 2183 | 0E57 | 2185 | 2186 | 2187 | 2198 | 2189 | 218A | 218B | 218C | 218D | 218E | 218F |
| 19X | 0C77 | 2191 | 2192 | 2193 | 2194 | 2195 | 2196 | 2197 | 2198 | 2199 | 219A | 219B | 219C | 219D | 219E | 219F |
| 1AX | 0D7D | 21A1 | 21A2 | 21A3 | 21A4 | 21A5 | 21A6 | 21A7 | 21A8 | 21A9 | 21AA | 21AB | 21AC | 21AD | 21AE | 21AF |
| 1BX | 21B0 | 21B1 | 21B2 | 21B3 | 21B4 | 21B5 | 21B6 | 21B7 | 21B8 | 21B9 | 21BA | 21BB | 21BC | 21BD | 21BE | 21BF |
| 1CX | 0D7E | 21C1 | 21C2 | 21C3 | 21C4 | 21C5 | 21C6 | 21C7 | 21C8 | 21C9 | 21CA | 21CB | 21CC | 21CD | 21CE | 21CF |
| 1DX | 21D0 | 21D1 | 21D2 | 21D3 | 21D4 | 21D5 | 21D6 | 21D7 | 21D8 | 21D9 | 21DA | 21DB | 21DC | 21DD | 21DE | 21DF |
| 1EX | 0D7F | 21E1 | 21E2 | 21E3 | 21E4 | 21E5 | 21E6 | 21E7 | 21E8 | 21E9 | 21EA | 21EB | 21EC | 21ED | 21EE | 21EF |
| 1FX | 21F0 | 21F1 | 21F2 | 21F3 | 21F4 | 21F5 | 21F6 | 21F7 | 21F8 | 21F9 | 21FA | 21FB | 21FC | 21FD | 21FE | 21FF |
| 20X | 0DB0 | 0D81 | 0F29 | 0D83 | 0D84 | 0D85 | 0D86 | 0D87 | 0F38 | 0D89 | 0F39 | 0D8B | 0D8C | 0D8D | 0D8E | 0D8F |
| 21X | 0C6E | 0E5E | 0E31 | 2213 | 0E5F | 2215 | 2216 | 2217 | 0C4E | 2219 | 221A | 221B | 221C | 221D | 221E | 221F |
| 22X | 0DB1 | 0DA1 | 0F2B | 0DA3 | 0DA4 | 0DA5 | 0DA6 | 0DA7 | 0F3A | 0DA9 | 0F3B | 0DAB | 0DAC | 0DAD | 0DAE | 0DAF |
| 23X | 0C6C | 0DA1 | 2232 | 2233 | 2234 | 2235 | 2236 | 2237 | 2238 | 2239 | 223A | 223B | 223C | 223D | 223E | 223F |
| 24X | 0DB2 | 0E5A | 0E34 | 2243 | 0E5B | 2245 | 2246 | 2247 | 0C2B | 2249 | 224A | 224B | 224C | 224D | 224E | 224F |
| 25X | 0C6A | 2251 | 2252 | 2253 | 2254 | 2255 | 2256 | 2257 | 2258 | 2259 | 225A | 225B | 225C | 225D | 225E | 225F |
| 26X | 0DB3 | 2261 | 2262 | 2263 | 2264 | 2265 | 2266 | 2267 | 2268 | 2269 | 226A | 226B | 226C | 226D | 226E | 226F |
| 27X | 2270 | 2271 | 2272 | 2273 | 2274 | 2275 | 2276 | 2277 | 2278 | 2279 | 227A | 227B | 227C | 227D | 227E | 227F |
| 28X | 0DB4 | 0DC1 | 0F2D | 0DC3 | 0DC4 | 0DC5 | 0DC6 | 0DC7 | 0F3C | 0DC9 | 0F3D | 0DC8 | 0DCC | 0DCD | 0DCE | 0DCF |
| 29X | 0C66 | 2291 | 2292 | 2293 | 2294 | 2295 | 2296 | 2297 | 2298 | 2299 | 229A | 229B | 229C | 229D | 229E | 229F |
| 2AX | 0D85 | 0DE1 | 0F2F | 0DE3 | 0DE4 | 0DE5 | 0DE6 | 0DE7 | 0F3E | 0DE9 | 0F3F | 0DEB | 0DEC | 0DED | 0DEE | 0DEF |
| 2BX | 22B0 | 22B1 | 22B2 | 22B3 | 22B4 | 22B5 | 22B6 | 22B7 | 22B8 | 22B9 | 22BA | 22BB | 22BC | 22BD | 22BE | 22BF |
| 2CX | 0DB6 | 22C1 | 22C2 | 22C3 | 22C4 | 22C5 | 22C6 | 22C7 | 22C8 | 22C9 | 22CA | 22CB | 22CC | 22CD | 22CE | 22CF |
| 2DX | 0DD0 | 22D1 | 22D2 | 22D3 | 22D4 | 22D5 | 22D6 | 22D7 | 22D8 | 22D9 | 22DA | 22DB | 22DC | 22DD | 22DE | 22DF |
| 2EX | 0DB7 | 22E1 | 22E2 | 22E3 | 22E4 | 22E5 | 22E6 | 22E7 | 22E8 | 22E9 | 22EA | 22EB | 22EC | 22ED | 22EE | 22EF |

TABLE 11-continued

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 2FX | 22F0 | 22F1 | 22F2 | 22F3 | 22F4 | 22F5 | 22F6 | 22F7 | 22F8 | 22F9 | 22FA | 22FB | 22FC | 22FD | 22FE | 22FF |
| 30X | 0DB8 | 0E50 | 0E30 | 2303 | 0E51 | 2305 | 2306 | 2307 | 0C2F | 2309 | 230A | 230B | 230C | 230D | 230E | 230F |
| 31X | 0C6F | 2311 | 2312 | 2313 | 2314 | 2315 | 2316 | 2317 | 2318 | 2319 | 231A | 231B | 231C | 231D | 231E | 231F |
| 32X | 0DB9 | 2321 | 2322 | 2323 | 2324 | 2325 | 2326 | 2327 | 2328 | 2329 | 232A | 232B | 232C | 232D | 232E | 232F |
| 33X | 2330 | 2331 | 2332 | 2333 | 2334 | 2335 | 2336 | 2337 | 2338 | 2339 | 233A | 233B | 233C | 233D | 233E | 233F |
| 34X | 0DBA | 2341 | 2342 | 2343 | 2344 | 2345 | 2346 | 2347 | 2348 | 2349 | 234A | 234B | 234C | 234D | 234E | 234F |
| 35X | 2350 | 2351 | 2352 | 2353 | 2354 | 2355 | 2356 | 2357 | 2358 | 2359 | 235A | 235B | 235C | 235D | 235E | 235F |
| 36X | 0DBB | 2361 | 2362 | 2363 | 2364 | 2365 | 2366 | 2367 | 2368 | 2369 | 236A | 236B | 236C | 236D | 236E | 236F |
| 37X | 2370 | 2371 | 2372 | 2373 | 2374 | 2375 | 2376 | 2377 | 2378 | 2379 | 237A | 237B | 237C | 237D | 237E | 237F |
| 38X | 0DBC | 2381 | 2382 | 2383 | 2384 | 2385 | 2386 | 2387 | 2388 | 2389 | 238A | 238B | 238C | 238D | 238E | 238F |
| 39X | 2390 | 2391 | 2392 | 2393 | 2394 | 2395 | 2396 | 2397 | 2398 | 2399 | 239A | 239B | 239C | 239D | 239E | 239F |
| 3AX | 0DBD | 23A1 | 23A2 | 23A3 | 23A4 | 23A5 | 23A6 | 23A7 | 23A8 | 23A9 | 23AA | 23AB | 23AC | 23AD | 23AE | 23AF |
| 3BX | 23B0 | 23B1 | 23B2 | 23B3 | 23B4 | 23B5 | 23B6 | 23B7 | 23B8 | 23B9 | 23BA | 23BB | 23BC | 23BD | 23BE | 23BF |
| 3CX | 0DBE | 23C1 | 23C2 | 23C3 | 23C4 | 23C5 | 23C6 | 23C7 | 23C8 | 23C9 | 23CA | 23CB | 23CC | 23CD | 23CE | 23CF |
| 3DX | 23D0 | 23D1 | 23D2 | 23D3 | 23D4 | 23D5 | 23D6 | 23D7 | 23D8 | 23D9 | 23DA | 23DB | 23DC | 23DD | 23DE | 23DF |
| 3EX | 0DBF | 23E1 | 23E2 | 23E3 | 23E4 | 23E5 | 23E6 | 23E7 | 23E8 | 23E9 | 23EA | 23EB | 23EC | 23ED | 23EE | 23EF |
| 3FX | 23F0 | 23F1 | 23F2 | 23F3 | 23F4 | 23F5 | 23F6 | 23F7 | 23F8 | 23F9 | 23FA | 23FB | 23FC | 23FD | 23FE | 23FF |
| 40X | 0DD0 | 0F41 | 0F61 | 0F13 | 0F50 | 0F51 | 0F12 | 2407 | 0F70 | 0F19 | 0F71 | 240B | 0F18 | 240D | 240E | 240F |
| 41X | 0F08 | 0F43 | 0F02 | 2413 | 0F52 | 0F53 | 2416 | 2417 | 0F04 | 2419 | 241A | 241B | 241C | 241D | 241E | 241F |
| 42X | 0DD1 | 0F11 | 0F63 | 2423 | 0F10 | 2425 | 2426 | 2427 | 0F72 | 2429 | 0F73 | 242B | 242C | 242D | 242E | 242F |
| 43X | 0F28 | 0F45 | 2432 | 2433 | 2434 | 2435 | 2436 | 2437 | 2438 | 2439 | 243A | 243B | 243C | 243D | 243E | 243F |
| 44X | 0DD2 | 0F47 | 0F22 | 2443 | 0F54 | 0F55 | 2446 | 2447 | 0F24 | 2449 | 244A | 244B | 244C | 244D | 244E | 244F |
| 45X | 0F0A | 2451 | 2452 | 2453 | 2454 | 2455 | 2456 | 2457 | 2458 | 2459 | 245A | 245B | 245C | 245D | 245E | 245F |
| 46X | 0DD3 | 2461 | 2462 | 2463 | 2464 | 2465 | 2466 | 2467 | 2468 | 2469 | 246A | 246B | 246C | 246D | 246E | 246F |
| 47X | 2470 | 2471 | 2472 | 2473 | 2474 | 2475 | 2476 | 2477 | 2478 | 2479 | 247A | 247B | 247C | 247D | 247E | 247F |
| 48X | 0DD4 | 0F15 | 0F65 | 2483 | 0F14 | 2485 | 2486 | 2487 | 0F74 | 2489 | 0F75 | 248B | 248C | 248D | 248E | 248F |
| 49X | 0F0C | 2491 | 2492 | 2493 | 2494 | 2495 | 2496 | 2497 | 2498 | 2499 | 249A | 249B | 249C | 249D | 249E | 249F |
| 4AX | 0DD5 | 24A1 | 0F67 | 24A3 | 24A4 | 24A5 | 24A6 | 24A7 | 0F76 | 24A9 | 0F77 | 24AB | 24AC | 24AD | 24AE | 24AF |
| 4BX | 24B0 | 24B1 | 24B2 | 24B3 | 24B4 | 24B5 | 24B6 | 24B7 | 24B8 | 24B9 | 24BA | 24BB | 24BC | 24BD | 24BE | 24BF |
| 4CX | 0DD6 | 24C1 | 24C2 | 24C3 | 24C4 | 24C5 | 24C6 | 24C7 | 24C8 | 24C9 | 24CA | 24CB | 24CC | 24CD | 24CE | 24CF |
| 4DX | 24D0 | 24D1 | 24D2 | 24D3 | 24D4 | 24D5 | 24D6 | 24D7 | 24D8 | 24D9 | 24DA | 24DB | 24DC | 24DD | 24DE | 24DF |
| 4EX | 0DD7 | 24E1 | 24E2 | 24E3 | 24E4 | 24E5 | 24E6 | 24E7 | 24E8 | 24E9 | 24EA | 24EB | 24EC | 24ED | 24EE | 24EF |
| 4FX | 24F0 | 24F1 | 24F2 | 24F3 | 24F4 | 24F5 | 24F6 | 24F7 | 24F8 | 24F9 | 24FA | 24FB | 24FC | 24FD | 24FE | 24FF |
| 50X | 0DD8 | 0F49 | 0F42 | 2503 | 0F58 | 0F59 | 2506 | 2507 | 0F44 | 2509 | 250A | 250B | 250C | 250D | 250E | 250F |
| 51X | 0F48 | 0F4B | 2512 | 2513 | 0F5A | 0F5B | 2516 | 2517 | 2518 | 2519 | 251A | 251B | 251C | 251D | 251E | 251F |
| 52X | 0DD9 | 2521 | 2522 | 2523 | 2524 | 2525 | 2526 | 2527 | 2528 | 2529 | 252A | 252B | 252C | 252D | 252E | 252F |
| 53X | 2530 | 2531 | 2532 | 2533 | 2534 | 2535 | 2536 | 2537 | 2538 | 2539 | 253A | 253B | 253C | 253D | 253E | 253F |
| 54X | 0DDA | 0F4D | 2542 | 2543 | 0F5C | 0F5D | 2546 | 2547 | 2548 | 2549 | 254A | 254B | 254C | 254D | 254E | 254F |
| 55X | 0F4A | 0F4F | 2552 | 2553 | 0F5E | 0F5F | 2556 | 2557 | 2558 | 2559 | 255A | 255B | 255C | 255D | 255E | 255F |
| 56X | 2560 | 2561 | 2562 | 2563 | 2564 | 2565 | 2566 | 2567 | 2568 | 2569 | 256A | 256B | 256C | 256D | 256E | 256F |
| 57X | 2570 | 2571 | 2572 | 2573 | 2574 | 2575 | 2576 | 2577 | 2578 | 2579 | 257A | 257B | 257C | 257D | 257E | 257F |
| 58X | 0DDB | 2581 | 2582 | 2583 | 2584 | 2585 | 2586 | 2587 | 2588 | 2589 | 258A | 258B | 258C | 258D | 258E | 258F |
| 59X | 2590 | 2591 | 2592 | 2593 | 2594 | 2595 | 2596 | 2597 | 2598 | 2599 | 259A | 259B | 259C | 259D | 259E | 259F |
| 5AX | 0DDC | 25A1 | 25A2 | 25A3 | 25A4 | 25A5 | 25A6 | 25A7 | 25A8 | 25A9 | 25AA | 25AB | 25AC | 25AD | 25AE | 25AF |
| 5BX | 25B0 | 25B1 | 25B2 | 25B3 | 25B4 | 25B5 | 25B6 | 25B7 | 25B8 | 25B9 | 25BA | 25BB | 25BC | 25BD | 25BE | 25BF |
| 5CX | 0DDD | 25C1 | 25C2 | 25C3 | 25C4 | 25C5 | 25C6 | 25C7 | 25C8 | 25C9 | 25CA | 25CB | 25CC | 25CD | 25CE | 25CF |
| 5DX | 0DDE | 25D1 | 25D2 | 25D3 | 25D4 | 25D5 | 25D6 | 25D7 | 25D8 | 25D9 | 25DA | 25DB | 25DC | 25DD | 25DE | 25DF |
| 5EX | 0DDF | 25E1 | 25E2 | 25E3 | 25E4 | 25E5 | 25E6 | 25E7 | 25E8 | 25E9 | 25EA | 25EB | 25EC | 25ED | 25EE | 25EF |

TABLE 11-continued

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 5FX | 25F0 | 25F1 | 25F2 | 25F3 | 25F4 | 25F5 | 25F6 | 25F7 | 25F8 | 25F9 | 25FA | 25FB | 25FC | 25FD | 25FE | 25FF |
| 60X | 0DF0 | 0F1D | 0F69 | 2603 | 0F1C | 2605 | 2606 | 2607 | 2618 | 2609 | 0F79 | 260B | 260C | 260D | 260E | 260F |
| 61X | 0F4C | 2611 | 2612 | 2613 | 2614 | 2615 | 2616 | 2617 | 2618 | 2619 | 261A | 261B | 261C | 261D | 261E | 261F |
| 62X | 2630 | 2621 | 2622 | 2623 | 2624 | 2625 | 2626 | 2627 | 2628 | 2629 | 262A | 262B | 262C | 262D | 262E | 262F |
| 63X | 0DF1 | 2631 | 2632 | 2633 | 2634 | 2635 | 2636 | 2637 | 2638 | 2639 | 263A | 263B | 263C | 263D | 263E | 263F |
| 64X | 0DF2 | 2641 | 2642 | 2643 | 2644 | 2645 | 2646 | 2647 | 2648 | 2649 | 264A | 264B | 264C | 264D | 264E | 264F |
| 65X | 2650 | 2651 | 2652 | 2653 | 2654 | 2655 | 2656 | 2657 | 2658 | 2659 | 265A | 265B | 265C | 265D | 265E | 265F |
| 66X | 0DF3 | 2661 | 2662 | 2663 | 2664 | 2665 | 2666 | 2667 | 2668 | 2669 | 266A | 266B | 266C | 266D | 266E | 266F |
| 67X | 2670 | 2671 | 2672 | 2673 | 2674 | 2675 | 2676 | 2677 | 2678 | 2679 | 267A | 267B | 267C | 267D | 267E | 267F |
| 68X | 0DF4 | 2681 | 2682 | 2683 | 2684 | 2685 | 2686 | 2687 | 2688 | 2689 | 268A | 268B | 268C | 268D | 268E | 268F |
| 69X | 2690 | 2691 | 2692 | 2693 | 2694 | 2695 | 2696 | 2697 | 2698 | 2699 | 269A | 269B | 269C | 269D | 269E | 269F |
| 6AX | 0DF5 | 26A1 | 0F6F | 26A3 | 26A4 | 26A5 | 26A6 | 26A7 | 07FE | 26A9 | 07F7 | 26AB | 26AC | 26AD | 26AE | 26AF |
| 6BX | 26B0 | 26B1 | 26B2 | 26B3 | 26B4 | 26B5 | 26B6 | 26B7 | 26B8 | 26B9 | 26BA | 26BB | 26BC | 26BD | 26BE | 26BF |
| 6CX | 26D0 | 26C1 | 26C2 | 26C3 | 26C4 | 26C5 | 26C6 | 26C7 | 26C8 | 26C9 | 26CA | 26CB | 26CC | 26CD | 26CE | 26CF |
| 6DX | 26D0 | 26D1 | 26D2 | 26D3 | 26D4 | 26D5 | 26D6 | 26D7 | 26D8 | 26D9 | 26DA | 26DB | 26DC | 26DD | 26DE | 26DF |
| 6EX | 0DF7 | 26E1 | 26E2 | 26E3 | 26E4 | 26E5 | 26E6 | 26E7 | 26E8 | 26E9 | 26EA | 26EB | 26EC | 26ED | 26EE | 26EF |
| 6FX | 26F0 | 26F1 | 26F2 | 26F3 | 26F4 | 26F5 | 26F6 | 26F7 | 26F8 | 26F9 | 26FA | 26FB | 26FC | 26FD | 26FE | 26FF |
| 70X | 0DF8 | 2701 | 2702 | 2703 | 2704 | 2705 | 2706 | 2707 | 2708 | 2709 | 270A | 270B | 270C | 270D | 270E | 270F |
| 71X | 2710 | 2711 | 2712 | 2713 | 2714 | 2715 | 2716 | 2717 | 2718 | 2719 | 271A | 271B | 271C | 271D | 271E | 271F |
| 72X | 0DF9 | 2721 | 2722 | 2723 | 2724 | 2725 | 2726 | 2727 | 2728 | 2729 | 272A | 272B | 272C | 272D | 272E | 272F |
| 73X | 2730 | 2731 | 2732 | 2733 | 2734 | 2735 | 2736 | 2737 | 2738 | 2739 | 273A | 273B | 273C | 273D | 273E | 273F |
| 74X | 0DFA | 2741 | 2742 | 2743 | 2744 | 2745 | 2746 | 2747 | 2748 | 2749 | 274A | 274B | 274C | 274D | 274E | 274F |
| 75X | 2750 | 2751 | 2752 | 2753 | 2754 | 2755 | 2756 | 2757 | 2758 | 2759 | 275A | 275B | 275C | 275D | 275E | 275F |
| 76X | 0DFB | 2761 | 2762 | 2763 | 2764 | 2765 | 2766 | 2767 | 2768 | 2769 | 276A | 276B | 276C | 276D | 276E | 276F |
| 77X | 2770 | 2771 | 2772 | 2773 | 2774 | 2775 | 2776 | 2777 | 2778 | 2779 | 277A | 277B | 277C | 277D | 277E | 277F |
| 78X | 0DFC | 2781 | 2782 | 2783 | 2784 | 2785 | 2786 | 2787 | 2788 | 2789 | 278A | 278B | 278C | 278D | 278E | 278F |
| 79X | 2790 | 2791 | 2792 | 2793 | 2794 | 2795 | 2796 | 2797 | 2798 | 2799 | 279A | 279B | 279C | 279D | 279E | 279F |
| 7AX | 0DFD | 27A1 | 27A2 | 27A3 | 27A4 | 27A5 | 27A6 | 27A7 | 27A8 | 27A9 | 27AA | 27AB | 27AC | 27AD | 27AE | 27AF |
| 7BX | 27B0 | 27B1 | 27B2 | 27B3 | 27B4 | 27B5 | 27B6 | 27B7 | 27B8 | 27B9 | 27BA | 27BB | 27BC | 27BD | 27BE | 27BF |
| 7CX | 0DFE | 27C1 | 27C2 | 27C3 | 27C4 | 27C5 | 27C6 | 27C7 | 27C8 | 27C9 | 27CA | 27CB | 27CC | 27CD | 27CE | 27CF |
| 7DX | 27D0 | 27D1 | 27D2 | 27D3 | 27D4 | 27D5 | 27D6 | 27D7 | 27D8 | 27D9 | 27DA | 27DB | 27DC | 27DD | 27DE | 27DF |
| 7EX | 0DFF | 27E1 | 27E2 | 27E3 | 27E4 | 27E5 | 27E6 | 27E7 | 27E8 | 27E9 | 27EA | 27EB | 27EC | 27ED | 27EE | 27EF |
| 7FX | 27F0 | 27F1 | 27F2 | 27F3 | 27F4 | 27F5 | 27F6 | 27F7 | 27F8 | 27F9 | 27FA | 27FB | 27FC | 27FD | 27FE | 27FF |
| 80X | 0E70 | 0E81 | 0FA1 | 0E03 | 0F90 | 0F91 | 0E06 | 0E07 | 0FB0 | 0E09 | 0FB1 | 0E0B | 0E0C | 0E0D | 0E0E | 0E0F |
| 81X | 0F88 | 0E21 | 0F82 | 2813 | 0F92 | 0F93 | 2816 | 2817 | 0F84 | 2819 | 281A | 281B | 281C | 281D | 281E | 281F |
| 82X | 0E71 | 2831 | 0FA3 | 2833 | 0E24 | 0E25 | 0E26 | 0E27 | 0FB2 | 0E29 | 0FB3 | 0E2B | 0E2C | 0E2D | 0E2E | 0E2F |
| 83X | 0FA8 | 2831 | 2832 | 2833 | 2834 | 2835 | 2836 | 2837 | 2838 | 2839 | 283A | 283B | 283C | 283D | 283E | 283F |
| 84X | 0E72 | 0F85 | 0FA2 | 2843 | 0F94 | 0F95 | 2846 | 2847 | 0FA4 | 2849 | 284A | 284B | 284C | 284D | 284E | 284F |
| 85X | 0F8A | 2851 | 2852 | 2853 | 2854 | 2855 | 2856 | 2857 | 2858 | 2859 | 285A | 285B | 285C | 285D | 285E | 285F |
| 86X | 0E73 | 2861 | 2862 | 2863 | 2864 | 2865 | 2866 | 2867 | 2868 | 2869 | 286A | 286B | 286C | 286D | 286E | 286F |
| 87X | 2870 | 2871 | 2872 | 2873 | 2874 | 2875 | 2876 | 2877 | 2878 | 2879 | 287A | 287B | 287C | 287D | 287E | 287F |
| 88X | 0E74 | 0E91 | 0F15 | 0E93 | 0E94 | 0E95 | 0E96 | 0E97 | 0FB4 | 0E99 | 0F85 | 0E9B | 0E9C | 0E9D | 0E9E | 0E9F |
| 89X | 0F8C | 2891 | 2892 | 2893 | 2894 | 2895 | 2896 | 2897 | 2898 | 2899 | 289A | 289B | 289C | 289D | 289E | 289F |
| 8AX | 0E75 | 0E61 | 0FA7 | 0E63 | 0E64 | 0E65 | 0E66 | 0E67 | 0FB6 | 0E69 | 0FB7 | 0E6B | 0E6C | 0E6D | 0E6E | 0E6F |
| 8BX | 28B0 | 28B1 | 28B2 | 28B3 | 28B4 | 28B5 | 28B6 | 28B7 | 28B8 | 28B9 | 28BA | 28BB | 28BC | 28BD | 28BE | 28BF |
| 8CX | 0E76 | 28C1 | 28C2 | 28C3 | 28C4 | 28C5 | 28C6 | 28C7 | 28C8 | 28C9 | 28CA | 28CB | 28CC | 28CD | 28CE | 28CF |
| 8DX | 28D0 | 28D1 | 28D2 | 28D3 | 28D4 | 28D5 | 28D6 | 28D7 | 28D8 | 28D9 | 28DA | 28DB | 28DC | 28DD | 28DE | 28DF |
| 8EX | 0E77 | 28E1 | 28E2 | 28E3 | 28E4 | 28E5 | 28E6 | 28E7 | 28E8 | 28E9 | 28EA | 28EB | 28EC | 28ED | 28EE | 28EF |

TABLE 11-continued

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 8FX | 28F0 | 28F1 | 28F2 | 28F3 | 28F4 | 28F5 | 28F6 | 28F7 | 28F8 | 28F9 | 28FA | 28FB | 28FC | 28FD | 28FE | 28FF |
| 90X | 0E78 | 0F89 | 0FC2 | 2903 | 0F98 | 0F99 | 2906 | 2907 | 0FC4 | 2909 | 290A | 290B | 290C | 290D | 290E | 290F |
| 91X | 0FC8 | 0F8B | 2912 | 2913 | 0F9A | 0F9B | 2916 | 2917 | 2918 | 2919 | 291A | 291B | 291C | 291D | 291E | 291F |
| 92X | 0E79 | 2921 | 2922 | 2923 | 2924 | 2925 | 2926 | 2927 | 2928 | 2929 | 292A | 292B | 292C | 292D | 292E | 292F |
| 93X | 2930 | 2931 | 2932 | 2933 | 2934 | 2935 | 2936 | 2937 | 2938 | 2939 | 293A | 293B | 293C | 293D | 293E | 293F |
| 94X | 0E7A | 0F8D | 2942 | 2943 | 0F9C | 2945 | 2946 | 2947 | 2948 | 2949 | 294A | 294B | 294C | 294D | 294E | 294F |
| 95X | 0FCA | 0F8F | 2952 | 2953 | 0F9E | 0F9F | 2956 | 2957 | 2958 | 2959 | 295A | 295B | 295C | 295D | 295E | 295F |
| 96X | 0E7B | 2961 | 2962 | 2963 | 2964 | 2965 | 2966 | 2967 | 2968 | 2969 | 296A | 296B | 296C | 296D | 296E | 296F |
| 97X | 2970 | 2971 | 2972 | 2973 | 2974 | 2975 | 2976 | 2977 | 2978 | 2979 | 297A | 297B | 297C | 297D | 297E | 297F |
| 98X | 0E7C | 2981 | 2982 | 2983 | 2984 | 2985 | 2986 | 2987 | 2988 | 2989 | 298A | 298B | 298C | 298D | 298E | 298F |
| 99X | 2990 | 2991 | 2992 | 2993 | 2994 | 2995 | 2996 | 2997 | 2998 | 2999 | 299A | 299B | 299C | 299D | 299E | 299F |
| 9AX | 0E7D | 29A1 | 29A2 | 29A3 | 29A4 | 29A5 | 29A6 | 29A7 | 29A8 | 29A9 | 29AA | 29AB | 29AC | 29AD | 29AE | 29AF |
| 9BX | 29B0 | 29B1 | 29B2 | 29B3 | 29B4 | 29B5 | 29B6 | 29B7 | 29B8 | 29B9 | 29BA | 29BB | 29BC | 29BD | 29BE | 29BF |
| 9CX | 0E7E | 29C1 | 29C2 | 29C3 | 29C4 | 29C5 | 29C6 | 29C7 | 29C8 | 29C9 | 29CA | 29CB | 29CC | 29CD | 29CE | 29CF |
| 9DX | 29D0 | 29D1 | 29D2 | 29D3 | 29D4 | 29D5 | 29D6 | 29D7 | 29D8 | 29D9 | 29DA | 29DB | 29DC | 29DD | 29DE | 29DF |
| 9EX | 0E7F | 29E1 | 29E2 | 29E3 | 29E4 | 29E5 | 29E6 | 29E7 | 29E8 | 29E9 | 29EA | 29EB | 29EC | 29ED | 29EE | 29EF |
| 9FX | 29F0 | 29F1 | 29F2 | 29F3 | 29F4 | 29F5 | 29F6 | 29F7 | 29F8 | 29F9 | 29FA | 29FB | 29FC | 29FD | 29FE | 29FF |
| A0X | 0EB0 | 0E81 | 0E83 | 0E83 | 0E84 | 0E85 | 0E86 | 0E87 | 0FB8 | 0E89 | 2A1A | 2A1B | 0E8C | 0E8D | 0E8E | 0E8F |
| A1X | 0FCC | 2A11 | 2A12 | 2A13 | 2A14 | 2A15 | 2A16 | 2A17 | 2A18 | 2A19 | 2A1A | 2A1B | 2A1C | 2A1D | 2A1E | 2A1F |
| A2X | 0EB1 | 0EA1 | 0FAB | 0EA3 | 0EA4 | 0EA5 | 0EA6 | 0EA7 | 0FBA | 0EA9 | 0FBB | 0EAB | 0EAC | 0EAD | 0EAE | 0EAF |
| A3X | 2A30 | 2A31 | 2A32 | 2A33 | 2A34 | 2A35 | 2A36 | 2A37 | 2A38 | 2A39 | 2A3A | 2A3B | 2A3C | 2A3D | 2A3E | 2A3F |
| A4X | 0EB2 | 2A41 | 2A42 | 2A43 | 2A44 | 2A45 | 2A46 | 2A47 | 2A48 | 2A49 | 2A4A | 2A4B | 2A4C | 2A4D | 2A4E | 2A4F |
| A5X | 2A50 | 2A51 | 2A52 | 2A53 | 2A54 | 2A55 | 2A56 | 2A57 | 2A58 | 2A59 | 2A5A | 2A5B | 2A5C | 2A5D | 2A5E | 2A5F |
| A6X | 0EB3 | 2A61 | 2A62 | 2A63 | 2A64 | 2A65 | 2A66 | 2A67 | 2A68 | 2A69 | 2A6A | 2A6B | 2A6C | 2A6D | 2A6E | 2A6F |
| A7X | 2A70 | 2A71 | 2A72 | 2A73 | 2A74 | 2A75 | 2A76 | 2A77 | 2A78 | 2A79 | 2A7A | 2A7B | 2A7C | 2A7D | 2A7E | 2A7F |
| A8X | 0EB4 | 0EC1 | 0FAD | 0EC3 | 0EC4 | 0EC5 | 0EC6 | 0EC7 | 0FBC | 0EC9 | 0FBD | 0ECB | 0ECC | 0ECD | 0ECE | 0ECF |
| A9X | 2A90 | 2A91 | 2A92 | 2A93 | 2A94 | 2A95 | 2A96 | 2A97 | 2A98 | 2A99 | 2A9A | 2A9B | 2A9C | 2A9D | 2A9E | 2A9F |
| AAX | 03B5 | 0EE1 | 0FAF | 0EE3 | 0EE4 | 0EE5 | 0EE6 | 0EE7 | 0FB3 | 0EE9 | 0FBF | 0EEB | 0EEC | 0EED | 0EEE | 0EEF |
| ABX | 2AB0 | 2AB1 | 2AB2 | 2AB3 | 2AB4 | 2AB5 | 2AB6 | 2AB7 | 2AB8 | 2AB9 | 2ABA | 2ABB | 2ABC | 2ABD | 2ABE | 2ABF |
| ACX | 0EB6 | 2AC1 | 2AC2 | 2AC3 | 2AC4 | 2AC5 | 2AC6 | 2AC7 | 2AC8 | 2AC9 | 2ACA | 2ACB | 2ACC | 2ACD | 2ACE | 2ACF |
| ADX | 2AD0 | 2AD1 | 2AD2 | 2AD3 | 2AD4 | 2AD5 | 2AD6 | 2AD7 | 2AD8 | 2AD9 | 2ADA | 2ADB | 2ADC | 2ADD | 2ADE | 2ADF |
| AEX | 0EB7 | 2AE1 | 2AE2 | 2AE3 | 2AE4 | 2AE5 | 2AE6 | 2AE7 | 2AE8 | 2AE9 | 2AEA | 2AEB | 2AEC | 2AED | 2AEE | 2AEF |
| AFX | 2AF0 | 2AF1 | 2AF2 | 2AF3 | 2AF4 | 2AF5 | 2AF6 | 2AF7 | 2AF8 | 2AF9 | 2AFA | 2AFB | 2AFC | 2AFD | 2AFE | 2AFF |
| B0X | 0EB8 | 2B01 | 2B02 | 2B03 | 2B04 | 2B05 | 2B06 | 2B07 | 2B08 | 2B09 | 2B0A | 2B0B | 2B0C | 2B0D | 2B0E | 2B0F |
| B1X | 0EB9 | 2B11 | 2B12 | 2B13 | 2B14 | 2B15 | 2B16 | 2B17 | 2B18 | 2B19 | 2B1A | 2B1B | 2B1C | 2B1D | 2B1E | 2B1F |
| B2X | 2B30 | 2B21 | 2B22 | 2B23 | 2B24 | 2B25 | 2B26 | 2B27 | 2B28 | 2B29 | 2B2A | 2B2B | 2B2C | 2B2D | 2B2E | 2B2F |
| B3X | 2B30 | 2B31 | 2B32 | 2B33 | 2B34 | 2B35 | 2B36 | 2B37 | 2B38 | 2B39 | 2B3A | 2B3B | 2B3C | 2B3D | 2B3E | 2B3F |
| B4X | 0EBA | 2B41 | 2B42 | 2B43 | 2B44 | 2B45 | 2B46 | 2B47 | 2B48 | 2B49 | 2B4A | 2B4B | 2B4C | 2B4D | 2B4E | 2B4F |
| B5X | 2B50 | 2B51 | 2B52 | 2B53 | 2B54 | 2B55 | 2B56 | 2B57 | 2B58 | 2B59 | 2B5A | 2B5B | 2B5C | 2B5D | 2B5E | 2B5F |
| B6X | 0EBB | 2B61 | 2B62 | 2B63 | 2B64 | 2B65 | 2B66 | 2B67 | 2B68 | 2B69 | 2B6A | 2B6B | 2B6C | 2B6D | 2B6E | 2B6F |
| B7X | 2B70 | 2B71 | 2B72 | 2B73 | 2B74 | 2B75 | 2B76 | 2B77 | 2B78 | 2B79 | 2B7A | 2B7B | 2B7C | 2B7D | 2B7E | 2B7F |
| B8X | 0EBC | 2B81 | 2B82 | 2B83 | 2B84 | 2B85 | 2B86 | 2B87 | 2B88 | 2B89 | 2B8A | 2B8B | 2B8C | 2B8D | 2B8E | 2B8F |
| B9X | 0EB9 | 2B91 | 2B92 | 2B93 | 2B94 | 2B95 | 2B96 | 2B97 | 2B98 | 2B99 | 2B9A | 2B9B | 2B9C | 2B9D | 2B9E | 2B9F |
| BAX | 0EBD | 2BA1 | 2BA2 | 2BA3 | 2BA4 | 2BA5 | 2BA6 | 2BA7 | 2BA8 | 2BA9 | 2BAA | 2BAB | 2BAC | 2BAD | 2BAE | 2BAF |
| BBX | 2BB0 | 2BB1 | 2BB2 | 2BB3 | 2BB4 | 2BB5 | 2BB6 | 2BB7 | 2BB8 | 2BB9 | 2BBA | 2BBB | 2BBC | 2BBD | 2BBE | 2BBF |
| BCX | 0EBE | 2BC1 | 2BC2 | 2BC3 | 2BC4 | 2BC5 | 2BC6 | 2BC7 | 2BC8 | 2BC9 | 2BCA | 2BCB | 2BCC | 2BCD | 2BCE | 2BCF |
| BDX | 2BD0 | 2BD1 | 2BD2 | 2BD3 | 2BD4 | 2BD5 | 2BD6 | 2BD7 | 2BD8 | 2BD9 | 2BDA | 2BDB | 2BDC | 2BDD | 2BDE | 2BDF |
| BEX | 0EBF | 2BE1 | 2BE2 | 2BE3 | 2BE4 | 2BE5 | 2BE6 | 2BE7 | 2BE8 | 2BE9 | 2BEA | 2BEB | 2BEC | 2BED | 2BEE | 2BEF |

TABLE 11-continued

State 0 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| BFX | 2BF0 | 2BF1 | 2BF2 | 2BF3 | 2BF4 | 2BF5 | 2BF6 | 2BF7 | 2BF8 | 2BF9 | 2BFA | 2BFB | 2BFC | 2BFD | 2BFE | 2BFF |
| C0X | 0ED0 | 0FC1 | 0FE1 | 0FE2 | 0FD0 | 0FD1 | 2C06 | 2C07 | 0FF0 | 2C09 | 0FF1 | 2C0B | 2C0C | 2C0D | 2C0E | 2C0F |
| C1X | 0FE8 | 0FC3 | 0FE3 | 2C13 | 0FD2 | 0FD3 | 2C16 | 2C17 | 0FF2 | 2C19 | 2C1A | 2C1B | 2C1C | 2C1D | 2C1E | 2C1F |
| C2X | 0ED1 | 2C21 | 2C12 | 2C23 | 2C24 | 2C25 | 2C26 | 2C27 | 2C18 | 2C29 | 2C3A | 2C2B | 2C2C | 2C2D | 2C2E | 2C2F |
| C3X | 2C30 | 2C31 | 2C32 | 2C33 | 2C34 | 2C35 | 2C36 | 2C37 | 2C38 | 2C39 | 2C3A | 2C3B | 2C3C | 2C3D | 2C3E | 2C3F |
| C4X | 0ED2 | 0FC5 | 2C42 | 2C43 | 2C44 | 2C45 | 2C46 | 2C47 | 2C48 | 2C49 | 2C4A | 2C4B | 2C4C | 2C4D | 2C4E | 2C4F |
| C5X | 0FEA | 0FC7 | 2C52 | 2C53 | 0FD4 | 0FD5 | 2C56 | 2C57 | 2C58 | 2C59 | 2C5A | 2C5B | 2C5C | 2C5D | 2C5E | 2C5F |
| C6X | 0ED3 | 2C61 | 2C62 | 2C63 | 2C64 | 2C65 | 2C66 | 2C67 | 2C68 | 2C69 | 2C6A | 2C6B | 2C6C | 2C6D | 2C6E | 2C6F |
| C7X | 2C70 | 2C71 | 2C72 | 2C73 | 2C74 | 2C75 | 2C76 | 2C77 | 2C78 | 2C79 | 2C7A | 2C7B | 2C7C | 2C7D | 2C7E | 2C7F |
| C8X | 0ED4 | 2C81 | 2C8E | 2C83 | 2C84 | 2C85 | 2C86 | 2C87 | 2C88 | 2C89 | 0FF5 | 2C8B | 2C8C | 2C8D | 2C8E | 2C8F |
| C9X | 2C90 | 2C91 | 0FE5 | 2C93 | 2C94 | 2C95 | 2C96 | 2C97 | 0FF4 | 2C99 | 0FFF | 2C9B | 2C9C | 2C9D | 2C9E | 2C9F |
| CAX | 0ED5 | 2CA1 | 0F37 | 2CA3 | 2CA4 | 2CA5 | 2CA6 | 2CA7 | 0FF6 | 2CA9 | 0FF7 | 2CAB | 2CAC | 2CAD | 2CAE | 2CAF |
| CBX | 2CB0 | 2CB1 | 2CB2 | 2CB3 | 2CB4 | 2CB5 | 2CB6 | 2CB7 | 2CB8 | 2CB9 | 2CBA | 2CBB | 2CBC | 2CBD | 2CBE | 2CBF |
| CCX | 0ED6 | 2CC1 | 2CC2 | 2CC3 | 2CC4 | 2CC5 | 2CC6 | 2CC7 | 2CC8 | 2CC9 | 2CCA | 2CCB | 2CCC | 2CCD | 2CCE | 2CCF |
| CDX | 2CD0 | 2CD1 | 2CD2 | 2CD3 | 2CD4 | 2CD5 | 2CD6 | 2CD7 | 2CD8 | 2CD9 | 2CDA | 2CDB | 2CDC | 2CDD | 2CDE | 2CDF |
| CEX | 0ED7 | 2CE1 | 2CE2 | 2CE3 | 2CE4 | 2CE5 | 2CE6 | 2CE7 | 2CE8 | 2CE9 | 2CEA | 2CEB | 2CEC | 2CED | 2CEE | 2CEF |
| CFX | 2CF0 | 2CF1 | 2CF2 | 2CF3 | 2CF4 | 2CF5 | 2CF6 | 2CF7 | 2CF8 | 2CF9 | 2CFA | 2CFB | 2CFC | 2CFD | 2CFE | 2CFF |
| D0X | 0ED8 | 0FC9 | 2D02 | 2D03 | 0FD8 | 0FD9 | 2D06 | 2D07 | 2D08 | 2D09 | 2D0A | 2D0B | 2D0C | 2D0D | 2D0E | 2D0F |
| D1X | 0FEC | 0FCB | 2D12 | 2D13 | 0FDA | 0FDB | 2D16 | 2D17 | 2D18 | 2D19 | 2D1A | 2D1B | 2D1C | 2D1D | 2D1E | 2D1F |
| D2X | 0ED9 | 2D21 | 2D22 | 2D23 | 2D24 | 2D25 | 2D26 | 2D27 | 2D28 | 2D29 | 2D2A | 2D2B | 2D2C | 2D2D | 2D2E | 2D2F |
| D3X | 2D30 | 2D31 | 2D32 | 2D33 | 2D34 | 2D35 | 2D36 | 2D37 | 2D38 | 2D39 | 2D3A | 2D3B | 2D3C | 2D3D | 2D3E | 2D3F |
| D4X | 0EDA | 0FCD | 2D42 | 2D43 | 0FDC | 0FDD | 2D46 | 2D47 | 2D48 | 2D49 | 2D4A | 2D4B | 2D4C | 2D4D | 2D4E | 2D4F |
| D5X | 0FEE | 0FCF | 2D52 | 2D53 | 0FDE | 0FDF | 2D56 | 2D57 | 2D58 | 2D59 | 2D5A | 2D5B | 2D5C | 2D5D | 2D5E | 2D5F |
| D6X | 0EDB | 2D61 | 2D62 | 2D63 | 2D64 | 2D65 | 2D66 | 2D67 | 2D68 | 2D69 | 2D6A | 2D6B | 2D6C | 2D6D | 2D6E | 2D6F |
| D7X | 2D70 | 2D71 | 2D72 | 2D73 | 2D74 | 2D75 | 2D76 | 2D77 | 2D78 | 2D79 | 2D7A | 2D7B | 2D7C | 2D7D | 2D7E | 2D7F |
| D8X | 0EDC | 2D81 | 2D82 | 2D83 | 2D84 | 2D85 | 2D86 | 2D87 | 2D88 | 2D89 | 2D8A | 2D8B | 2D8C | 2D8D | 2D8E | 2D8F |
| D9X | 2D90 | 2D91 | 2D92 | 2D93 | 2D94 | 2D95 | 2D96 | 2D97 | 2D98 | 2D99 | 2D9A | 2D9B | 2D9C | 2D9D | 2D9E | 2D9F |
| DAX | 0EDD | 2DA1 | 2DA2 | 2DA3 | 2DA4 | 2DA5 | 2DA6 | 2DA7 | 2DA8 | 2DA9 | 2DAA | 2DAB | 2DAC | 2DAD | 2DAE | 2DAF |
| DBX | 2DB0 | 2DB1 | 2DB2 | 2DB3 | 2DB4 | 2DB5 | 2DB6 | 2DB7 | 2DB8 | 2DB9 | 2DBA | 2DBB | 2DBC | 2DBD | 2DBE | 2DBF |
| DCX | 0EDE | 2DC1 | 2DC2 | 2DC3 | 2DC4 | 2DC5 | 2DC6 | 2DC7 | 2DC8 | 2DC9 | 2DCA | 2DCB | 2DCC | 2DCD | 2DCE | 2DCF |
| DDX | 2DD0 | 2DD1 | 2DD2 | 2DD3 | 2DD4 | 2DD5 | 2DD6 | 2DD7 | 2DD8 | 2DD9 | 2DDA | 2DDB | 2DDC | 2DDD | 2DDE | 2DDF |
| DEX | 0EDF | 2DE1 | 2DE2 | 2DE3 | 2DE4 | 2DE5 | 2DE6 | 2DE7 | 2DE8 | 2DE9 | 2DEA | 2DEB | 2DEC | 2DED | 2DEE | 2DEF |
| DFX | 2DF0 | 2DF1 | 2DF2 | 2DF3 | 2DF4 | 2DF5 | 2DF6 | 2DF7 | 2DF8 | 2DF9 | 2DFA | 2DFB | 2DFC | 2DFD | 2DFE | 2DFF |
| E0X | 0EF0 | 0FE4 | 0FE9 | 2E03 | 2E04 | 2E05 | 2E06 | 2E07 | 0FE8 | 2E09 | 0FF9 | 2E0B | 2E0C | 2E0D | 2E0E | 2E0F |
| E1X | 2E10 | 2E11 | 2E12 | 2E13 | 2E14 | 2E15 | 2E16 | 2E17 | 2E18 | 2E19 | 2E1A | 2E1B | 2E1C | 2E1D | 2E1E | 2E1F |
| E2X | 2E30 | 2E21 | 2E32 | 2E23 | 2E24 | 2E25 | 2E26 | 2E27 | 2E28 | 2E29 | 2E2A | 2E2B | 2E2C | 2E2D | 2E2E | 2E2F |
| E3X | 0EF2 | 2E31 | 2E32 | 2E33 | 2E34 | 2E35 | 2E36 | 2E37 | 2E38 | 2E39 | 2E3A | 2E3B | 2E3C | 2E3D | 2E3E | 2E3F |
| E4X | 2E50 | 2E41 | 2E42 | 2E43 | 2E44 | 2E45 | 2E46 | 2E47 | 2E48 | 2E49 | 2E4A | 2E4B | 2E4C | 2E4D | 2E4E | 2E4F |
| E5X | 0EF3 | 2E51 | 2E52 | 2E53 | 2E54 | 2E55 | 2E56 | 2E57 | 2E58 | 2E59 | 2E5A | 2E5B | 2E5C | 2E5D | 2E5E | 2E5F |
| E6X | 2E70 | 2E61 | 2E62 | 2E63 | 2E64 | 2E65 | 2E66 | 2E67 | 2E68 | 2E69 | 2E6A | 2E6B | 2E6C | 2E6D | 2E6E | 2E6F |
| E7X | 0EF4 | 2E71 | 2E72 | 2E73 | 2E74 | 2E75 | 2E76 | 2E77 | 2E78 | 2E79 | 2E7A | 2E7B | 2E7C | 2E7D | 2E7E | 2E7F |
| E8X | 2E80 | 2E81 | 0FED | 2E83 | 2E84 | 2E85 | 2E86 | 2E87 | 0FFC | 2E89 | 0FFD | 2E8B | 2E8C | 2E8D | 2E8E | 2E8F |
| E9X | 0EF5 | 2E91 | 2E92 | 2E93 | 2E94 | 2E95 | 2E96 | 2E97 | 2E98 | 2E99 | 2E9A | 2E9B | 2E9C | 2E9D | 2E9E | 2E9F |
| EAX | 0EF5 | 2EA1 | 0FEF | 2EA3 | 2EA5 | 2EA5 | 2EA6 | 2EA7 | 0FFE | 2EA9 | 0FFF | 2EAB | 2EAC | 2EAD | 2EAE | 2EAF |
| EBX | 2EB0 | 2EB1 | 2EB2 | 2EB3 | 2EB4 | 2EB5 | 2EB6 | 2EB7 | 2EB8 | 2EB9 | 2EBA | 2EBB | 2EBC | 2EBD | 2EBE | 2EBF |
| ECX | 0EF6 | 2EC1 | 2EC2 | 2EC3 | 2EC4 | 2EC5 | 2EC6 | 2EC7 | 2EC8 | 2EC9 | 2ECA | 2ECB | 2ECC | 2ECD | 2ECE | 2ECF |
| EDX | 2ED0 | 2ED1 | 2ED2 | 2ED3 | 2ED4 | 2ED5 | 2ED6 | 2ED7 | 2ED8 | 2ED9 | 2EDA | 2EDB | 2EDC | 2EDD | 2EDE | 2EDF |
| EEX | 0EF7 | 2EE1 | 2EE2 | 2EE3 | 2EE4 | 2EE5 | 2EE6 | 2EE7 | 2EE8 | 2EE9 | 2EEA | 2EEB | 2EEC | 2EED | 2EEE | 2EEF |

TABLE 11-continued

State 0 of 14-bit code word for 24/25 (0,7/7) code

|  | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| EFX | 2EF0 | 2EF1 | 2EF2 | 2EF3 | 2EF4 | 2EF5 | 2EF6 | 2EF7 | 2EF8 | 2EF9 | 2EFA | 2EFB | 2EFC | 2EFD | 2EFE | 2EFF |
| F0X | 0EF8 | 2F01 | 2F02 | 2F03 | 2F04 | 2F05 | 2F06 | 2F07 | 2F08 | 2F09 | 2F0A | 2F0B | 2F0C | 2F0D | 2F0E | 2F0F |
| F1X | 2F10 | 2F11 | 2F12 | 2F13 | 2F14 | 2F15 | 2F16 | 2F17 | 2F18 | 2F19 | 2F1A | 2F1B | 2F1C | 2F1D | 2F1E | 2F1F |
| F2X | 0EF9 | 2F21 | 2F22 | 2F23 | 2F24 | 2F25 | 2F26 | 2F27 | 2F28 | 2F29 | 2F2A | 2F2B | 2F2C | 2F2D | 2F2E | 2F2F |
| F3X | 2F30 | 2F31 | 2F32 | 2F33 | 2F34 | 2F35 | 2F36 | 2F37 | 2F38 | 2F39 | 2F3A | 2F3B | 2F3C | 2F3D | 2F3E | 2F3F |
| F4X | 0EFA | 2F41 | 2F42 | 2F43 | 2F44 | 2F45 | 2F46 | 2F47 | 2F48 | 2F49 | 2F4A | 2F4B | 2F4C | 2F4D | 2F4E | 2F4F |
| F5X | 2F50 | 2F51 | 2F52 | 2F53 | 2F54 | 2F55 | 2F56 | 2F57 | 2F58 | 2F59 | 2F5A | 2F5B | 2F5C | 2F5D | 2F5E | 2F5F |
| F6X | 0EFB | 2F61 | 2F62 | 2F63 | 2F64 | 2F65 | 2F66 | 2F67 | 2F68 | 2F69 | 2F6A | 2F6B | 2F6C | 2F6D | 2F6E | 2F6F |
| F7X | 2F70 | 2F71 | 2F72 | 2F73 | 2F74 | 2F75 | 2F76 | 2F77 | 2F78 | 2F79 | 2F7A | 2F7B | 2F7C | 2F7D | 2F7E | 2F7F |
| F8X | 0EFC | 2F81 | 2F82 | 2F83 | 2F84 | 2F85 | 2F86 | 2F87 | 2F88 | 2F89 | 2F8A | 2F8B | 2F8C | 2F8D | 2F8E | 2F8F |
| F9X | 2F90 | 2F91 | 2F92 | 2F93 | 2F94 | 2F95 | 2F96 | 2F97 | 2F98 | 2F99 | 2F9A | 2F9B | 2F9C | 2F9D | 2F9E | 2F9F |
| FAX | 0EFD | 2FA1 | 2FA2 | 2FA3 | 2FA4 | 2FA5 | 2FA6 | 2FA7 | 2FA8 | 2FA9 | 2FAA | 2FAB | 2FAC | 2FAD | 2FAE | 2FAF |
| FBX | 2FB0 | 2FB1 | 2FB2 | 2FB3 | 2FB4 | 2FB5 | 2FB6 | 2FB7 | 2FB8 | 2FB9 | 2FBA | 2FBB | 2FBC | 2FBD | 2FBE | 2FBF |
| FCX | 0EFE | 2FC1 | 2FC2 | 2FC3 | 2FC4 | 2FC5 | 2FC6 | 2FC7 | 2FC8 | 2FC9 | 2FCA | 2FCB | 2FCC | 2FCD | 2FCE | 2FCF |
| FDX | 2FD0 | 2FD1 | 2FD2 | 2FD3 | 2FD4 | 2FD5 | 2FD6 | 2FD7 | 2FD8 | 2FD9 | 2FDA | 2FDB | 2FDC | 2FDD | 2FDE | 2FDF |
| FEX | 0EFF | 2FE1 | 2FE2 | 2FE3 | 2FE4 | 2FE5 | 2FE6 | 2FE7 | 2FE8 | 2FE9 | 2FEA | 2FEB | 2FEC | 2FED | 2FEE | 2FEF |
| FFX | 2FF0 | 2FF1 | 2FF2 | 2FF3 | 2FF4 | 2FF5 | 2FF6 | 2FF7 | 2FF8 | 2FF9 | 2FFA | 2FFB | 2FFC | 2FFD | 2FFE | 2FFF |

Table 12 below is an encoding table for the 14-bit encoder when the state S2 is active. The arrangement of Table 12 is similar to Tables 10, 11. In Table 12, the state S2 is indicated at the top of the table to be active.

TABLE 12

State 2 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 00X | 0970 | 08E1 | 0B21 | 0B82 | 08F0 | 08F1 | 0B06 | 0B07 | 0B30 | 0969 | 0B31 | 096B | 096C | 096D | 096E | 096F |
| 01X | 0B88 | 08E3 | 0A4D | 3013 | 08F2 | 08F3 | 3016 | 3017 | 092F | 3019 | 301A | 301B | 301C | 301D | 301E | 301F |
| 02X | 0971 | 0B22 | 0B23 | 3023 | 0A4B | 3025 | 3026 | 3027 | 0B32 | 3029 | 0B33 | 302B | 302C | 302D | 302E | 302F |
| 03X | 0A4F | 3031 | 3032 | 3033 | 3034 | 3035 | 3036 | 3037 | 3038 | 3039 | 303A | 303B | 303C | 303D | 303E | 303F |
| 04X | 0972 | 08E5 | 0A5D | 3043 | 08F4 | 08F5 | 3046 | 3047 | 094F | 3049 | 304A | 304B | 304C | 304D | 304E | 304F |
| 05X | 0B81 | 08E7 | 3052 | 3053 | 08F6 | 08F7 | 3056 | 3057 | 3058 | 3059 | 305A | 305B | 305C | 305D | 305E | 305F |
| 06X | 0973 | 3061 | 3062 | 3063 | 3064 | 3065 | 3066 | 3067 | 3068 | 3069 | 306A | 306B | 306C | 306D | 306E | 306F |
| 07X | 3070 | 3071 | 3072 | 3073 | 3074 | 3075 | 3076 | 3077 | 3078 | 3079 | 307A | 307B | 307C | 307D | 307E | 307F |
| 08X | 0974 | 0B42 | 0B25 | 3083 | 0A5B | 3085 | 3086 | 3087 | 0B34 | 3089 | 307A | 308B | 308C | 308D | 308E | 308F |
| 09X | 0A5F | 3091 | 3092 | 3093 | 3094 | 3095 | 3096 | 3097 | 3098 | 3099 | 309A | 309B | 309C | 309D | 309E | 309F |
| 0AX | 0975 | 30A1 | 30B2 | 30A3 | 30A4 | 30A5 | 30A6 | 30A7 | 0B36 | 30A9 | 0B37 | 30AB | 30AC | 30AD | 30AE | 30AF |
| 0BX | 3080 | 30B1 | 30B2 | 30B3 | 30B4 | 30B5 | 30B6 | 30B7 | 30B8 | 30B9 | 30BA | 30BB | 30BC | 30BD | 30BE | 30BF |
| 0CX | 0976 | 30C1 | 30C2 | 30C3 | 30C4 | 30C5 | 30C6 | 30C7 | 30C8 | 30C9 | 30CA | 30CB | 30CC | 30CD | 30CE | 30CF |
| 0DX | 30D0 | 30D1 | 30D2 | 30D3 | 30D4 | 30D5 | 30D6 | 30D7 | 30D8 | 30D9 | 30DA | 30DB | 30DC | 30DD | 30DE | 30DF |
| 0EX | 0977 | 30E1 | 30E2 | 30E3 | 30E4 | 30E5 | 30E6 | 30E7 | 30E8 | 30E9 | 30EA | 30EB | 30EC | 30ED | 30EE | 30EF |
| 0FX | 30F0 | 30F1 | 30F2 | 30F3 | 30F4 | 30F5 | 30F6 | 30F7 | 30F8 | 30F9 | 30FA | 30FB | 30FC | 30FD | 30FE | 30FF |
| 10X | 0978 | 0839 | 0A1D | 3103 | 08F8 | 08F9 | 3106 | 3107 | 098F | 3109 | 310A | 310B | 310C | 310D | 310E | 310F |
| 11X | 0B8C | 08EB | 3112 | 3113 | 08F1 | 08FB | 3116 | 3117 | 3118 | 3119 | 311A | 311B | 311C | 311D | 311E | 311F |
| 12X | 0979 | 3121 | 3122 | 3123 | 3124 | 3125 | 3126 | 3127 | 3128 | 3129 | 312A | 312B | 312C | 312D | 312E | 312F |
| 13X | 3130 | 3131 | 3132 | 3133 | 3134 | 3135 | 3136 | 3137 | 3138 | 3139 | 313A | 313B | 313C | 313D | 313E | 313F |
| 14X | 097A | 08ED | 3142 | 3143 | 08FC | 08FD | 3146 | 3147 | 3148 | 3149 | 314A | 314B | 314C | 314D | 314E | 314F |
| 15X | 0B8E | 08EF | 3152 | 3153 | 08FE | 08FF | 3156 | 3157 | 3158 | 3159 | 315A | 315B | 315C | 315D | 315E | 315F |
| 16X | 097B | 3161 | 3162 | 3163 | 3164 | 3165 | 3166 | 3167 | 3168 | 3169 | 316A | 316B | 316C | 316D | 316E | 316F |
| 17X | 3170 | 3171 | 3172 | 3173 | 3174 | 3175 | 3176 | 3177 | 3178 | 3179 | 317A | 317B | 317C | 317D | 317E | 317F |
| 18X | 097C | 3181 | 3182 | 3183 | 3184 | 3185 | 3186 | 3187 | 3188 | 3189 | 318A | 318B | 318C | 318D | 318E | 318F |
| 19X | 3190 | 3191 | 3192 | 3193 | 3194 | 3195 | 3196 | 3197 | 3198 | 3199 | 319A | 319B | 319C | 319D | 319E | 319F |
| 1AX | 097D | 31A1 | 31A2 | 31A3 | 31A4 | 31A5 | 31A6 | 31A7 | 31A8 | 31A9 | 31AA | 31AB | 31AC | 31AD | 31AE | 31AF |
| 1BX | 31B0 | 31B1 | 31B2 | 31B3 | 31B4 | 31B5 | 31B6 | 31B7 | 31B8 | 31B9 | 31BA | 31BB | 31BC | 31BD | 31BE | 31BF |
| 1CX | 097E | 31C1 | 31C2 | 31C3 | 31C4 | 31C5 | 31C6 | 31C7 | 31C8 | 31C9 | 31CA | 31CB | 31CC | 31CD | 31CE | 31CF |
| 1DX | 31D0 | 31D1 | 31D2 | 31D3 | 31D4 | 31D5 | 31D6 | 31D7 | 31D8 | 31D9 | 31DA | 31DB | 31DC | 31DD | 31DE | 31DF |
| 1EX | 097F | 31E1 | 31E2 | 31E3 | 31E4 | 31E5 | 31E6 | 31E7 | 31E8 | 31E9 | 31EA | 31EB | 31EC | 31ED | 31EE | 31EF |
| 1FX | 31F0 | 31F1 | 31F2 | 31F3 | 31F4 | 31F5 | 31F6 | 31F7 | 31F8 | 31F9 | 31FA | 31FB | 31FC | 31FD | 31FE | 31FF |
| 20X | 09B0 | 0884 | 0B29 | 3203 | 0A1B | 3205 | 3206 | 3207 | 3208 | 3209 | 3239 | 320B | 320C | 320D | 320E | 320F |
| 21X | 0A1F | 3211 | 3212 | 3213 | 3214 | 3215 | 3216 | 3217 | 3218 | 3219 | 321A | 321B | 321C | 321D | 321E | 321F |
| 22X | 09B1 | 3221 | 0B2B | 3223 | 3224 | 3225 | 3226 | 3227 | 3228 | 3229 | 323A | 322B | 322C | 322D | 322E | 322F |
| 23X | 3230 | 3231 | 3232 | 3233 | 3234 | 3235 | 3236 | 3237 | 3238 | 3239 | 323A | 323B | 323C | 323D | 323E | 323F |
| 24X | 09B2 | 3241 | 3242 | 3243 | 3244 | 3245 | 3246 | 3247 | 3248 | 3249 | 324A | 324B | 324C | 324D | 324E | 324F |
| 25X | 3250 | 3251 | 3252 | 3253 | 3254 | 3255 | 3256 | 3257 | 3258 | 3259 | 325A | 325B | 325C | 325D | 325E | 325F |
| 26X | 09B3 | 3261 | 3262 | 3263 | 3264 | 3265 | 3266 | 3267 | 3268 | 3269 | 326A | 326B | 326C | 326D | 326E | 326F |
| 27X | 3270 | 3271 | 3272 | 3273 | 3274 | 3275 | 3276 | 3277 | 3278 | 3279 | 327A | 327B | 327C | 327D | 327E | 327F |
| 28X | 09B4 | 3281 | 3282 | 3283 | 3284 | 3285 | 3286 | 3287 | 0B3C | 3289 | 0B3D | 328B | 328C | 328D | 328E | 328F |
| 29X | 3290 | 3291 | 3292 | 3293 | 3294 | 3295 | 3296 | 3297 | 3298 | 3299 | 329A | 329B | 329C | 329D | 329E | 329F |
| 2AX | 09B5 | 32A1 | 32A3 | 32A3 | 32A4 | 32A5 | 32A6 | 32A7 | 0B3E | 32A9 | 0B3F | 32AB | 32AC | 32AD | 32AE | 32AF |
| 2BX | 32B0 | 32B1 | 0B2F | 32B3 | 32B4 | 32B5 | 32B6 | 32B7 | 32B8 | 32B9 | 32BA | 32BB | 32BC | 32BD | 32BE | 32BF |
| 2CX | 09B6 | 32C1 | 32C2 | 32C3 | 32C4 | 32C5 | 32C6 | 32C7 | 32C8 | 32C9 | 32CA | 32CB | 32CC | 32CD | 32CE | 32CF |
| 2DX | 32D0 | 32D1 | 32D2 | 32D3 | 32D4 | 32D5 | 32D6 | 32D7 | 32D8 | 32D9 | 32DA | 32DB | 32DC | 32DD | 32DE | 32DF |
| 2EX | 09B7 | 32E1 | 32E2 | 32E3 | 32E4 | 32E5 | 32E6 | 32E7 | 32E8 | 32E9 | 32EA | 32EB | 32EC | 32ED | 32EE | 32EF |

TABLE 12-continued

State 2 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 2FX | 32F0 | 32F1 | 32F2 | 32F3 | 32F4 | 32F5 | 32F6 | 32F7 | 32F8 | 32F9 | 32FA | 32FB | 32FC | 32FD | 32FE | 32FF |
| 30X | 09B8 | 3301 | 3302 | 3303 | 3304 | 3305 | 3306 | 3307 | 3308 | 3309 | 330A | 330B | 330C | 330D | 330E | 330F |
| 31X | 3310 | 3311 | 3312 | 3313 | 3314 | 3315 | 3316 | 3317 | 3318 | 3319 | 331A | 331B | 331C | 331D | 331E | 331F |
| 32X | 09B9 | 3321 | 3322 | 3323 | 3324 | 3325 | 3326 | 3327 | 3328 | 3329 | 332A | 332B | 332C | 332D | 332E | 332F |
| 33X | 3330 | 3331 | 3332 | 3333 | 3334 | 3335 | 3336 | 3337 | 3338 | 3339 | 333A | 333B | 333C | 333D | 333E | 333F |
| 34X | 09BA | 3341 | 3342 | 3343 | 3344 | 3345 | 3346 | 3347 | 3348 | 3349 | 334A | 334B | 334C | 334D | 334E | 334F |
| 35X | 3350 | 3351 | 3352 | 3353 | 3354 | 3355 | 3356 | 3357 | 3358 | 3359 | 335A | 335B | 335C | 335D | 335E | 335F |
| 36X | 09BB | 3361 | 3362 | 3363 | 3364 | 3365 | 3366 | 3367 | 3368 | 3369 | 336A | 336B | 336C | 336D | 336E | 336F |
| 37X | 3370 | 3371 | 3372 | 3373 | 3374 | 3375 | 3376 | 3377 | 3378 | 3379 | 337A | 337B | 337C | 337D | 337E | 337F |
| 38X | 09BC | 3381 | 3382 | 3383 | 3384 | 3385 | 3386 | 3387 | 3388 | 3389 | 338A | 338B | 338C | 338D | 338E | 338F |
| 39X | 3390 | 3391 | 3392 | 3393 | 3394 | 3395 | 3396 | 3397 | 3398 | 3399 | 339A | 339B | 339C | 339D | 339E | 339F |
| 3AX | 09BD | 33A1 | 33A2 | 33A3 | 33A4 | 33A5 | 33A6 | 33A7 | 33A8 | 33A9 | 33AA | 33AB | 33AC | 33AD | 33AE | 33AF |
| 3BX | 33B0 | 33B1 | 33B2 | 33B3 | 33B4 | 33B5 | 33B6 | 33B7 | 33B8 | 33B9 | 33BA | 33BB | 33BC | 33BD | 33BE | 33BF |
| 3CX | 09BE | 33C1 | 33C2 | 33C3 | 33C4 | 33C5 | 33C6 | 33C7 | 33C8 | 33C9 | 33CA | 33CB | 33CC | 33CD | 33CE | 33CF |
| 3DX | 33D0 | 33D1 | 33D2 | 33D3 | 33D4 | 33D5 | 33D6 | 33D7 | 33D8 | 33D9 | 33DA | 33DB | 33DC | 33DD | 33DE | 33DF |
| 3EX | 09BF | 33E1 | 33E2 | 33E3 | 33E4 | 33E5 | 33E6 | 33E7 | 33E8 | 33E9 | 33EA | 33EB | 33EC | 33ED | 33EE | 33EF |
| 3FX | 33F0 | 33F1 | 33F2 | 33F3 | 33F4 | 33F5 | 33F6 | 33F7 | 33F8 | 33F9 | 33FD | 33FB | 33FC | 33FD | 33FE | 33FF |
| 40X | 09D0 | 0B41 | 0B61 | 0BA2 | 0B50 | 0B51 | 3406 | 3407 | 0B70 | 3409 | 0B71 | 340B | 340C | 340D | 340E | 340F |
| 41X | 0BA8 | 3421 | 3412 | 3413 | 0B52 | 0B53 | 3416 | 3417 | 3418 | 3419 | 341A | 341B | 341C | 341D | 341E | 341F |
| 42X | 09D1 | 0B43 | 0B63 | 3423 | 3424 | 3425 | 3426 | 3427 | 0B72 | 3429 | 0B73 | 342B | 342C | 342D | 342E | 342F |
| 43X | 3430 | 3431 | 3432 | 3433 | 3434 | 3435 | 3436 | 3437 | 3438 | 3439 | 343A | 343B | 343C | 343D | 343E | 343F |
| 44X | 09D2 | 0B45 | 3442 | 3443 | 0B54 | 0B55 | 3446 | 3447 | 3448 | 3449 | 344A | 344B | 344C | 344D | 344E | 344F |
| 45X | 0BAA | 0B47 | 3452 | 3453 | 0B56 | 0B57 | 3456 | 3457 | 3458 | 3459 | 345A | 345B | 345C | 345D | 345E | 345F |
| 46X | 09D3 | 3461 | 3462 | 3463 | 3464 | 3465 | 3466 | 3467 | 3468 | 3469 | 346A | 346B | 346C | 346D | 346E | 346F |
| 47X | 3470 | 3471 | 3472 | 3473 | 3474 | 3475 | 3476 | 3477 | 3478 | 3479 | 347A | 347B | 347C | 347D | 347E | 347F |
| 48X | 09D4 | 3481 | 3482 | 3483 | 3484 | 3485 | 3486 | 3487 | 0B74 | 3489 | 0B75 | 348B | 348C | 348D | 348E | 348F |
| 49X | 3490 | 3491 | 3492 | 3493 | 3494 | 3495 | 3496 | 3497 | 3498 | 3499 | 349A | 349B | 349C | 349D | 349E | 349F |
| 4AX | 09D5 | 34A1 | 0B67 | 34A3 | 34A4 | 34A5 | 34A6 | 34A7 | 0B76 | 34A9 | 0B77 | 34AB | 34AC | 34AD | 34AE | 34AF |
| 4BX | 34B0 | 34B1 | 34B2 | 34B3 | 34B4 | 34B5 | 34B6 | 34B7 | 34B8 | 34B9 | 34BA | 34BB | 34BC | 34BD | 34BE | 34BF |
| 4CX | 09D6 | 34C1 | 34C2 | 34C3 | 34C4 | 34C5 | 34C6 | 34C7 | 34C8 | 34C9 | 34CA | 34CB | 34CC | 34CD | 34CE | 34CF |
| 4DX | 34D0 | 34D1 | 34D2 | 34D3 | 34D4 | 34D5 | 34D6 | 34D7 | 34D8 | 34D9 | 34DA | 34DB | 34DC | 34DD | 34DE | 34DF |
| 4EX | 09D7 | 34E1 | 34E2 | 34E3 | 34E4 | 34E5 | 34E6 | 34E7 | 34E8 | 34E9 | 34EA | 34EB | 34EC | 34ED | 34EE | 34EF |
| 4FX | 34F0 | 34F1 | 34F2 | 34F3 | 34F4 | 34F5 | 34F6 | 34F7 | 34F8 | 34F9 | 34FA | 34FB | 34FC | 34FD | 34FE | 34FF |
| 50X | 09D8 | 0B49 | 3502 | 3503 | 0B58 | 0B59 | 3506 | 3507 | 3508 | 3509 | 350A | 350B | 350C | 350D | 350E | 350F |
| 51X | 0BAC | 0B4B | 3512 | 3513 | 0B5A | 0B5B | 3516 | 3517 | 3518 | 3519 | 351A | 35AB | 351C | 351D | 351E | 351F |
| 52X | 09D9 | 3521 | 3522 | 3523 | 3524 | 3525 | 3526 | 3527 | 3528 | 3529 | 352A | 352B | 352C | 352D | 352E | 352F |
| 53X | 3530 | 3531 | 3532 | 3533 | 3534 | 3535 | 3536 | 3537 | 3538 | 3539 | 353A | 353B | 353C | 353D | 353E | 353F |
| 54X | 09DA | 0B4D | 3542 | 3543 | 0B5C | 0B5D | 3546 | 3547 | 3548 | 3549 | 354A | 354B | 354C | 354D | 354E | 354F |
| 55X | 0BAE | 0B4F | 3552 | 3553 | 0B5E | 0B5F | 3556 | 3557 | 3558 | 3559 | 355A | 355B | 355C | 355D | 355E | 355F |
| 56X | 09DB | 3561 | 3562 | 3563 | 3564 | 3565 | 3566 | 3567 | 3568 | 3569 | 356A | 356B | 356C | 356D | 356E | 356F |
| 57X | 3570 | 3571 | 3572 | 3573 | 3574 | 3575 | 3576 | 3577 | 3578 | 3579 | 357A | 357B | 357C | 357D | 357E | 357F |
| 58X | 09DC | 3581 | 3582 | 3583 | 3584 | 3585 | 3586 | 3587 | 3588 | 3589 | 358A | 358B | 358C | 358D | 358E | 358F |
| 59X | 3590 | 3591 | 3592 | 3593 | 3594 | 3595 | 3596 | 3597 | 3598 | 3599 | 359A | 359B | 359C | 359D | 359E | 359F |
| 5AX | 09DD | 35A1 | 35A2 | 35A3 | 35A4 | 35A5 | 35A6 | 35A7 | 35A8 | 35A9 | 35AA | 35AB | 35AC | 35AD | 35AE | 35AF |
| 5BX | 35B0 | 35B1 | 35B2 | 35B3 | 35B4 | 35B5 | 35B6 | 35B7 | 35B8 | 35B9 | 35BA | 35BB | 35BC | 35BD | 35BE | 35BF |
| 5CX | 09DE | 35C1 | 35C2 | 35C3 | 35C4 | 35C5 | 35C6 | 35C7 | 35C8 | 35C9 | 35CA | 35CB | 35CC | 35CD | 35CE | 35CF |
| 5DX | 35D0 | 35D1 | 35D2 | 35D3 | 35D4 | 35D5 | 35D6 | 35D7 | 35D8 | 35D9 | 35DA | 35DB | 35DC | 35DD | 35DE | 35DF |
| 5EX | 09DF | 35E1 | 35E2 | 35E3 | 35E4 | 35E5 | 35E6 | 35E7 | 35E8 | 35E9 | 35EA | 35EB | 35EC | 35ED | 35EE | 35EF |

TABLE 12-continued

State 2 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 5FX | 35F0 | 35F1 | 35F2 | 35F3 | 35F4 | 35F5 | 35F6 | 35F7 | 35F8 | 35F9 | 35FA | 35FB | 35FC | 35FD | 35FE | 35FF |
| 60X | 09F0 | 0BA4 | 0B69 | 0BC2 | 3604 | 3605 | 3606 | 3607 | 35B8 | 3609 | 0B79 | 360B | 360C | 360D | 360E | 360F |
| 61X | 3610 | 3611 | 3612 | 3613 | 3614 | 3615 | 3616 | 3617 | 3618 | 3619 | 361A | 361B | 361C | 361D | 361E | 361F |
| 62X | 09F1 | 3621 | 0B6B | 3623 | 3624 | 3625 | 3626 | 3627 | 0B7A | 3629 | 0B7B | 362B | 362C | 362D | 362E | 362F |
| 63X | 3630 | 3631 | 3632 | 3633 | 3634 | 3635 | 3636 | 3637 | 3638 | 3639 | 363A | 363B | 363C | 363D | 363E | 363F |
| 64X | 09F2 | 3641 | 3642 | 3643 | 3644 | 3645 | 3646 | 3647 | 3648 | 3649 | 364A | 364B | 364C | 364D | 364E | 364F |
| 65X | 3650 | 3651 | 3652 | 3653 | 3654 | 3655 | 3656 | 3657 | 3658 | 3659 | 365A | 365B | 365C | 365D | 365E | 365F |
| 66X | 09F3 | 3661 | 3662 | 3663 | 3664 | 3665 | 3666 | 3667 | 3668 | 3669 | 366A | 366B | 366C | 366D | 366E | 366F |
| 67X | 3670 | 3671 | 3672 | 3673 | 3674 | 3675 | 3676 | 3677 | 3678 | 3679 | 367A | 367B | 367C | 367D | 367E | 367F |
| 68X | 09F4 | 3681 | 3682 | 3683 | 3684 | 3685 | 3686 | 3687 | 3688 | 3689 | 368A | 368B | 368C | 368D | 368E | 368F |
| 69X | 3690 | 3691 | 3692 | 3693 | 3694 | 3695 | 3696 | 3697 | 3698 | 3699 | 369A | 369B | 369C | 369D | 369E | 369F |
| 6AX | 09F5 | 36A1 | 36A2 | 36A3 | 36A4 | 36A5 | 36A6 | 36A7 | 36A8 | 36A9 | 36AA | 36AB | 36AC | 36AD | 36AE | 36AF |
| 6BX | 36B0 | 36B1 | 36B2 | 36B3 | 36B4 | 36B5 | 36B6 | 36B7 | 36B8 | 36B9 | 36BA | 36BB | 36BC | 36BD | 36BE | 36BF |
| 6CX | 09F6 | 36C1 | 36C2 | 36C3 | 36C4 | 36C5 | 36C6 | 36C7 | 36C8 | 36C9 | 36CA | 36CB | 36CC | 36CD | 36CE | 36CF |
| 6DX | 36D0 | 36D1 | 36D2 | 36D3 | 36D4 | 36D5 | 36D6 | 36D7 | 36D8 | 36D9 | 36DA | 36DB | 36DC | 36DD | 36DE | 36DF |
| 6EX | 09F7 | 36E1 | 36E2 | 36E3 | 36E4 | 36E5 | 36E6 | 36E7 | 36E8 | 36E9 | 36EA | 36EB | 36EC | 36ED | 36EE | 36EF |
| 6FX | 36F0 | 36F1 | 36F2 | 36F3 | 36F4 | 36F5 | 36F6 | 36F7 | 36F8 | 36F9 | 36FA | 36FB | 36FC | 36FD | 36FE | 36FF |
| 70X | 09F8 | 3701 | 3702 | 3703 | 3704 | 3705 | 3706 | 3707 | 3708 | 3709 | 370A | 370B | 370C | 370D | 370E | 370F |
| 71X | 3710 | 3711 | 3712 | 3713 | 3714 | 3715 | 3716 | 3717 | 3718 | 3719 | 371A | 371B | 371C | 371D | 371E | 371F |
| 72X | 09F9 | 3721 | 3722 | 3723 | 3724 | 3725 | 3726 | 3727 | 3728 | 3729 | 372A | 372B | 372C | 372D | 372E | 372F |
| 73X | 3730 | 3731 | 3732 | 3733 | 3734 | 3735 | 3736 | 3737 | 3738 | 3739 | 373A | 373B | 373C | 373D | 373E | 373F |
| 74X | 09FA | 3741 | 3742 | 3743 | 3744 | 3745 | 3746 | 3747 | 3748 | 3749 | 374A | 374B | 374C | 374D | 374E | 374F |
| 75X | 3750 | 3751 | 3752 | 3753 | 3754 | 3755 | 3756 | 3757 | 3758 | 3759 | 375A | 375B | 375C | 375D | 375E | 375F |
| 76X | 09FB | 3761 | 3762 | 3763 | 3764 | 3765 | 3766 | 3767 | 3768 | 3769 | 376A | 376B | 376C | 376D | 376E | 376F |
| 77X | 3770 | 3771 | 3772 | 3773 | 3774 | 3775 | 3776 | 3777 | 3778 | 3779 | 377A | 377B | 377C | 377D | 377E | 377F |
| 78X | 09FC | 3781 | 3782 | 3783 | 3784 | 3785 | 3786 | 3787 | 3788 | 3789 | 378A | 378B | 378C | 378D | 378E | 378F |
| 79X | 3790 | 3791 | 3792 | 3793 | 3794 | 3795 | 3796 | 3797 | 3798 | 3799 | 379A | 379B | 379C | 379D | 379E | 379F |
| 7AX | 09FD | 37A1 | 37A2 | 37A3 | 37A4 | 37A5 | 37A6 | 37A7 | 37A8 | 37A9 | 37AA | 37AB | 37AC | 37AD | 37AE | 37AF |
| 7BX | 37B0 | 37B1 | 37B2 | 37B3 | 37B4 | 37B5 | 37B6 | 37B7 | 37B8 | 37B9 | 37BA | 37BB | 37BC | 37BD | 37BE | 37BF |
| 7CX | 09FE | 37C1 | 37C2 | 37C3 | 37C4 | 37C5 | 37C6 | 37C7 | 37C8 | 37C9 | 37CA | 37CB | 37CC | 37CD | 37CE | 37CF |
| 7DX | 37D0 | 37D1 | 37D2 | 37D3 | 37D4 | 37D5 | 37D6 | 37D7 | 37D8 | 37D9 | 37DA | 37DB | 37DC | 37DD | 37DE | 37DF |
| 7EX | 09FF | 37E1 | 37E2 | 37E3 | 37E4 | 37E5 | 37E6 | 37E7 | 37E8 | 37E9 | 37EA | 37EB | 37EC | 37ED | 37EE | 37EF |
| 7FX | 37F0 | 37F1 | 37F2 | 37F3 | 37F4 | 37F5 | 37F6 | 37F7 | 37F8 | 37F9 | 37FA | 37FB | 37FC | 37FD | 37FE | 37FF |
| 80X | 0A70 | 0B81 | 0812 | 3813 | 0B90 | 0B91 | 0816 | 3817 | 0BB0 | 3809 | 0BB1 | 380B | 380C | 380D | 380E | 380F |
| 81X | 0BC8 | 0B83 | 3812 | 3813 | 0B92 | 0B93 | 3816 | 3817 | 3818 | 3819 | 381A | 381B | 381C | 381D | 381E | 381F |
| 82X | 0A71 | 3821 | 0BA3 | 3823 | 3824 | 3825 | 3826 | 3827 | 0BB2 | 3829 | 0BB3 | 382B | 382C | 382D | 382E | 382F |
| 83X | 3830 | 3831 | 3832 | 3833 | 3834 | 3835 | 3836 | 3837 | 3838 | 3839 | 383A | 383B | 383C | 383D | 383E | 383F |
| 84X | 0A72 | 3841 | 3842 | 3843 | 3844 | 3845 | 3846 | 3847 | 3848 | 3849 | 384A | 384B | 384C | 384D | 384E | 384F |
| 85X | 0BCA | 0B85 | 3852 | 3853 | 0B94 | 0B95 | 3856 | 3857 | 3858 | 3859 | 385A | 385B | 385C | 385D | 385E | 385F |
| 86X | 3860 | 3861 | 3862 | 3863 | 3864 | 3865 | 3866 | 3867 | 3868 | 3869 | 386A | 386B | 386C | 386D | 386E | 386F |
| 87X | 3870 | 3871 | 3872 | 3873 | 3874 | 3875 | 3876 | 3877 | 3878 | 3879 | 387A | 387B | 387C | 387D | 387E | 387F |
| 88X | 0A73 | 3881 | 0BA5 | 3883 | 3884 | 3885 | 3886 | 3887 | 0BB4 | 3889 | 0BB5 | 388B | 388C | 388D | 388E | 388F |
| 89X | 3890 | 3891 | 3892 | 3893 | 3894 | 3895 | 3896 | 3897 | 389A | 3899 | 389A | 389B | 389C | 389D | 389E | 389F |
| 8AX | 0A75 | 38A1 | 0BA7 | 38A3 | 38A4 | 38A5 | 38A6 | 38A7 | 0BB6 | 38A9 | 0BB7 | 38AB | 38AC | 38AD | 38AE | 38AF |
| 8BX | 38B0 | 38B1 | 38B2 | 38B3 | 38B4 | 38B5 | 38B6 | 38B7 | 38B8 | 38B9 | 38BA | 38BB | 38BC | 38BD | 38BE | 38BF |
| 8CX | 0A76 | 38C1 | 38C2 | 38C3 | 38C4 | 38C5 | 38C6 | 38C7 | 38C8 | 38C9 | 38CA | 38CB | 38CC | 38CD | 38CE | 38CF |
| 8DX | 38D0 | 38D1 | 38D2 | 38D3 | 38D4 | 38D5 | 38D6 | 38D7 | 38D8 | 38D9 | 38DA | 38DB | 38DC | 38DD | 38DE | 38DF |
| 8EX | 0A77 | 38E1 | 38E2 | 38E3 | 38E4 | 38E5 | 38E6 | 38E7 | 38E8 | 38E9 | 38EA | 38EB | 38EC | 38ED | 38EE | 38EF |

TABLE 12-continued

State 2 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 8FX | 38F0 | 38F1 | 38F2 | 38F3 | 38F4 | 38F5 | 38F6 | 38F7 | 38F8 | 38F9 | 38FA | 38FB | 38FC | 38FD | 38FE | 38FF |
| 90X | 0A78 | 0B89 | 3902 | 3903 | 0B98 | 0B99 | 3906 | 3907 | 3908 | 3909 | 390A | 390B | 390C | 390D | 390E | 390F |
| 91X | 0BCC | 0B8B | 3912 | 3913 | 0B9A | 0B9B | 3916 | 3917 | 3918 | 3919 | 391A | 391B | 391C | 391D | 391E | 391F |
| 92X | 0A79 | 3921 | 3922 | 3923 | 3924 | 3925 | 3926 | 3927 | 3928 | 3929 | 392A | 392B | 392C | 392D | 392E | 392F |
| 93X | 3930 | 3931 | 3932 | 3933 | 3934 | 3935 | 3936 | 3937 | 3938 | 3939 | 393A | 393B | 393C | 393D | 393E | 393F |
| 94X | 0A7A | 0B8D | 3942 | 3943 | 0B9C | 0B9D | 3946 | 3947 | 3948 | 3949 | 394A | 394B | 394C | 394D | 394E | 394F |
| 95X | 0BCE | 0B8F | 3952 | 3953 | 0B9E | 0B9F | 3956 | 3957 | 3958 | 3959 | 395A | 395B | 395C | 395D | 395E | 395F |
| 96X | 0A7B | 3961 | 3962 | 3963 | 3964 | 3965 | 3966 | 3967 | 3968 | 3969 | 396A | 396B | 396C | 396D | 396E | 396F |
| 97X | 3970 | 3971 | 3972 | 3973 | 3974 | 3975 | 3976 | 3977 | 3978 | 3979 | 397A | 397B | 397C | 397D | 397E | 397F |
| 98X | 0A7C | 3981 | 3982 | 3983 | 3984 | 3985 | 3986 | 3987 | 3988 | 3989 | 398A | 398B | 398C | 398D | 398E | 398F |
| 99X | 3990 | 3991 | 3992 | 3993 | 3994 | 3995 | 3996 | 3997 | 3998 | 3999 | 399A | 399B | 399C | 399D | 399E | 399F |
| 9AX | 0A7D | 39A1 | 39A2 | 39A3 | 39A4 | 39A5 | 39A6 | 39A7 | 39A8 | 39A9 | 39AA | 39AB | 39AC | 39AD | 39AE | 39AF |
| 9BX | 39B0 | 39B1 | 39B2 | 39B3 | 39B4 | 39B5 | 39B6 | 39B7 | 39B8 | 39B9 | 39BA | 39BB | 39BC | 39BD | 39BE | 39BF |
| 9CX | 0A7E | 39C1 | 39C2 | 39C3 | 39C4 | 39C5 | 39C6 | 39C7 | 39C8 | 39C9 | 39CA | 39CB | 39CC | 39CD | 39CE | 39CF |
| 9DX | 39D0 | 39D1 | 39D2 | 39D3 | 39D4 | 39D5 | 39D6 | 39D7 | 39D8 | 39D9 | 39DA | 39DB | 39DC | 39DD | 39DE | 39DF |
| 9EX | 0A7F | 39E1 | 39E2 | 39E3 | 39E4 | 39E5 | 39E6 | 39E7 | 39E8 | 39E9 | 39EA | 39EB | 39EC | 39ED | 39EE | 39EF |
| 9FX | 39F0 | 39F1 | 39F2 | 39F3 | 39F4 | 39F5 | 39F6 | 39F7 | 39F8 | 39F9 | 39FA | 39FB | 39FC | 39FD | 39FE | 39FF |
| A0X | 0AB0 | 0BC4 | 0BA9 | 3A03 | 3A04 | 3A05 | 3A06 | 3A07 | 3BB8 | 3A09 | 0BB9 | 3A0B | 3A0C | 3A0D | 3A0E | 3A0F |
| A1X | 3A10 | 3A11 | 3A12 | 3A13 | 3A14 | 3A15 | 3A16 | 3A17 | 3A18 | 3A19 | 3A1A | 3A1B | 3A1C | 3A1D | 3A1E | 3A1F |
| A2X | 0AB1 | 3A21 | 0BAB | 3A23 | 3A24 | 3A25 | 3A26 | 3A27 | 0BBA | 3A29 | 0BBB | 3A2B | 3A2C | 3A2D | 3A2E | 3A2F |
| A3X | 3A30 | 3A31 | 3A32 | 3A33 | 3A34 | 3A35 | 3A36 | 3A37 | 3A38 | 3A39 | 3A3A | 3A3B | 3A3C | 3A3D | 3A3E | 3A3F |
| A4X | 0AB2 | 3A41 | 3A42 | 3A43 | 3A44 | 3A45 | 3A46 | 3A47 | 3A48 | 3A49 | 3A4A | 3A4B | 3A4C | 3A4D | 3A4E | 3A4F |
| A5X | 3A50 | 3A51 | 3A52 | 3A53 | 3A54 | 3A55 | 3A56 | 3A57 | 3A58 | 3A59 | 3A5A | 3A5B | 3A5C | 3A5D | 3A5E | 3A5F |
| A6X | 0AB3 | 3A61 | 3A62 | 3A63 | 3A64 | 3A65 | 3A66 | 3A67 | 3A68 | 3A69 | 3A6A | 3A6B | 3A6C | 3A6D | 3A6E | 3A6F |
| A7X | 3A70 | 3A71 | 3A72 | 3A73 | 3A74 | 3A75 | 3A76 | 3A77 | 3A78 | 3A79 | 3A7A | 3A7B | 3A7C | 3A7D | 3A7E | 3A7F |
| A8X | 0AB4 | 3A81 | 3A82 | 3A83 | 3A84 | 3A85 | 3A86 | 3A87 | 3A88 | 3A89 | 3A8A | 3A8B | 3A8C | 3A8D | 3A8E | 3A8F |
| A9X | 3A90 | 3A91 | 3A92 | 3A93 | 3A94 | 3A95 | 3A96 | 3A97 | 3A98 | 3A99 | 3A9A | 3A9B | 3A9C | 3A9D | 3A9E | 3A9F |
| AAX | 0AB5 | 3AA1 | 0BAF | 3AA3 | 3AA4 | 3AA5 | 3AA6 | 3AA7 | 0BBE | 3AA9 | 0BBF | 3AAB | 3AAC | 3AAD | 3AAE | 3AAF |
| ABX | 3AB0 | 3AB1 | 3AB2 | 3AB3 | 3AB4 | 3AB5 | 3AB6 | 3AB7 | 3AB8 | 3AB9 | 3ABA | 3ABB | 3ABC | 3ABD | 3ABE | 3ABF |
| ACX | 0AB6 | 3AC1 | 3AC2 | 3AC3 | 3AC4 | 3AC5 | 3AC6 | 3AC7 | 3AC8 | 3AC9 | 3ACA | 3ACB | 3ACC | 3ACD | 3ACE | 3ACF |
| ADX | 3AD0 | 3AD1 | 3AD2 | 3AD3 | 3AD4 | 3AD5 | 3AD6 | 3AD7 | 3AD8 | 3AD9 | 3ADA | 3ADB | 3ADC | 3ADD | 3ADE | 3ADF |
| AEX | 0AB7 | 3AE1 | 3AE2 | 3AE3 | 3AE4 | 3AE5 | 3AE6 | 3AE7 | 3AE8 | 3AE9 | 3AEA | 3AEB | 3AEC | 3AED | 3AEE | 3AEF |
| AFX | 3AF0 | 3AF1 | 3AF2 | 3AF3 | 3AF4 | 3AF5 | 3AF6 | 3AF7 | 3AF8 | 3AF9 | 3AFA | 3AFB | 3AFC | 3AFD | 3AFE | 3AFF |
| B0X | 0AB8 | 3B01 | 3B02 | 3B03 | 3B04 | 3B05 | 3B06 | 3B07 | 3B08 | 3B09 | 3B0A | 3B0B | 3B0C | 3B0D | 3B0E | 3B0F |
| B1X | 3B10 | 3B11 | 3B12 | 3B13 | 3B14 | 3B15 | 3B16 | 3B17 | 3B18 | 3B19 | 3B1A | 3B1B | 3B1C | 3B1D | 3B1E | 3B1F |
| B2X | 0AB9 | 3B21 | 3B22 | 3B23 | 3B24 | 3B25 | 3B26 | 3B27 | 3B28 | 3B29 | 3B2A | 3B2B | 3B2C | 3B2D | 3B2E | 3B2F |
| B3X | 3B30 | 3B31 | 3B32 | 3B33 | 3B34 | 3B35 | 3B36 | 3B37 | 3B38 | 3B39 | 3B3A | 3B3B | 3B3C | 3B3D | 3B3E | 3B3F |
| B4X | 0ABA | 3B41 | 3B42 | 3B43 | 3B44 | 3B45 | 3B46 | 3B47 | 3B48 | 3B49 | 3B4A | 3B4B | 3B4C | 3B4D | 3B4E | 3B4F |
| B5X | 3B50 | 3B51 | 3B52 | 3B53 | 3B54 | 3B55 | 3B56 | 3B57 | 3B58 | 3B59 | 3B5A | 3B5B | 3B5C | 3B5D | 3B5E | 3B5F |
| B6X | 0ABB | 3B61 | 3B62 | 3B63 | 3B64 | 3B65 | 3B66 | 3B67 | 3B68 | 3B69 | 3B6A | 3B6B | 3B6C | 3B6D | 3B6E | 3B6F |
| B7X | 3B70 | 3B71 | 3B72 | 3B73 | 3B74 | 3B75 | 3B76 | 3B77 | 3B78 | 3B79 | 3B7A | 3B7B | 3B7C | 3B7D | 3B7E | 3B7F |
| B8X | 0ABC | 3B81 | 3B82 | 3B83 | 3B84 | 3B85 | 3B86 | 3B87 | 3B88 | 3B89 | 3B8A | 3B8B | 3B8C | 3B8D | 3B8E | 3B8F |
| B9X | 3B90 | 3B91 | 3B92 | 3B93 | 3B94 | 3B95 | 3B96 | 3B97 | 3B98 | 3B99 | 3B9A | 3B9B | 3B9C | 3B9D | 3B9E | 3B9F |
| BAX | 0ABD | 3BA1 | 3BA2 | 3BA3 | 3BA4 | 3BA5 | 3BA6 | 3BA7 | 3BA8 | 3BA9 | 3BAA | 3BAB | 3BAC | 3BAD | 3BAE | 3BAF |
| BBX | 3BB0 | 3BB1 | 3BB2 | 3BB3 | 3BB4 | 3BB5 | 3BB6 | 3BB7 | 3BB8 | 3BB9 | 3BBA | 3BBB | 3BBC | 3BBD | 3BBE | 3BBF |
| BCX | 0ABE | 3BC1 | 3BC2 | 3BC3 | 3BC4 | 3BC5 | 3BC6 | 3BC7 | 3BC8 | 3BC9 | 3BCA | 3BCB | 3BCC | 3BCD | 3BCE | 3BCF |
| BDX | 3BD0 | 3BD1 | 3BD2 | 3BD3 | 3BD4 | 3BD5 | 3BD6 | 3BD7 | 3BD8 | 3BD9 | 3BDA | 3BDB | 3BDC | 3BDD | 3BDE | 3BDF |
| BEX | 0ABF | 38E1 | 38E2 | 38E3 | 38E4 | 38E5 | 38E6 | 38E7 | 38E8 | 38E9 | 38EA | 38EB | 38EC | 38ED | 38EE | 38EF |

TABLE 12-continued

State 2 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| BFX | 3BF0 | 38F1 | 38F2 | 38F3 | 38F4 | 38F5 | 38F6 | 38F7 | 38F8 | 38F9 | 38FA | 38FB | 38FC | 38FD | 38FE | 38FF |
| C0X | 0AD0 | 0BC1 | 0BE1 | 0B32 | 0BD2 | 0BD1 | 3C06 | 3C07 | 0BF0 | 3C09 | 0BF1 | 38C08 | 3C0C | 3C0D | 3C0E | 3C0F |
| C1X | 0BE8 | 0BC3 | 0BE3 | 3C13 | 0BD2 | 0BD3 | 3C16 | 3C17 | 0BF2 | 3C19 | 3C1A | 3C1B | 3C1C | 3C1D | 3C1E | 3C1F |
| C2X | 3C30 | 3C21 | 3C32 | 3C23 | 3C24 | 3C25 | 3C26 | 3C27 | 0BF2 | 3C29 | 0BF3 | 3C2B | 3C2C | 3C2D | 3C2E | 3C2F |
| C3X | 0AD2 | 3C31 | 3C42 | 3C33 | 3C34 | 3C35 | 3C36 | 3C37 | 3C38 | 3C39 | 3C3A | 3C3B | 3C3C | 3C3D | 3C3E | 3C3F |
| C4X | 0BC5 | 0BC5 | 3C42 | 3C43 | 3C44 | 0BD5 | 3C46 | 3C47 | 3C48 | 3C49 | 3C4A | 3C4B | 3C4C | 3C4D | 3C4E | 3C4F |
| C5X | 0AD3 | 3C61 | 3C52 | 3C53 | 3C54 | 0BD7 | 3C56 | 3C57 | 3C58 | 3C59 | 3C5A | 3C5B | 3C5C | 3C5D | 3C5E | 3C5F |
| C6X | 3C70 | 3C61 | 3C62 | 3C63 | 3C64 | 3C65 | 3C66 | 3C67 | 3C68 | 3C69 | 3C6A | 3C6B | 3C6C | 3C6D | 3C6E | 3C6F |
| C7X | 0AD4 | 3C71 | 3C72 | 3C73 | 3C74 | 3C75 | 3C76 | 3C77 | 3C78 | 3C79 | 3C7A | 3C7B | 3C7C | 3C7D | 3C7E | 3C7F |
| C8X | 3C81 | 3C81 | 0BE5 | 3C83 | 3C84 | 3C85 | 3C86 | 3C87 | 0BF4 | 3C89 | 0BF5 | 3C8B | 3C8C | 3C8D | 3C8E | 3C8F |
| C9X | 3C90 | 3C91 | 3C92 | 3C93 | 3C94 | 3C95 | 3C96 | 3C97 | 3C98 | 3C99 | 3C9A | 3C9B | 3C9C | 3C9D | 3C9E | 3C9F |
| CAX | 0AD5 | 3CA1 | 0BE7 | 3CA3 | 3CA4 | 3CA5 | 3CA6 | 3CA7 | 3CF6 | 3CA9 | 0BF7 | 3CAB | 3CAC | 3CAD | 3CAE | 3CAF |
| CBX | 3C80 | 3CB1 | 0BE2 | 3CB3 | 3CB4 | 3CB5 | 3CB6 | 3CB7 | 3CB8 | 3CB9 | 3CBA | 3CBB | 3CBC | 3CBD | 3CBE | 3CBF |
| CCX | 0AD6 | 3CC1 | 3CC2 | 3CC3 | 3CC4 | 3CC5 | 3CC6 | 3CC7 | 3CC8 | 3CC9 | 3CCA | 3CCB | 3CCC | 3CCD | 3CCE | 3CCF |
| CDX | 3CD0 | 3CD1 | 3CD2 | 3CD3 | 3CD4 | 3CD5 | 3CD6 | 3CD7 | 3CD8 | 3CD9 | 3CDA | 3CDB | 3CDC | 3CDD | 3CDE | 3CDF |
| CEX | 0AD7 | 3CE1 | 3CE2 | 3CE3 | 3CE4 | 3CE5 | 3CE6 | 3CE7 | 3CE8 | 3CE9 | 3CEA | 3CEB | 3CEC | 3CED | 3CEE | 3CEF |
| CFX | 3CF0 | 3CF1 | 3CF2 | 3CF3 | 3CF4 | 3CF5 | 3CF6 | 3CF7 | 3CF8 | 3CF9 | 3CFA | 3CFB | 3CFC | 3CFD | 3CFE | 3CFF |
| D0X | 0AD8 | 0BC9 | 3D02 | 3D03 | 0BD8 | 0BD9 | 3D06 | 3D07 | 3D08 | 3D09 | 3D0A | 3D0B | 3D0C | 3D0D | 3D0E | 3D0F |
| D1X | 0BEC | 0BCB | 3D12 | 3D13 | 0BDA | 0BDB | 3D16 | 3D17 | 3D18 | 3D19 | 3D1A | 3D1B | 3D1C | 3D1D | 3D1E | 3D1F |
| D2X | 0AD9 | 3D21 | 3D22 | 3D23 | 3D24 | 3D25 | 3D26 | 3D27 | 3D28 | 3D29 | 3D2A | 3D2B | 3D2C | 3D2D | 3D2E | 3D2F |
| D3X | 3D30 | 3D31 | 3D32 | 3D33 | 3D34 | 3D35 | 3D36 | 3D37 | 3D38 | 3D39 | 3D3A | 3D3B | 3D3C | 3D3D | 3D3E | 3D3F |
| D4X | 0ADA | 0BCD | 3D42 | 3D43 | 0BDC | 0BDD | 3D46 | 3D47 | 3D48 | 3D49 | 3D4A | 3D4B | 3D4C | 3D4D | 3D4E | 3D4F |
| D5X | 0BEE | 08CF | 3D52 | 3D53 | 3D54 | 3D55 | 3D56 | 3D57 | 3D58 | 3D59 | 3D5A | 3D5B | 3D5C | 3D5D | 3D5E | 3D5F |
| D6X | 3D61 | 3D61 | 3D62 | 3D63 | 3D64 | 3D65 | 3D66 | 3D67 | 3D68 | 3D69 | 3D6A | 3D6B | 3D6C | 3D6D | 3D6E | 3D6F |
| D7X | 3D70 | 3D71 | 3D72 | 3D73 | 3D74 | 3D75 | 3D76 | 3D77 | 3D78 | 3D79 | 3D7A | 3D7B | 3D7C | 3D7D | 3D7E | 3D7F |
| D8X | 0ADC | 3D81 | 3D82 | 3D83 | 3D84 | 3D85 | 3D86 | 3D87 | 3D88 | 3D89 | 3D8A | 3D8B | 3D8C | 3D8D | 3D8E | 3D8F |
| D9X | 3D90 | 3D91 | 3D92 | 3D93 | 3D94 | 3D95 | 3D96 | 3D97 | 3D98 | 3D99 | 3D9A | 3D9B | 3D9C | 3D9D | 3D9E | 3D9F |
| DAX | 0ADD | 3DA1 | 3DA2 | 3DA3 | 3DA4 | 3DA5 | 3DA6 | 3DA7 | 3DA8 | 3DA9 | 3DAA | 3DAB | 3DAC | 3DAD | 3DAE | 3DAF |
| DBX | 3DB0 | 3DB1 | 3DB2 | 3DB3 | 3DB4 | 3DB5 | 3DB6 | 3DB7 | 3DB8 | 3DB9 | 3DBA | 3DBB | 3DBC | 3DBD | 3DBE | 3DBF |
| DCX | 0ADE | 3DC1 | 3DC2 | 3DC3 | 3DC4 | 3DC5 | 3DC6 | 3DC7 | 3DC8 | 3DC9 | 3DCA | 3DCB | 3DCC | 3DCD | 3DCE | 3DCF |
| DDX | 3DD0 | 3DD1 | 3DD2 | 3DD3 | 3DD4 | 3DD5 | 3DD6 | 3DD7 | 3DD8 | 3DD9 | 3DDA | 3DDB | 3DDC | 3DDD | 3DDE | 3DDF |
| DEX | 0ADF | 3DE1 | 3DE2 | 3DE3 | 3DE4 | 3DE5 | 3DE6 | 3DE7 | 3DE8 | 3DE9 | 3DEA | 3DEB | 3DEC | 3DED | 3DEE | 3DEF |
| DFX | 3DF0 | 3DF1 | 3DF2 | 3DF3 | 3DF4 | 3DF5 | 3DF6 | 3DF7 | 3DF8 | 3DF9 | 3DFA | 3DFB | 3DFC | 3DFD | 3DFE | 3DFF |
| E0X | 0AF0 | 0BE4 | 0BE9 | 3E03 | 3E04 | 3E05 | 3E06 | 3E07 | 3E08 | 3E09 | 3DEA | 3E0B | 3E0C | 3E0D | 3E0E | 3E0F |
| E1X | 3E10 | 3E11 | 3E12 | 3E13 | 3E14 | 3E15 | 3E16 | 3E17 | 3E18 | 3E19 | 3E1A | 3E1B | 3E1C | 3E1D | 3E1E | 3E1F |
| E2X | 0AF1 | 3E21 | 0B3B | 3E23 | 3E24 | 3E25 | 3E26 | 3E27 | 3E28 | 3E29 | 0BFB | 3E2B | 3E2C | 3E2D | 3E2E | 3E2F |
| E3X | 3E30 | 3E31 | 3E32 | 3E33 | 3E34 | 3E35 | 3E36 | 3E37 | 3E38 | 3E39 | 3E3A | 3E3B | 3E3C | 3E3D | 3E3E | 3E3F |
| E4X | 0AF2 | 3E41 | 3E42 | 3E43 | 3E44 | 3E45 | 3E46 | 3E47 | 3E48 | 3E49 | 3E4A | 3E4B | 3E4C | 3E4D | 3E4E | 3E4F |
| E5X | 3E50 | 3E51 | 3E52 | 3E53 | 3E54 | 3E55 | 3E56 | 3E57 | 3E58 | 3E59 | 3E5A | 3E5B | 3E5C | 3E5D | 3E5E | 3E5F |
| E6X | 0AF3 | 3E61 | 3E62 | 3E63 | 3E64 | 3E65 | 3E66 | 3E67 | 3E68 | 3E69 | 3E6A | 3E6B | 3E6C | 3E6D | 3E6E | 3E6F |
| E7X | 3E70 | 3E71 | 3E72 | 3E73 | 3E74 | 3E75 | 3E76 | 3E77 | 3E78 | 3E79 | 3E7A | 3E7B | 3E7C | 3E7D | 3E7E | 3E7F |
| E8X | 0AF4 | 3E81 | 0BED | 3E83 | 3E84 | 3E85 | 3E86 | 3E87 | 0BFC | 3E89 | 0BFD | 3E8B | 3E8C | 3E8D | 3E8E | 3E8F |
| E9X | 3E90 | 3E91 | 3E92 | 3E93 | 3E94 | 3E95 | 3E96 | 3E97 | 3E98 | 3E99 | 3E9A | 3E9B | 3E9C | 3E9D | 3E9E | 3E9F |
| EAX | 0AF5 | 3EA1 | 0BEF | 3EA3 | 3EA4 | 3EA5 | 3EA6 | 3EA7 | 0BFE | 3EA9 | 0BFF | 3EAB | 3EAC | 3EAD | 3EAE | 3EAF |
| EBX | 3EB0 | 3EB1 | 3EB2 | 3EB3 | 3EB4 | 3EB5 | 3EB6 | 3EB7 | 3EB8 | 3EB9 | 3EBA | 3EBB | 3EBC | 3EBD | 3EBE | 3EBF |
| ECX | 0AF6 | 3EC1 | 3EC2 | 3EC3 | 3EC4 | 3EC5 | 3EC6 | 3EC7 | 3EC8 | 3EC9 | 3ECA | 3ECB | 3ECC | 3ECD | 3ECE | 3ECF |
| EDX | 3ED0 | 3ED1 | 3ED2 | 3ED3 | 3ED4 | 3ED5 | 3ED6 | 3ED7 | 3ED8 | 3ED9 | 3EDA | 3EDB | 3EDC | 3EDD | 3EDE | 3EDF |
| EEX | 0AF7 | 3EE1 | 3EE2 | 3EE3 | 3EE4 | 3EE5 | 3EE6 | 3EE7 | 3EE8 | 3EE9 | 3EEA | 3EEB | 3EEC | 3EED | 3EEE | 3EEF |

TABLE 12-continued

State 2 of 14-bit code word for 24/25 (0,7/7) code

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| EFX | 3EF0 | 3EF1 | 3EF2 | 3EF3 | 3EF4 | 3EF5 | 3EF6 | 3EF7 | 3EF8 | 3EF9 | 3EFA | 3EFB | 3EFC | 3EFD | 3EFE | 3EFF |
| F0X | 0AF8 | 3F01 | 3F02 | 3F03 | 3F04 | 3F05 | 3F06 | 3F07 | 3F08 | 3F09 | 3F0A | 3F0B | 3F0C | 3F0D | 3F0E | 3F0F |
| F1X | 3F10 | 3F11 | 3F12 | 3F13 | 3F14 | 3F15 | 3F16 | 3F17 | 3F18 | 3F19 | 3F1A | 3F1B | 3F1C | 3F1D | 3F1E | 3F1F |
| F2X | 0AF9 | 3F21 | 3F22 | 3F23 | 3F24 | 3F25 | 3F26 | 3F27 | 3F28 | 3F29 | 3F2A | 3F2B | 3F2C | 3F2D | 3F2E | 3F2F |
| F3X | 3F30 | 3F31 | 3F32 | 3F33 | 3F34 | 3F35 | 3F36 | 3F37 | 3F38 | 3F39 | 3F3A | 3F3B | 3F3C | 3F3D | 3F3E | 3F3F |
| F4X | 0AFA | 3F41 | 3F42 | 3F43 | 3F44 | 3F45 | 3F46 | 3F47 | 3F48 | 3F49 | 3F4A | 3F4B | 3F4C | 3F4D | 3F4E | 3F4F |
| F5X | 3F50 | 3F51 | 3F52 | 3F53 | 3F54 | 3F55 | 3F56 | 3F57 | 3F58 | 3F59 | 3F5A | 3F5B | 3F5C | 3F5D | 3F5E | 3F5F |
| F6X | 0AFB | 3F61 | 3F62 | 3F63 | 3F64 | 3F65 | 3F66 | 3F67 | 3F68 | 3F69 | 3F6A | 3F6B | 3F6C | 3F6D | 3F6E | 3F6F |
| F7X | 3F70 | 3F71 | 3F72 | 3F73 | 3F74 | 3F75 | 3F76 | 3F77 | 3F78 | 3F79 | 3F7A | 3F7B | 3F7C | 3F7D | 3F7E | 3F7F |
| F8X | 0AFC | 3F81 | 3F82 | 3F83 | 3F84 | 3F85 | 3F86 | 3F87 | 3F88 | 3F89 | 3F8A | 3F8B | 3F8C | 3F8D | 3F8E | 3F8F |
| F9X | 3F90 | 3F91 | 3F92 | 3F93 | 3F94 | 3F95 | 3F96 | 3F97 | 3F98 | 3F99 | 3F9A | 3F9B | 3F9C | 3F9D | 3F9E | 3F9F |
| FAX | 0AFD | 3FA1 | 3FA2 | 3FA3 | 3FA4 | 3FA5 | 3FA6 | 3FA7 | 3FA8 | 3FA9 | 3FAA | 3FAB | 3FAC | 3FAD | 3FAE | 3FAF |
| FBX | 3FB0 | 3FB1 | 3FB2 | 3FB3 | 3FB4 | 3FB5 | 3FB6 | 3FB7 | 3FB8 | 3FB9 | 3FBA | 3FBB | 3FBC | 3FBD | 3FBE | 3FBF |
| FCX | 0AFE | 3FC1 | 3FC2 | 3FC3 | 3FC4 | 3FC5 | 3FC6 | 3FC7 | 3FC8 | 3FC9 | 3FCA | 3FCB | 3FCC | 3FCD | 3FCE | 3FCF |
| FDX | 3FD0 | 3FD1 | 3FD2 | 3FD3 | 3FD4 | 3FD5 | 3FD6 | 3FD7 | 3FD8 | 3FD9 | 3FDA | 3FDB | 3FDC | 3FDD | 3FDE | 3FDF |
| FEX | 0AFF | 3FE1 | 3FE2 | 3FE3 | 3FE4 | 3FE5 | 3FE6 | 3FE7 | 3FE8 | 3FE9 | 3FEA | 3FEB | 3FEC | 3FED | 3FEE | 3FEF |
| FFX | 3FF0 | 3FF1 | 3FF2 | 3FF3 | 3FF4 | 3FF5 | 3FF6 | 3FF7 | 3FF8 | 3FF9 | 3FFA | 3FFB | 3FFC | 3FFD | 3FFE | 3FFF |

The various constraints on run length limits, Hamming weight are integrated into the encoding and decoding used. The "i" constraint directly affects the delay of decisions in the Viterbi algorithm and also influences the length of error propagation, and the "i" constraint is kept as short as possible. The "k" constraint is also kept short. The encoder 202 and decoder 208 are state driven and all of the code words are carefully chosen such that the state can be determined by the four leading bits of a 14 bit codeword as shown in Table 8.

The m bit data word is separated into two interleaved sequence of p=12 and q=12 bits. The sequence of p bits is mapped into a u=11 bit codeword and a sequence of q bits is mapped into a v=14 bit codeword. Since $2^p$ codewords are needed for a p bit sequence, and $2^q$ codewords are needed for a q bit sequence, the conditions $2^p \leq N_u$ and $2^q \leq N_v$ for the number of bits N in the codewords must be met. An integer "t" is then found experimentally that satisfies the conditions $2^p \leq [N_u * t]$ and $[2^{q} * t] \leq N_v$ simultaneously. This arrangement ensures that the codewords can be divided into groups corresponding to the state numbers.

The encoding process of mapping m bits of data into n bits of the codewords can be done as follows:

1. Break the m-bit pattern into two patterns of p bits and q bits.

2. Map the p bit pattern into a u bit codeword and a state number S.

3. Go to the group of v bit codewords that is labeled with state number S and map the q bit pattern into a v bit codeword.

4. Combine the u bit and the v bit codewords to form the n-bit codeword.

The decoding process can be done as follows:

1. Break the n bit pattern into two patterns of u bits and v bits in length.

2. Since the v bit patterns in each state are unique, the state number S of the v bits can be determined. and the q bit data pattern is recovered.

3. Based on the state number S and the u bit code word, recover the p bit data pattern.

4. Combine the p bit and q bit data patterns to form or recover the m bit data pattern.

With m=24, n=25, k=7, i=7, w=9, the values p=12, q=12, u=11, v=14 are selected. There are then 1,484 eleven bit code words and 13,484 fourteen bit code words possible. If t is selected to be 3, then $2^p=2^{12}=4096$ and $(N_u*t)=4452$ and $(2^{q}*t)=(2^{12}*3)=12288$ and $N_v=13484$ and the inequality conditions above are met. As there are more than enough 14 bit codewords, codewords are chosen so that each state can be determined with a minimal number of bits of the codeword as shown in Table 1.

By employing the method of mapping a data word directly into a code word, the amount of logic in the encoder and decoder can be kept low. This method is able to encode a majority of the data words. In the encoder, 12 bit data words are encoded into 11 bit code words and 14 bit code words alternately. To encode a 12 bit data word into an 11 bit code word, the least significant 11 bits are entered into a codeword tester CT-A which checks if the 11 bit pattern already satisfies the required constraints. If the constraints are satisfied, the 11 bit word is shifted out as the code word. The state for the next code word is determined by the most significant bit of the data word. If the bit is a "0", the next state will be S1. If the bit is a "1", the next state will be S2. By exhaustive search, there are 1484 11 bit patterns that satisfy the constraints. Of the 4096 possible words, 1484 have S1 as the next state, 1484 have S2 as the next state, leaving 1128 data words that do not satisfy the constraints and will be mapped into code words using Boolean logic expressions in equations Ga through Gn shown below.

To encode a 12 bit data word into a 14 bit code word, two bits are attached to the 12 bit word as the most significant bits, and the value of these two bits depends on the state indicated by the previous code word mapping. The values 11, 10, and 01 are chosen for corresponding states S2, S1 and S0. These 14 bits are entered into codeword tester CT-B which identifies the 14 bit patterns that satisfy the constraints and shifts those patterns out as the code word. There are 3728, 3464 and 3468 patterns that satisfy the constraints for states S2, S1 and S0 respectively. Since each state needs 4096 patterns, there are 368, 632 and 628 remaining patterns for states S2, S and S0 respectively. There are 2824 14-bit patterns that start with 00 available. The Boolean logic that maps these remaining patterns can be found in equations with terms Ha to Hf, Ja to Jh and Ka to Kh.

The decoders are constructed similarly. By using code pattern testers, about 86% of the code patterns can be encoded and decoded simply by the code testers. Only about 14% of the patterns require the more complex Boolean logic in the decoders.

The system (150) for communicating digital data through a communication channel (152) comprises an encoding system (154) adapted to receive first (156) and second (158) 12 bit sequences of the data. The encoding (154) generates an 11 bit first codeword (160) and state variables S0 (162), S1 (164), S2 (166) as functions of the first sequence (156). The encoding system (154) generates a 14 bit second codeword (168) as a function of the second sequence (158) and the state variables (162, 164, 166). A modulator (170) receives the first and second codewords (160, 168) and couples first and second modulated codewords (172, 174) to the communication channel (152). A receiver (179) includes a demodulator (176) that receives first and second modulated codewords (172, 174) from the communication channel (152). The demodulator (176) generates first and second demodulated codewords (178, 180).

The decoding system (182) receives the first and second demodulated codewords (178, 180). The decoding system (182) generates a second decoded sequence (184) and decoded state variables S0' (186), S1' (188), S2' (190) as a function of the second demodulated code word (180). The decoding system (182) generates a first decoded sequence (192) as a function of the first demodulated codeword (178) and the decoded state variables (186, 188, 190).

The first and second codewords (160, 168) together form a 25 bit codeword. The encoding system (154) limits runs of zeros by encoding the 25 bit codeword with a run length limit k=7, and by encoding the first and second codewords (160, 168) each with a run length limit i=7. The encoder guarantees a minimum code energy by encoding the 25 bit word with a Hamming weight w=9.

The decoding system (182) comprises code pattern testers (194, 196) that decode sequences that meet the "k", "i" and "w" constraints. The decoding system (182) can be a Viterbi detector. The demodulator (176) can generate a local oscillator (177) output synchronized with the modulated first and second codewords (172, 174). The demodulator (176) can generate the first and second demodulated codewords (178, 180) as a function of the local oscillator (177) output.

The communication channel (152) can be in a disc drive (100) with a modulator modulating the disc drive write output, and the demodulator demodulating the disc drive read signal. The synchronization of the local oscillator (177) compensates for speed variations in the disc drive (100). The magnetic disc drive (100) comprises a magnetic disc (106), and a read and write transducer head(110) coupled to the magnetic disc.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. While encoding and decoding are shown in block diagram form, it is understood that it can be done using lookup tables as shown. For example, the particular elements may vary depending on the particular application for the disc drive while maintaining substantially the same functionality without departing from the spirit and scope of the present invention. In addition, although a preferred embodiment described herein is directed to a coding system for a disc drive, it will be appreciated by those skilled in the art that the teachings of the present invention can be applied to other systems, like satellite communications and cellular phone systems, without departing from the spirit and scope of the invention. Various other codes may be used, more than one encoding or decoding table may be linked together, additional or different state numbers may be used, or the data provided to the encoders or decoders can be partitioned or overlap.

What is claimed is:

1. An encoding system for encoding digital data for transmission through a communication channel, comprising:
    a first encoder adapted to receive a first sequence of 12 bits of data and generating a first codeword of 11 bits and state variables as a function of the first sequence; and
    a second encoder adapted to receive a second sequence of 12 bits of data and the state variables and generating a second codeword of 14 bits as a function of the second sequence and the state variables, the state variables being represented by four or fewer bits of the second codeword, the first and second codewords together forming a 25 bit codeword, the encoder limiting runs of zeros by encoding the 25 bit codeword with a run length limit k=7.

2. The encoding system of claim 1, further comprising:
    code pattern testers coupled to the first and second decoders, the code pattern testers encoding sequences based on a pattern shorter than full encoding of the sequence.

3. The encoding system of claim 1, further comprising:
    a modulator receiving the first and second codewords and adapted to couple first and second modulated codewords to the communication channel.

4. The encoding system of claim 1 wherein the first and second encoders encode the first and second codewords each with a run length limit i=7, and encode the 25 bit codeword with a Hamming weight w=9, and the first and second 12 bit sequences of the data are interleaved.

5. A method for encoding digital data for transmission through a communication channel, comprising:
    (a) receiving a first sequence of 12 bits of data at a first encoder;
    (b) generating a first codeword of 11 bits and state variables as a function of the first sequence in the first encoder;
    (c) receiving a second sequence of 12 bits of data and the state variables at a second encoder;
    (d) generating a second codeword of 14 bits as a function of the second sequence and the state variables, the state variables being represented by four or fewer bits in the second codeword; and
    (e) combining the first and second codewords together to form a 25 bit codeword, and
    (f) setting a run length limit k=7 in the first and second encoders on the 25 bit codeword to limit runs of zeros.

6. The method of claim 5 wherein the encoding limits errors by encoding the first and second codewords each with a run length limit i=7, and encoding the 25 bit word with a minimum Hamming weight w=9.

7. A magnetic disc drive, comprising:
    a magnetic disc;
    a write transducer coupled to the magnetic disc;
    a read transducer coupled to the magnetic disc; and
    an encoding system as set forth in claim 1.

8. A decoding system for decoding data received from a communication channel, comprising:
    a receiver configured to receive a 25 bit encoded digital codeword with a run length k=7, the codeword representing a 24 bit sequence of data, the receiver separating the 25 bit encoded digital codeword into a 14 bit first portion and an 11 bit second portion;
    a first decoder configured to receive the 14 bit first portion and generate a first decoded 12 bit sequence as a function of the first portion, the first decoder generating state variables as a function of four or fewer bits of the first portion; and
    a second decoder configured to receive the 11 bit second portion and the state variables generate a second decoded 12 bit sequence, the first and second decoded 12 bits sequences together forming a decoded 24 bit sequence of data.

9. The decoding system of claim 8, further comprising:
    code pattern testers coupled to the first and second decoders, the code pattern testers decoding most sequences based on a pattern shorter than full decoding of the sequence.

10. The decoding system of claim 8, wherein the receiver comprises:
    a demodulator adapted to receive a modulated 25 bit codeword from a communication channel, the demodulator demodulating the 25 bit codeword and providing the first and second portions.

11. A method of decoding digital data received from a communication channel, comprising:
    (a) receiving a 25 bit encoded digital codeword with a run length limit k=7 in a receiver, the codeword representing a 24 bit sequence of data,
    (b) separating the 25 bit encoded digital codeword into a 14 bit first portion and an 11 bit second portion in the receiver;
    (c) receiving the 14 bit first portion in a first decoder and generating a first decoded 12 bit sequence, and generating decoded state variables as a function of four or fewer bits of the first portion;
    (d) receiving the 11 bit second portion and the state variables in a second decoder; and (e) generating a second decoded 12 bit sequence in the second decoder, the first and second decoded 12 bits sequences together forming a decoded 24 bit sequence of data.

12. The method of claim 11, further comprising code pattern testing that decodes most sequences by a pattern shorter than full decoding of the sequence.

13. A magnetic disc drive, comprising:

a magnetic disc;

a write transducer coupled to the magnetic disc;

a read transducer coupled to the magnetic disc;

a decoding system as set forth in claim 8 coupled to the read transducer.

14. A decoding system for decoding data received from a communication channel, comprising:

a receiver receiving a 25 bit encoded digital codeword with a run length limit k=7, the codeword representing a 24 bit sequence of data, the receiver separating the 25 bit encoded digital codeword into a 14 bit first portion and an 11 bit second portion;

a first decoder receiving the 14 bit first portion and generating a first decoded 12 bit sequence as a function of the first portion, means for generating state variables as a function of four or fewer bits of the first portion; and a second decoder receiving the 11 bit second portion and the state variables, the second decoder generating a second decoded 12 bit sequence, the first and second decoded 12 bits sequences together forming a decoded 24 bit sequence of data.

15. An encoding system for encoding digital data for transmission through a communication channel, comprising:

a first encoder adapted to receive a first sequence of 12 bits of data and generating a first codeword of 11 bits as a function of the first sequence;

a second encoder adapted to receive a second sequence of 12 bits of data and generating a second codeword of 14 bits as a function of the second sequence and as a function of state variables; the first and second codewords together forming a 25 bit codeword, the encoder limiting errors by encoding the 25 bit codeword with a run length limit k=7 and means for generating the state variables as a function of the first sequence and for coupling the state variable to the second encoder, the state variables being represented by four or fewer bits of the second codeword.

* * * * *